(12) United States Patent
Kobayashi et al.

(10) Patent No.: US 11,640,807 B2
(45) Date of Patent: May 2, 2023

(54) DISPLAY DEVICE

(71) Applicant: Semiconductor Energy Laboratory Co., Ltd., Atsugi (JP)

(72) Inventors: Hidetomo Kobayashi, Kanagawa (JP); Kei Takahashi, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/521,100

(22) Filed: Nov. 8, 2021

(65) Prior Publication Data

US 2022/0059045 A1 Feb. 24, 2022

Related U.S. Application Data

(63) Continuation of application No. 16/901,129, filed on Jun. 15, 2020, now Pat. No. 11,462,185, which is a continuation of application No. 15/866,880, filed on Jan. 10, 2018, now Pat. No. 10,692,452.

(30) Foreign Application Priority Data

Jan. 16, 2017 (JP) ................. 2017-005376
Jan. 16, 2017 (JP) ................. 2017-005407

(51) Int. Cl.
*G09G 3/36* (2006.01)
*G02F 1/1362* (2006.01)
(Continued)

(52) U.S. Cl.
CPC .......... *G09G 3/3648* (2013.01); *G02B 27/01* (2013.01); *G02F 1/1343* (2013.01);
(Continued)

(58) Field of Classification Search
CPC .. G06F 1/1652; G09G 3/3648; G09G 3/3233; H01L 27/1225; H01L 29/78648;
(Continued)

(56) References Cited

U.S. PATENT DOCUMENTS 8,542,228 B2  9/2013  Sugihara et al.
9,672,769 B2  6/2017  Lee et al.
(Continued)

FOREIGN PATENT DOCUMENTS

CN  104992681 A  * 10/2015  ............... G09G 3/36
EP  1555648 A  7/2005
(Continued)

*Primary Examiner* — Towfiq Elahi
(74) *Attorney, Agent, or Firm* — Fish & Richardson P.C.

(57) ABSTRACT

A display device with favorable display quality is provided. A display portion where a plurality of pixels is arranged in a matrix is divided into Region A and Region B, i.e., regions on the upstream side and the downstream side of a scanning direction. A signal line for supplying an image signal is provided in each of Region A and Region B. Region A and Region B adjoin each other such that a boundary line showing the boundary between the regions is bent. Bending the boundary line suppresses formation of a stripe in a boundary portion. For example, in a given column, the total number of pixels electrically connected to a signal line in Region A is made different from the total number of pixels electrically connected to a signal line in Region B.

7 Claims, 38 Drawing Sheets

(51) Int. Cl.
*G02F 1/1343* (2006.01)
*H01L 29/786* (2006.01)
*G06F 1/16* (2006.01)
*G09G 3/3233* (2016.01)
*H01L 27/12* (2006.01)
*G02B 27/01* (2006.01)
*H04M 1/02* (2006.01)
*G02F 1/13357* (2006.01)
*G02F 1/1345* (2006.01)
*G02F 1/13* (2006.01)
*G02F 1/136* (2006.01)
*G02F 1/1333* (2006.01)

(52) U.S. Cl.
CPC ...... *G02F 1/136286* (2013.01); *G06F 1/1652* (2013.01); *G09G 3/3233* (2013.01); *H01L 27/124* (2013.01); *H01L 27/1225* (2013.01); *H01L 29/78648* (2013.01); *H04M 1/0268* (2013.01); *G02F 1/1303* (2013.01); *G02F 1/13452* (2013.01); *G02F 1/13458* (2013.01); *G02F 1/13606* (2021.01); *G02F 1/133391* (2021.01); *G02F 1/133602* (2013.01); *G02F 2201/52* (2013.01); *G09G 2300/0426* (2013.01); *G09G 2300/0452* (2013.01); *G09G 2310/0264* (2013.01); *G09G 2320/0223* (2013.01)

(58) Field of Classification Search
CPC ..... H01L 27/124; G02B 27/017; G02B 27/01; H04M 1/0268; G02F 1/136286; G02F 1/1343
See application file for complete search history.

(56) References Cited

U.S. PATENT DOCUMENTS

| | | |
|---|---|---|
| 10,684,500 B2 | 6/2020 | Shishido et al. |
| 2005/0018097 A1 | 1/2005 | Kwon et al. |
| 2005/0052439 A1 | 3/2005 | Liou |
| 2005/0248556 A1 | 11/2005 | Yoshinaga et al. |
| 2009/0073154 A1 | 3/2009 | Lee et al. |
| 2010/0265410 A1 | 10/2010 | Sugihara et al. |
| 2013/0057791 A1 | 3/2013 | Kitayama et al. |
| 2013/0127725 A1* | 5/2013 | Sugimoto ........... G06F 3/04886 345/168 |
| 2014/0092355 A1 | 4/2014 | Teranuma et al. |
| 2014/0300399 A1* | 10/2014 | Miyake ................ G09G 3/3696 327/296 |
| 2015/0325593 A1 | 11/2015 | Shih et al. |
| 2018/0012540 A1 | 1/2018 | Hosoyachi et al. |
| 2020/0152131 A1 | 5/2020 | Lee et al. |
| 2020/0218106 A1 | 7/2020 | Shishido et al. |

FOREIGN PATENT DOCUMENTS

| | | |
|---|---|---|
| JP | 10-325962 A | 12/1998 |
| JP | 2002-214645 A | 7/2002 |
| JP | 2004-163901 A | 6/2004 |
| JP | 2005-049822 A | 2/2005 |
| JP | 2005-070722 A | 3/2005 |
| JP | 2005-189758 A | 7/2005 |
| JP | 2008-216436 A | 9/2008 |
| JP | 2011-013510 A | 1/2011 |
| JP | 2016-224935 A | 12/2016 |
| WO | WO-2009/084332 | 7/2009 |
| WO | WO-2016/189432 | 12/2016 |

* cited by examiner

FIG. 10A1
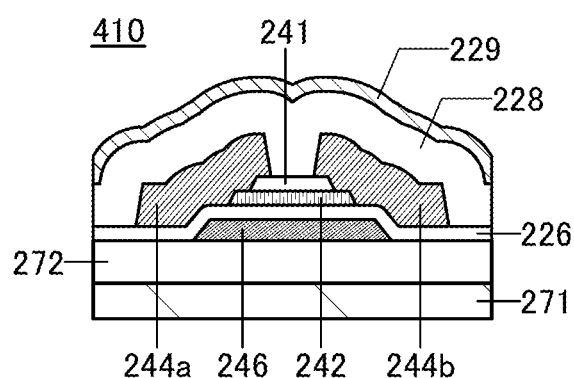
FIG. 10A2
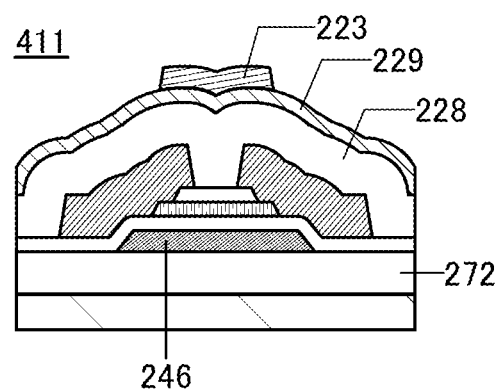
FIG. 10B1
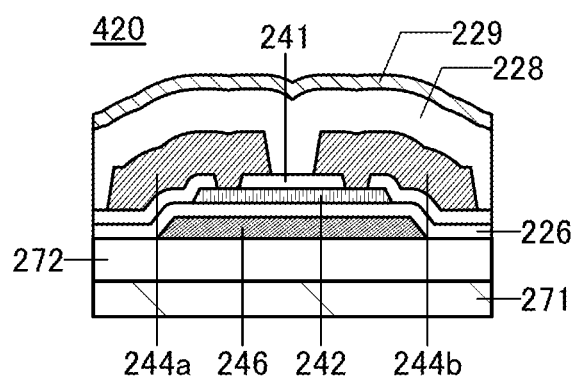
FIG. 10B2
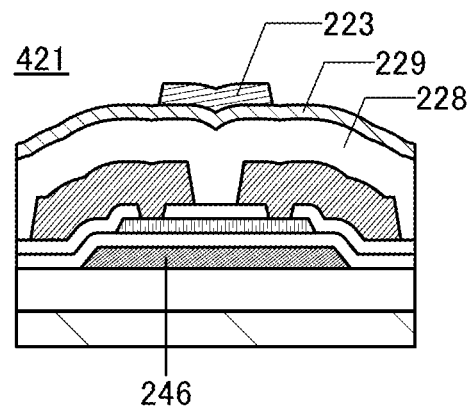
FIG. 10C1
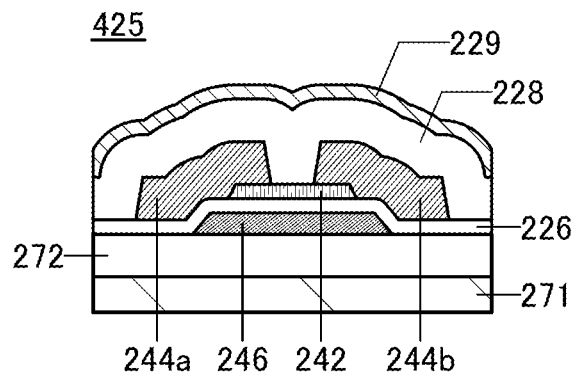
FIG. 10C2
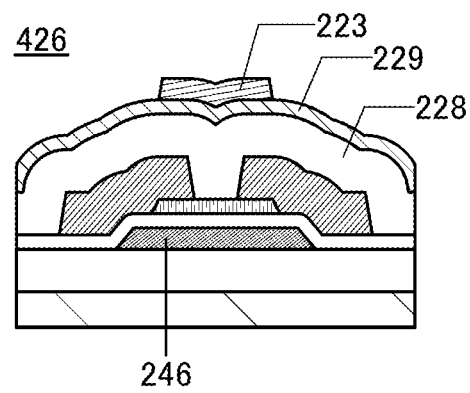

FIG. 11A1
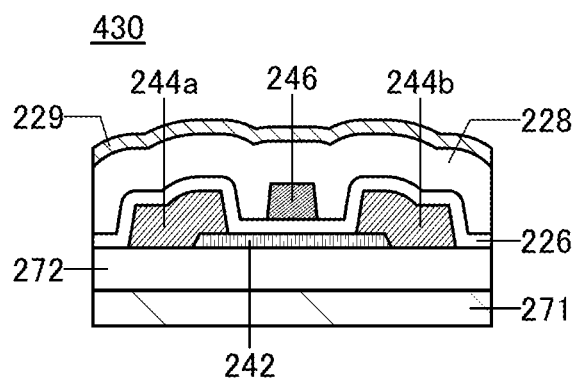
FIG. 11A2
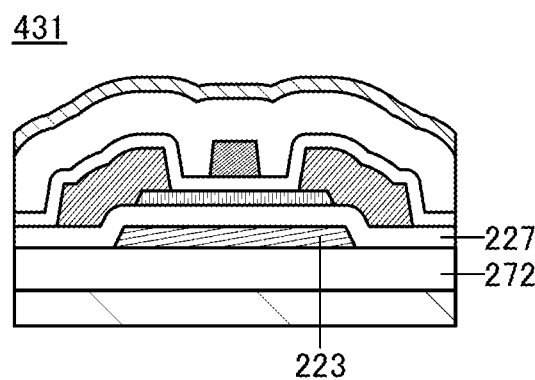
FIG. 11A3
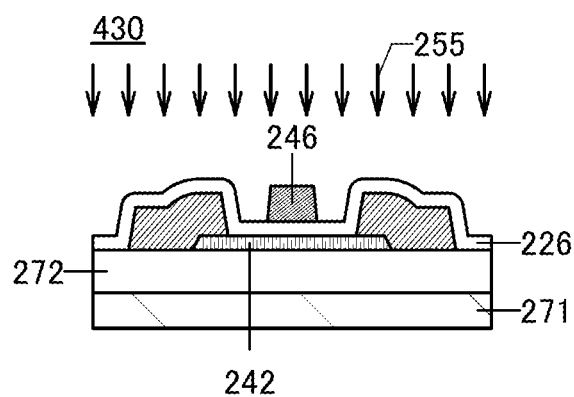
FIG. 11B1
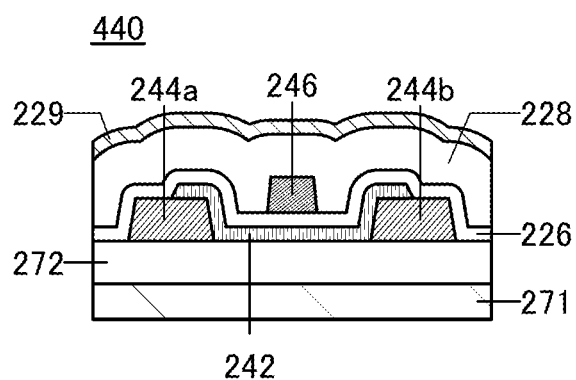
FIG. 11B2
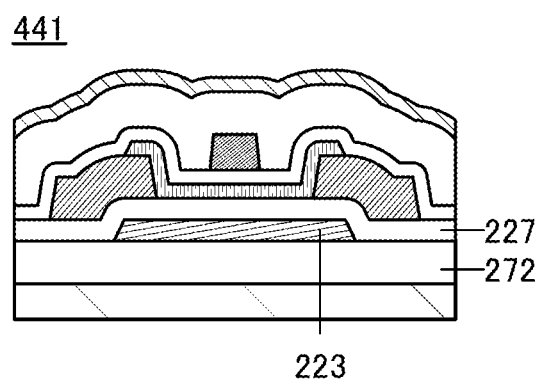

FIG. 12A1
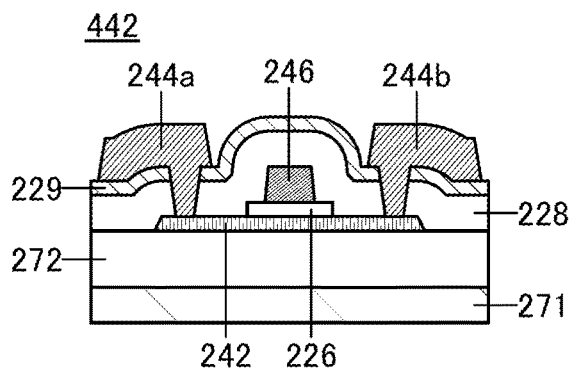
FIG. 12A2
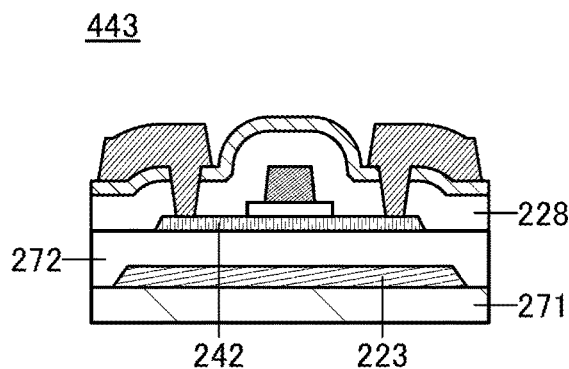
FIG. 12A3
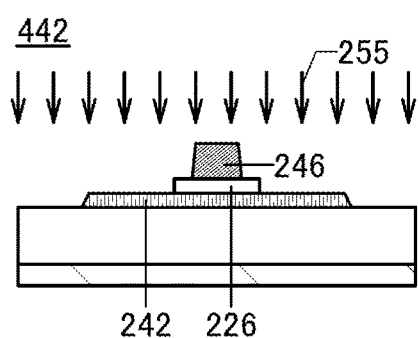
FIG. 12B1
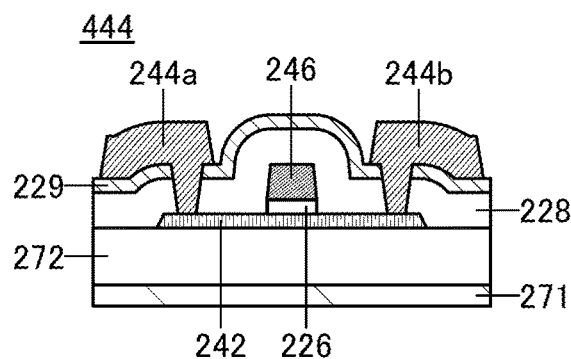
FIG. 12B2
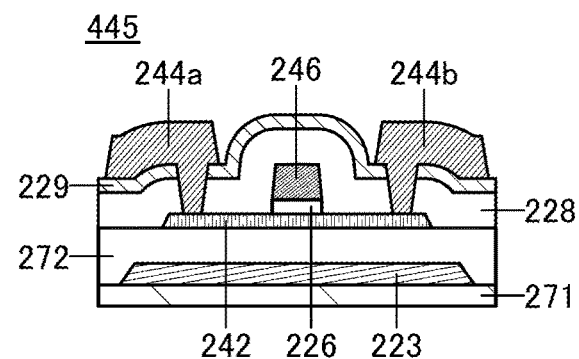
FIG. 12C1
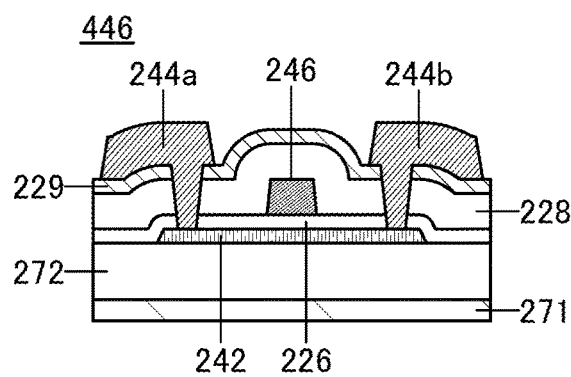
FIG. 12C2
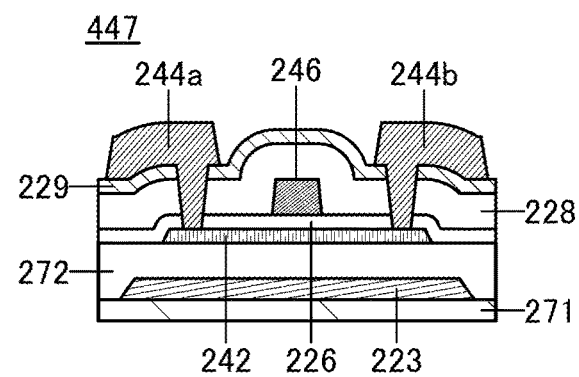

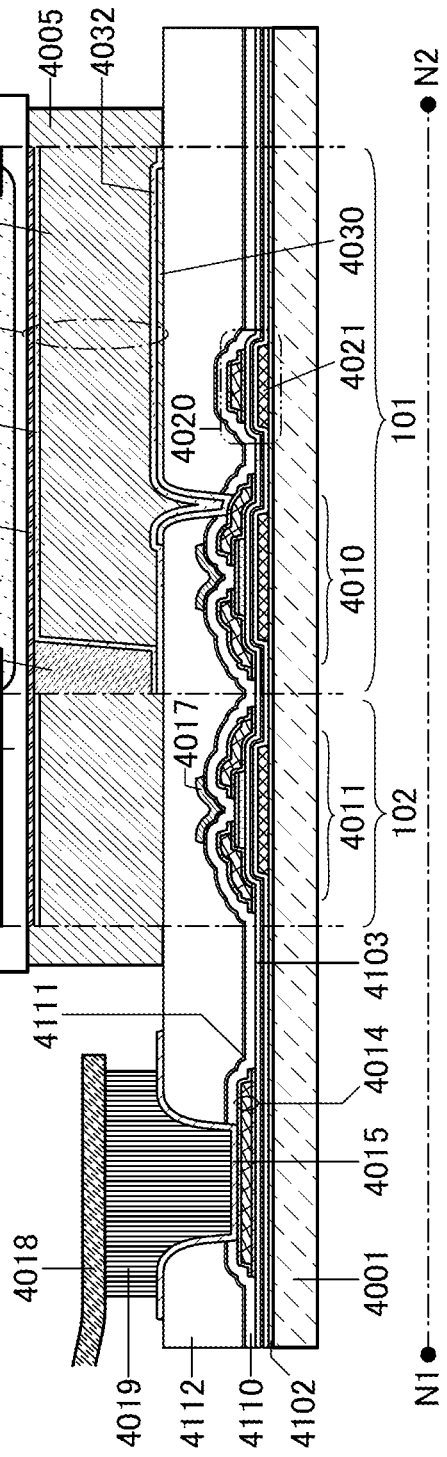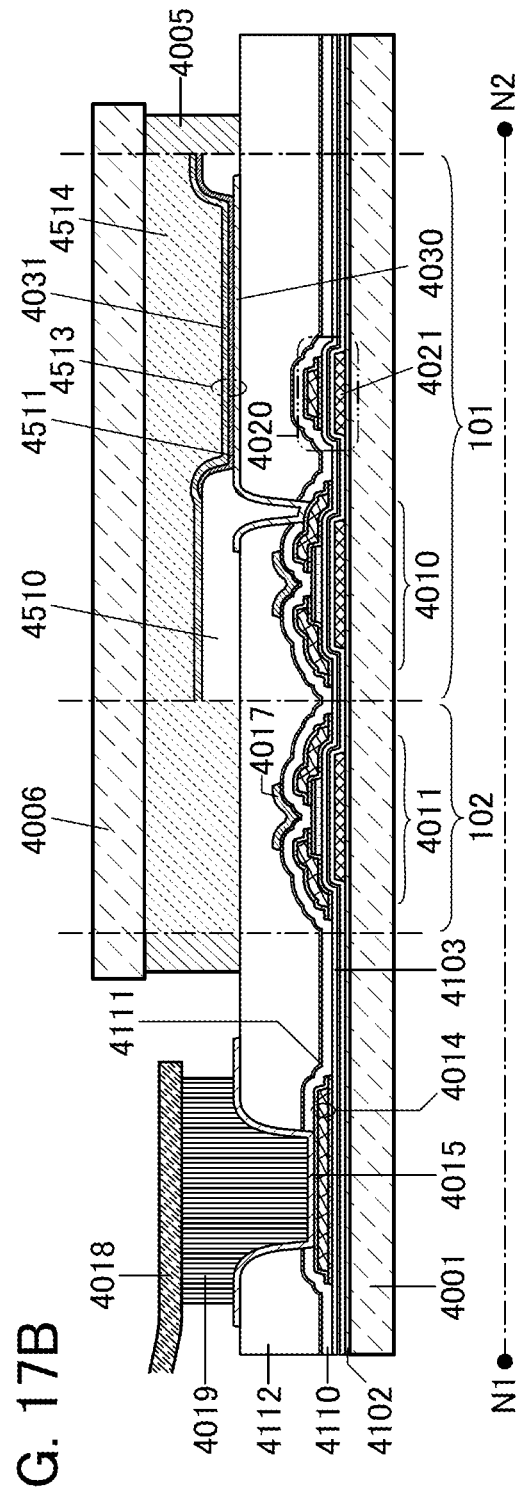

DISPLAY DEVICE

CROSS-REFERENCE TO RELATED APPLICATIONS

This application is a continuation of U.S. application Ser. No. 16/901,129, filed Jun. 15, 2020, now allowed, which is a continuation of U.S. application Ser. No. 15/866,880, filed Jan. 10, 2018, now U.S. Pat. No. 10,692,452, which claims the benefit of foreign priority applications filed in Japan as Serial No. 2017-005376 on Jan. 16, 2017, and Serial No. 2017-005407 on Jan. 16, 2017, all of which are incorporated by reference.

BACKGROUND OF THE INVENTION

1. Field of the Invention

One embodiment of the invention disclosed in this specification and the like relates to an object, a method, or a manufacturing method. One embodiment of the invention disclosed in this specification and the like relates to a process, a machine, manufacture, or a composition of matter. In particular, one embodiment of the invention disclosed in this specification and the like relates to a display device and a manufacturing method thereof.

In this specification and the like, a semiconductor device generally means a device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may be referred to as a semiconductor device. Alternatively, they may include a semiconductor device.

2. Description of the Related Art

An active-matrix display device where a transistor for driving a display element is provided in each pixel is known. For example, an active-matrix liquid crystal display device that includes a liquid crystal element as a display element, an active-matrix light-emitting display device that includes a light-emitting element, such as an organic electroluminescent (EL) element, as a display element, and the like are known. These active-matrix display devices are easier to increase in screen size or definition than simple-matrix display devices, and have an advantage in reduced power consumption and the like.

Moreover, there is a trend in an active matrix display device toward a larger screen, e.g., a screen diagonal of 30 inches or more, and further, the development of an active matrix display device is aimed at a screen diagonal of 60 inches or more, even at a screen diagonal of 120 inches or more. In addition, there is a trend in resolution of a screen toward higher definition, e.g., full high definition (number of pixels: 1920×1080; also referred to as "2K", for example), ultra high definition (number of pixels: 3840×2160; also referred to as "4K", for example), and super high definition (number of pixels: 7680×4320; also referred to as "8K", for example).

Increase in screen size or definition tends to increase wiring resistance in a display portion. Patent Document 1 discloses a technique of forming a low-resistance wiring layer using copper (Cu) in order to suppress increase in wiring resistance in a liquid crystal display device including an amorphous silicon transistor.

REFERENCE

Patent Document

[Patent Document 1] Japanese Published Patent Application No. 2004-163901

SUMMARY OF THE INVENTION

Increase in wiring resistance causes delay of signal transmission to an end portion of a signal line, distortion of a signal waveform, drop in voltage of a power supply line, or the like. As a result, deterioration of display quality, such as display unevenness or a defect in grayscale, increase in power consumption, or the like is caused. Furthermore, increase in the parasitic capacitance generated in a signal line also causes deterioration of display quality, increase in power consumption, or the like. For example, since the field-effect mobility of an amorphous silicon transistor is low, insufficient writing of an image signal due to increase in wiring resistance tends to occur easily in a display device including an amorphous silicon transistor.

Thus, further reduction in wiring resistance is demanded because of increase in screen size or definition. Similarly, reduction in parasitic capacitance in a signal line is demanded.

An object of one embodiment of the present invention is to provide a display device, electronic device, or the like having favorable display quality. Another object of one embodiment of the present invention is to provide a display device, electronic device, or the like with low power consumption. Another object of one embodiment of the present invention is to provide a display device, electronic device, or the like with favorable productivity. Another object of one embodiment of the present invention is to provide a display device, electronic device, or the like having favorable reliability. Another object of one embodiment of the present invention is to provide a novel display device, electronic device, or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a display portion including a plurality of pixels, a plurality of scan lines, a plurality of first signal lines, and a plurality of second signal lines. At least one of the plurality of pixels includes a display element and a transistor. The plurality of first signal lines and the plurality of second signal lines extend in a scanning direction. The plurality of first signal lines is positioned on an upstream side of the scanning direction. The plurality of second signal lines is positioned on a downstream side of the scanning direction. The plurality of pixels includes a first pixel electrically connected to one of the plurality of first signal lines and a second pixel electrically connected to one of the plurality of second signal lines. The plurality of scan lines includes a first scan line, a second scan line, and a third scan line. The first scan line includes a region overlapping with the plurality of first signal lines of the plurality of first signal lines and the plurality of second signal lines. The second scan line includes a region overlapping with the plurality of second signal lines of the plurality of first signal lines and the plurality of second signal lines. The third scan line includes a region overlapping with at least one of the plurality of first signal lines and a region overlapping with at least one of the plurality of second signal lines.

One embodiment of the present invention is a display device including a display portion where a plurality of pixels is arranged in a matrix of in rows by n columns (in and n are each an integer greater than or equal to 1), n first signal lines, n second signal lines, and in scan lines. At least one of the plurality of pixels includes a display element and a transistor. The n first signal lines and the n second signal lines extend in a scanning direction. The n first signal lines are positioned on an upstream side of the scanning direction. The n second signal lines are positioned on a downstream side of the scanning direction. The plurality of pixels includes a first pixel positioned in a j-th column (j is an integer greater than or equal to 1 and less than or equal to n) and a second pixel positioned in the j-th column. The first pixel is electrically connected to the j-th first signal line. The second pixel is electrically connected to the j-th second signal line. The in scan lines include a first scan line, a second scan line, and a third scan line. The first scan line includes a region overlapping with the n first signal lines of the n first signal lines and the n second signal lines. The second scan line includes a region overlapping with the n second signal lines of the n first signal lines and the n second signal lines. The third scan line includes a region overlapping with at least one of the n first signal lines and a region overlapping with at least one of the n second signal lines.

One embodiment of the present invention is a display device including a display portion including p (p is an integer greater than or equal to 4) pixels arranged in a matrix of in rows and n columns (in and n are each an integer greater than or equal to 2), n first signal lines, n second signal lines, and in scan lines. At least one of the p pixels includes a display element and a transistor. The n first signal lines and the n second signal lines extend in a scanning direction. The n first signal lines are positioned on an upstream side of the scanning direction. The n second signal lines are positioned on a downstream side of the scanning direction. The p pixels include a plurality of first pixels electrically connected to the k-th (k is an integer greater than or equal to 1 and less than n) first signal line, a plurality of second pixels electrically connected to the k-th second signal line, a plurality of third pixels electrically connected to the (k+1)-th first signal line, and a plurality of fourth pixels electrically connected to the (k+1)-th second signal line. The total number of the plurality of first pixels is different from the total number of the plurality of third pixels. Note that the sum of the total number of the plurality of first pixels and the total number of the plurality of second pixels is preferably equal to the sum of the total number of the plurality of third pixels and the total number of the plurality of fourth pixels.

One embodiment of the present invention is a display device including a display portion including p (p is an integer greater than or equal to 4) pixels arranged in a matrix of in rows and n columns (in and n are each an integer greater than or equal to 2), n first signal lines, n second signal lines, and in scan lines. At least one of the p pixels includes a display element and a transistor. The n first signal lines and the n second signal lines extend in a scanning direction. The n first signal lines are positioned on an upstream side of the scanning direction. The n second signal lines are positioned on a downstream side of the scanning direction. The p pixels include a plurality of first pixels electrically connected to the k-th (k is an integer greater than or equal to 1 and less than n) first signal line, a plurality of second pixels electrically connected to the k-th second signal line, a plurality of third pixels electrically connected to the (k+1)-th first signal line, and a plurality of fourth pixels electrically connected to the (k+1)-th second signal line. A ratio of the total number of the plurality of second pixels to the total number of the plurality of first pixels is different from a ratio of the total number of the plurality of fourth pixels to the total number of the plurality of third pixels.

An amorphous semiconductor or a semiconductor having crystallinity (a microcrystalline semiconductor, a polycrystalline semiconductor, a single crystal semiconductor, or a semiconductor partly including crystal regions) may be used as a semiconductor material used for a semiconductor layer of the transistor. For example, silicon or germanium can be used as the semiconductor material used for the semiconductor layer of the transistor. Alternatively, a compound semiconductor such as silicon carbide, gallium arsenide, a metal oxide, or a nitride semiconductor, an organic semiconductor, or the like can be used.

One embodiment of the present invention can provide a display device having favorable display quality with a screen diagonal of 30 inches or more, even with a screen diagonal of 60 inches or more. One embodiment of the present invention can provide a display device having favorable display quality with a resolution of 4K or more, even with a resolution of 8K or more.

One embodiment of the present invention can provide a display device, electronic device, or the like having favorable display quality. One embodiment of the present invention can provide a display device, electronic device, or the like with low power consumption. One embodiment of the present invention can provide a display device, electronic device, or the like with favorable productivity. One embodiment of the present invention can provide a display device, electronic device, or the like having favorable reliability. One embodiment of the present invention can provide a novel display device, electronic device, or the like.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 10A1, 10A2, 10B1, 10B2, 10C1, and 10C2 illustrate structure examples of a transistor.
FIGS. 11A1, 11A2, 11A3, 11B1, and 11B2 illustrate structure examples of a transistor.
FIGS. 12A1, 12A2, 12A3, 12B1, 12B2, 12C1, and 12C2 illustrate structure examples of a transistor.

FIGS. 17A and 17B each illustrate a display device.

DETAILED DESCRIPTION OF THE INVENTION

Figure 1:
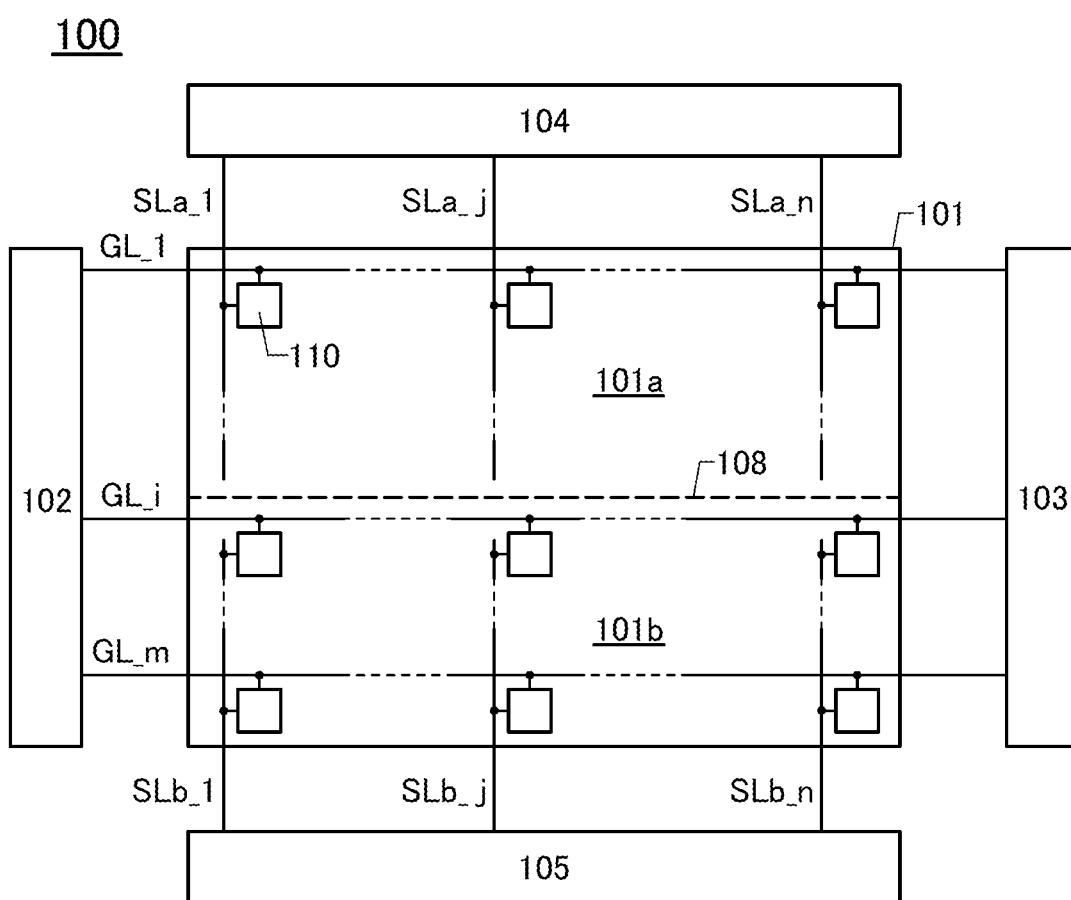
FIG. 1 illustrates a display device.

Embodiments will be described in detail with reference to the drawings. Note that the present invention is not limited to the following description and it will be readily appreciated by those skilled in the art that modes and details can be modified in various ways without departing from the spirit and the scope of the present invention. Thus, the present invention should not be construed as being limited to the description in the following embodiments. Note that in the structures of the present invention described below, the same portions or portions having similar functions are denoted by the same reference numerals in different drawings, and the description thereof is not repeated in some cases.

The position, size, range, and the like of each component illustrated in the drawings and the like are not accurately represented in some cases to facilitate understanding of the invention. Therefore, the present invention is not necessarily limited to the position, size, range, or the like as disclosed in the drawings and the like. For example, in the actual manufacturing process, a layer, a resist mask, or the like might be unintentionally reduced in size by treatment such as etching, which is not illustrated in some cases for easy understanding of the present invention.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A different ordinal number from an ordinal number used to denote a component in this specification and the like might be used to denote the component in a claim. Moreover, a term with an ordinal number in this specification and the like might not be provided with any ordinal number in a claim.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" provided in an integrated manner.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor layer, an effective channel width is greater than an apparent channel width, and its influence cannot be ignored in some cases. For example, in a miniaturized transistor having a gate electrode covering a side surface of a semiconductor, the proportion of a channel formation region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Further, in this specification, in the case where the term "channel width" is simply used, it may represent a surrounded channel width or an apparent channel width. Alternatively, in this specification, in the case where the term "channel width" is simply used, it may represent an effective channel width in some cases. Note that a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

In this specification and the like, in the case where an etching step (removal step) is performed after a resist mask is formed in a photolithography method, the resist mask is removed after the etching step, unless otherwise specified.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

A transistor described in this specification and the like refers to an enhancement-mode (normally-off) field-effect transistor, unless otherwise specified. A transistor described in this specification and the like also refers to an n-channel transistor, unless otherwise specified. Therefore, the threshold voltage (also referred to as "$V_{th}$") thereof is higher than 0 V, unless otherwise specified.

Note that the $V_{th}$ of a transistor including a back gate in this specification and the like refers to a $V_{th}$ obtained when the potential of the back gate is set equal to that of a source or a gate, unless otherwise specified.

Unless otherwise specified, off-state current in this specification and the like refers to drain current of a transistor in an off state (also referred to as a non-conducting state and a cutoff state). Unless otherwise specified, the off state of an n-channel transistor means that a potential difference (hereinafter also referred to as $V_g$) between its gate and source when the potential of the source is regarded as a reference potential is lower than the threshold voltage $V_{th}$, and the off state of a p-channel transistor means that the voltage $V_g$ between its gate and source is higher than the threshold voltage $V_{th}$. For example, the off-state current of an n-channel transistor sometimes refers to drain current that flows when $V_g$ is lower than the threshold voltage (hereinafter also referred to as $V_{th}$).

The off-state current of a transistor depends on $V_g$ in some cases. For this reason, when there is $V_g$ at which the off-state current of a transistor is lower than or equal to I, it may be said that the off-state current of the transistor is lower than or equal to I. Furthermore, the off-state current of a transistor may refer to the off-state current in an off state at predetermined $V_g$, the off-state current in an off state at $V_g$ in a predetermined range, the off-state current in an off state at $V_g$ with which sufficiently reduced off-state current is obtained, or the like.

As an example, the assumption is made of an n-channel transistor where $V_{th}$ is 0.5 V and the drain current is $1\times10^{-9}$ A at $V_g$ of 0.5 V, $1\times10^{-13}$ A at $V_g$ of 0.1 V, $1\times10^{-19}$ A at $V_g$ of $-0.5$ V, and $1\times10^{-22}$ A at $V_g$ of $-0.8$ V. The drain current of the transistor is lower than or equal to $1\times10^{-19}$ A at $V_g$ of $-0.5$ V or at $V_g$ in the range of $-0.8$ V to $-0.5$ V; therefore, it can be said that the off-state current of the transistor is lower than or equal to $1\times10^{-19}$ A. Since there is $V_g$ at which the drain current of the transistor is lower than or equal to $1\times10^{-22}$ A, it can be said that the off-state current of the transistor is lower than or equal to $1\times10^{-22}$ A.

The off-state current of a transistor depends on temperature in some cases. Unless otherwise specified, the off-state current in this specification may be an off-state current at room temperature (RT), 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., a temperature higher than or equal to 5° C. and lower than or equal to 35° C.). The state in which the off-state current of a transistor is lower than or equal to I may indicate that the off-state current of the transistor at RT, 60° C., 85° C., 95° C., 125° C., a temperature at which the reliability of a semiconductor device or the like including the transistor is ensured, or a temperature at which the semiconductor device or the like including the transistor is used (e.g., a temperature higher than or equal to 5° C. and lower than or equal to 35° C.) is lower than or equal to I at a certain $V_g$.

In some cases, the off-state current of a transistor depends on a voltage between its drain and source when the potential of the source is regarded as a reference potential (hereinafter such a voltage is also referred to as $V_d$). Unless otherwise specified, the off-state current in this specification may be an off-state current at $V_d$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_d$ at which the reliability of a semiconductor device or the like including the transistor is ensured or at $V_d$ used in the semiconductor device or the like including the transistor. The state in which the off-state current of a transistor is lower than or equal to I may indicate that the off-state current of the transistor at $V_d$ of 0.1 V, 0.8 V, 1 V, 1.2 V, 1.8 V, 2.5 V, 3 V, 3.3 V, 10 V, 12 V, 16 V, or 20 V, at $V_d$ at which the reliability of a semiconductor device or the like including the transistor is ensured, or at $V_d$ used in the semiconductor device or the like including the transistor is lower than or equal to I at a certain $V_g$.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

In this specification, unless otherwise specified, the term "parallel" indicates that the angle formed between two straight lines is greater than or equal to −10° and less than or equal to 10°, and accordingly also includes the case where the angle is greater than or equal to −5° and less than or equal to 5°. In addition, unless otherwise specified, the term "substantially parallel" indicates that the angle formed between two straight lines is greater than or equal to −30° and less than or equal to 30°. The term "perpendicular" or "orthogonal" indicates, unless otherwise specified, that the angle formed between two straight lines is greater than or equal to 80° and less than or equal to 100°, and accordingly also includes the case where the angle is greater than or equal to 85° and less than or equal to 95°. In addition, unless otherwise specified, the term "substantially perpendicular" indicates that the angle formed between two straight lines is greater than or equal to 60° and less than or equal to 120°.

In the specification and the like, the terms "identical", "the same", "equal", "uniform", and the like (including synonyms thereof) used in describing calculation values and actual measurement values allow for a margin of error of ±20% unless otherwise specified.

Embodiment 1

A display device 100 of one embodiment of the present invention will be described with reference to the drawings.
<Structure Example>

FIG. 1 is a block diagram of a configuration example of the display device 100. The display device 100 includes a display portion 101, a scan line driver circuit 102, a scan line driver circuit 103, a signal line driver circuit 104, and a signal line driver circuit 105. Note that circuits included in the scan line driver circuit 102, the scan line driver circuit 103, the signal line driver circuit 104, and the signal line driver circuit 105 are collectively referred to as a "peripheral driver circuit" or a "driver circuit" in some cases. Any of a variety of circuits such as a shift register, a level shifter, an inverter, a latch, an analog switch, and a logic circuit can be used as the peripheral driver circuit.

The display portion 101 includes a plurality of pixels 110. For example, the display portion 101 includes a plurality of pixels 110 arranged in a matrix of m rows and n columns (m and n are each an integer greater than or equal to 1). The display device 100 further includes m wirings GL. Each of the m wirings GL extends in the row direction. Each of the m wirings GL is electrically connected to a plurality of pixels 110 arranged in the row direction in the display portion 101.

In FIG. 1, a wiring GL electrically connected to a pixel 110 in a first row is denoted by a wiring GL_1. A wiring GL electrically connected to a pixel 110 in an i-th row (i is a given integer greater than or equal to 1 and less than or equal to m) is denoted by a wiring GL_i. A wiring GL electrically connected to a pixel 110 in an m-th row is denoted by a wiring GL_m.

One end of the wiring GL is electrically connected to the scan line driver circuit 102 and the other end of the wiring GL is electrically connected to the scan line driver circuit 103. Accordingly, the scan line driver circuit 102 and the scan line driver circuit 103 are provided to face each other with the display portion 101 positioned therebetween. Note that the wiring GL is referred to as a "scan line" in some cases.

The scan line driver circuit 102 and the scan line driver circuit 103 each have a function of supplying a selection signal to the wirings GL_1 to GL_m in order. In other words, the scan line driver circuit 102 and the scan line driver circuit 103 each have a function of scanning the wirings GL_1 to GL_m in order. After scanning of the wiring GL_m is finished, scanning is performed again in order from the wiring GL_1.

The wiring GL has a function of transferring, to the pixels 110, selection signals supplied from the scan line driver circuit 102 and the scan line driver circuit 103.

When selection signals are supplied from the scan line driver circuit 102 and the scan line driver circuit 103 to the same wiring GL at the same time, the capability of supplying selection signals to the wiring GL can be increased. Note that one of the scan line driver circuit 102 and the scan line driver circuit 103 may be omitted depending on the purpose, for example.

In the display device 100 of one embodiment of the present invention, the display portion 101 is divided into two, namely, a display portion 101a on the upstream side of the scanning direction and a display portion 101b on the downstream side of the scanning direction. In FIG. 1, the boundary between the display portion 101a and the display portion 101b is denoted by a boundary line 108.

The display device 100 further includes n wirings SLa and n wirings SLb. Note that in this specifications and the like, a "wiring SL" is stated in some cases when referring to either the wiring SLa or the wiring SLb or describing the matter common to the wiring SLa and the wiring SLb. Each of the n wirings SLa extends in the scanning direction (the column direction) and is electrically connected to a plurality of pixels 110 arranged in the column direction in the display portion 101a. Each of the n wirings SLb extends in the scanning direction (the column direction) and is electrically connected to a plurality of pixels 110 arranged in the column direction in the display portion 101b.

In FIG. 1, in the display portion 101a, a wiring SLa electrically connected to pixels 110 in a first column is denoted by a wiring SLa_1. Furthermore, a wiring SLa electrically connected to pixels 110 in a j-th column (j is a given integer greater than or equal to 1 and less than or equal to n) is denoted by a wiring SLa_j. Furthermore, a wiring SLa electrically connected to pixels 110 in an n-th column is denoted by a wiring SLa_n.

In the display portion 101b, a wiring SLb electrically connected to pixels 110 in the first column is denoted by a wiring SLb_1. Furthermore, a wiring SLb electrically connected to pixels 110 in the j-th column is denoted by a wiring SLb_j. Furthermore, a wiring SLb electrically connected to pixels 110 in the n-th column is denoted by a wiring SLb_n.

One end of the wiring SLa is electrically connected to the signal line driver circuit 104 and one end of the wiring SLb is electrically connected to the signal line driver circuit 105. Accordingly, the signal line driver circuit 104 and the signal line driver circuit 105 are provided to face each other with the display portion 101 positioned therebetween. Note that the wiring SL is referred to as a "signal line" in some cases.

The signal line driver circuit 104 has a function of supplying an image signal to the wiring SLa. The wiring SLa has a function of transferring, to the pixel 110, an image signal supplied from the signal line driver circuit 104. The signal line driver circuit 105 has a function of supplying an image signal to the wiring SLb. The wiring SLb has a function of transferring, to the pixel 110, an image signal supplied from the signal line driver circuit 105.

Figure 2:
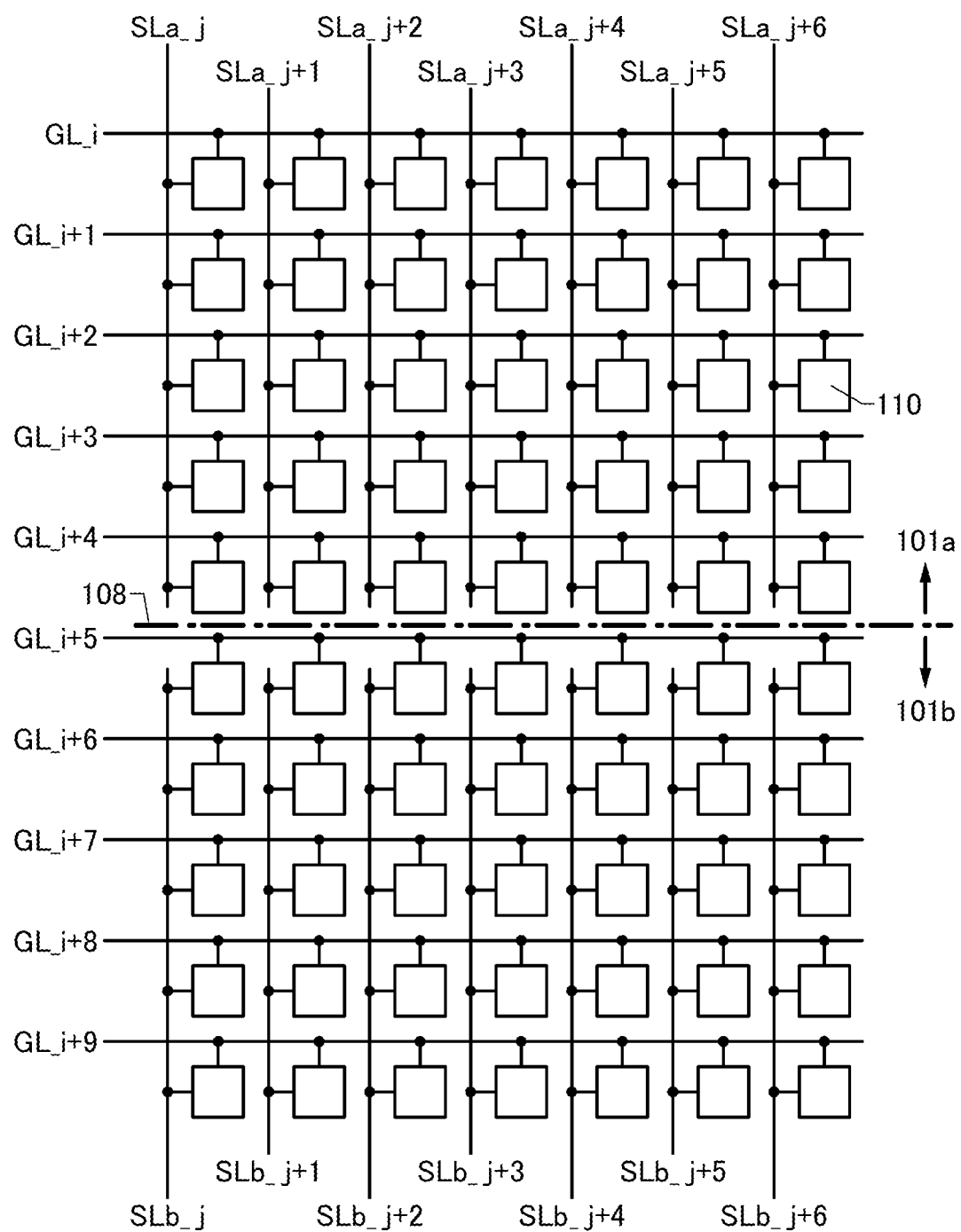
FIG. 2 illustrates a display portion.

FIG. 2 shows the area near the boundary between the display portion 101a and the display portion 101b. In FIG. 2, the area up to the wiring GL_i+4 corresponds to the display portion 101a, and the area from the wiring GL_i+5 corresponds to the display portion 101b.

In the case where all of the pixels 110 in the j-th column in the display portion 101 are connected by one wiring, signal delay and signal distortion are easily caused by the influence of the wiring resistance and the parasitic capacitance. Particularly in a display device with a screen diagonal of 30 inches or more, a reduction in display quality is easily caused. Also in a display device with a resolution of 4K or more, a reduction in display quality is easily caused.

When a wiring connected to the pixels 110 in the j-th column is divided into halves, namely, the wiring SLa and the wiring SLb, as shown in FIG. 1 and FIG. 2, the wiring resistance and the parasitic capacitance can each be reduced by half. Thus, the influence on the signal delay and signal distortion (the time constant) can be reduced to one fourth. That is, the display quality of the display device can be improved.

The length of the wiring SLa_j included in the display portion 101a is preferably equal to the length of the wiring SLb_j included in the display portion 101b. Thus, the wiring resistance of the wiring SLa_j can be equal to the wiring resistance of the wiring SLb_j. Accordingly, the sum of the wiring resistances of the n wirings SLa included in the display portion 101a can be equal to the sum of the wiring resistances of the n wirings SLb included in the display portion 101b.

The number of pixels 110 electrically connected to the wiring SLa_j is preferably equal to the number of pixels 110 electrically connected to the wiring SLb_j. Thus, the parasitic capacitance generated in the wiring SLa_j can be approximately equal to the parasitic capacitance generated in the wiring SLb_j. Accordingly, the sum of the parasitic capacitances of then wirings SLa included in the display portion 101a can be equal to the sum of the parasitic capacitances of the n wirings SLb included in the display portion 101b.

MODIFICATION EXAMPLE 1

Figure 3:
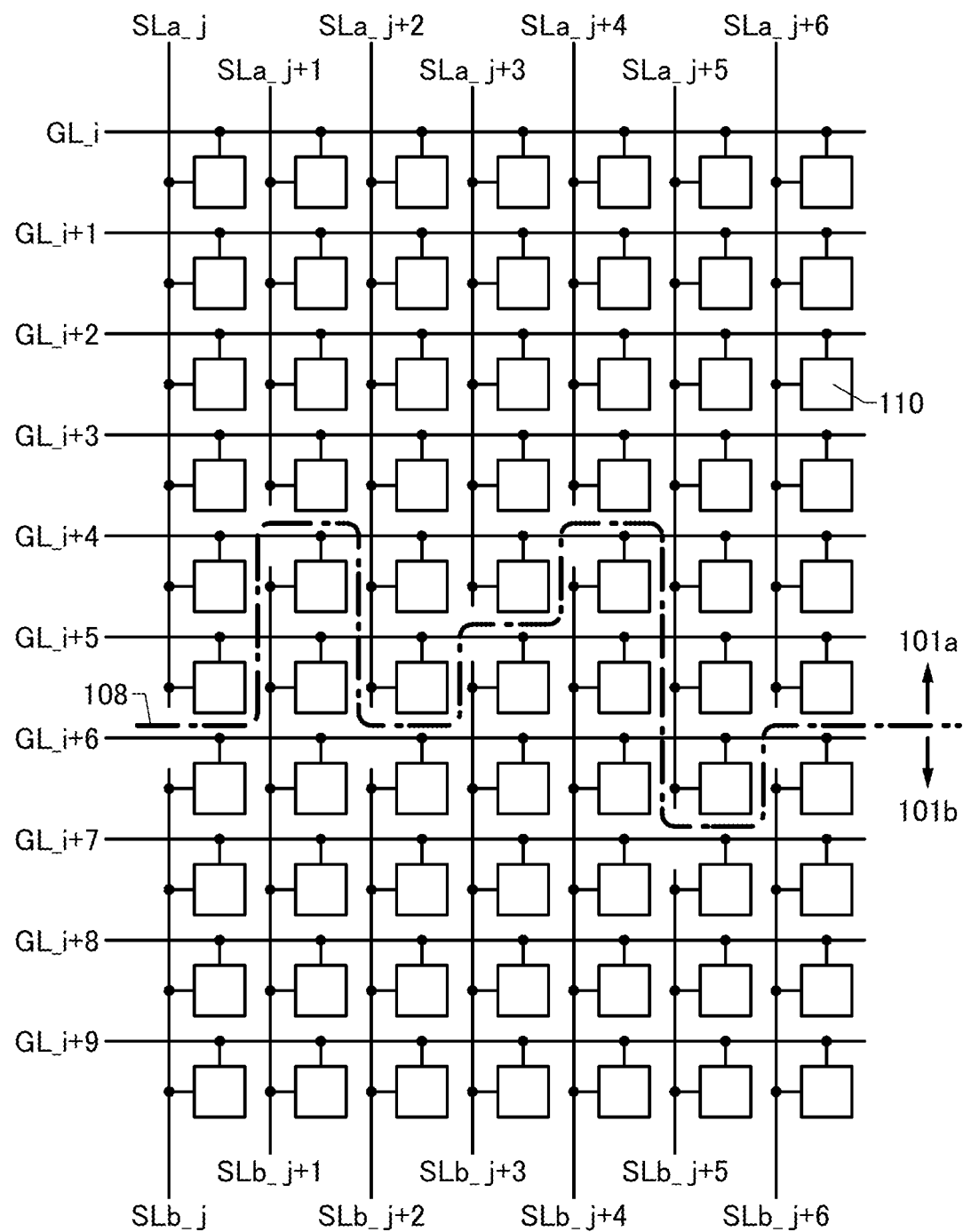
FIG. 3 illustrates a display portion.

When the boundary line 108 is straight as shown in FIG. 2, a boundary portion between the display portion 101a and the display portion 101b is perceived as a stripe by a viewer of the display device in some cases. When the boundary line 108 is not straight as shown in FIG. 3, the display quality of the display device can be further improved.

For example, in the display portion 101, the lengths of the wiring SLa and the wiring SLb are varied randomly every column, whereby the boundary line 108 can be bent. Alternatively, in the display portion 101, the length of the wiring SLa in the j-th column (the wiring SLa_j) is made different from the length of the wiring SLa in the (j+1)-th column (the wiring SLa_j+1); similarly, in the display portion 101, the length of the wiring SLb in the j-th column (the wiring SLb_j) is made different from the length of the wiring SLb in the (j+1)-th column (the wiring SLb_j+1). Further alternatively, in the display portion 101, the ratio of the length of the wiring SLb to the length of the wiring SLa is varied every column. Note that the variation of the wirings in the length and the ratio may be made not only every column but also every two or more columns.

By bending the boundary line 108, the stripe can be less perceived. Thus, the display quality of the display device 100 can be further improved.

The number of pixels 110 electrically connected to the wiring SLa_j may be different from the number of pixels 110 electrically connected to the wiring SLa_j+1. Similarly, the number of pixels 110 electrically connected to the wiring SLb_j may be different from the number of pixels 110 electrically connected to the wiring SLb_j+1. Thus, the boundary line 108 can be bent. Note that in the display device 100, the sum of the number of pixels 110 electrically connected to the wiring SLa_j and the number of pixels 110 electrically connected to the wiring SLb_j is equal to the sum of the number of pixels 110 electrically connected to the wiring SLa_j+1 and the number of pixels 110 electrically connected to the wiring SLb_j+1.

When the difference between the number of pixels 110 included in the display portion 101a and the number of pixels 110 included in the display portion 101b is large, the difference between the display portion 101a and the display portion 101b in the wiring resistance and the parasitic capacitance becomes large, which results in display unevenness or the like. It is preferable that the number of pixels 110 included in the display portion 101a be equal to the number of pixels 110 included in the display portion 101b. The difference between the number of pixels 110 included in the display portion 101a and the number of pixels 110 included in the display portion 101b is preferably less than or equal to 20%, further preferably less than or equal to 10%, of the number of pixels 110 included in the display portion 101.

In other words, the area of the display portion 101a is preferably equal to the area of the display portion 101b. The difference between the area of the display portion 101a and the area of the display portion 101b is preferably less than or equal to 20%, further preferably less than or equal to 10%, of the area of the display portion 101.

MODIFICATION EXAMPLE 2

Figure 4:
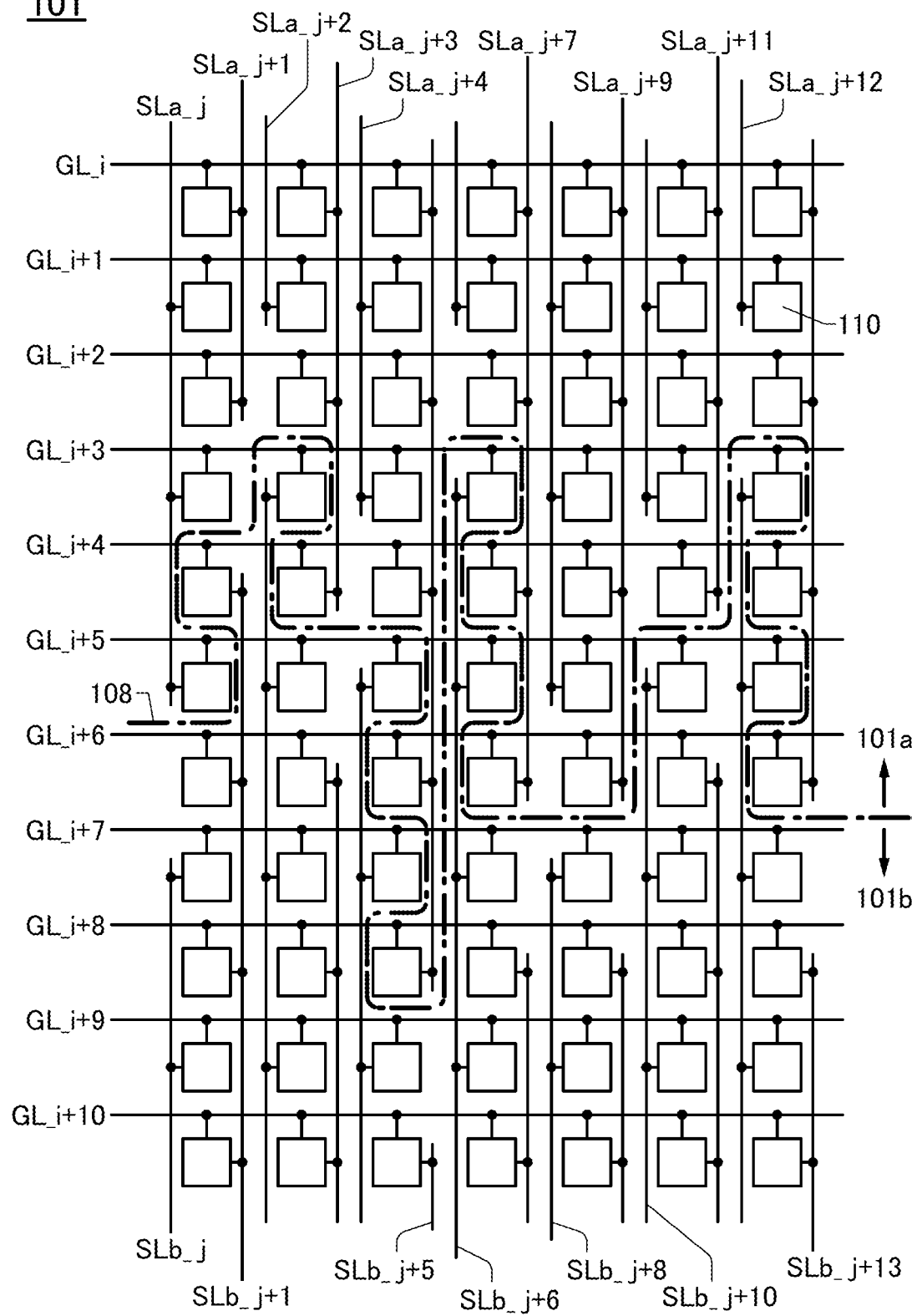
FIG. 4 illustrates a display portion.

A double-source type display portion may be used as the display portion 101. FIG. 4 shows the display portion 101 that is a double-source type display portion in which the boundary line 108 is bent.

Figure 5A:
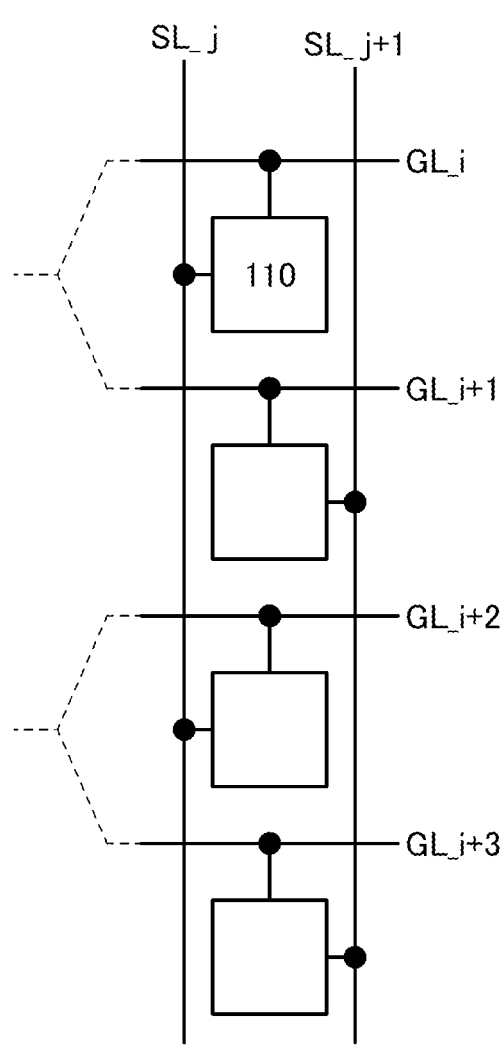
FIGS. 5A and 5B each illustrate a display portion.

A double-source type display portion is a display portion in which two wirings SL are provided for pixels 110 in one column, and the pixel 110 electrically connected to one of the two wirings SL and the pixel 110 electrically connected to the other wiring SL are alternately arranged (see FIG. 4 and FIG. 5A). Furthermore, in the double-source type display portion, wirings GL in two rows can be selected at a time, so that the time of writing an image signal can be set long. Thus, insufficient writing of an image signal can be prevented even in high-speed driving at an increased frame frequency. For example, insufficient writing of an image signal can be prevented even at a frame frequency of higher than or equal to 120 Hz.

The frame frequency may be variable in the range from 1 Hz to 120 Hz. For example, by decreasing the frame frequency when a still image is displayed, the power consumption of the display device can be reduced. By increasing the frame frequency, a moving image can be seen with high visibility.

Figure 5B:
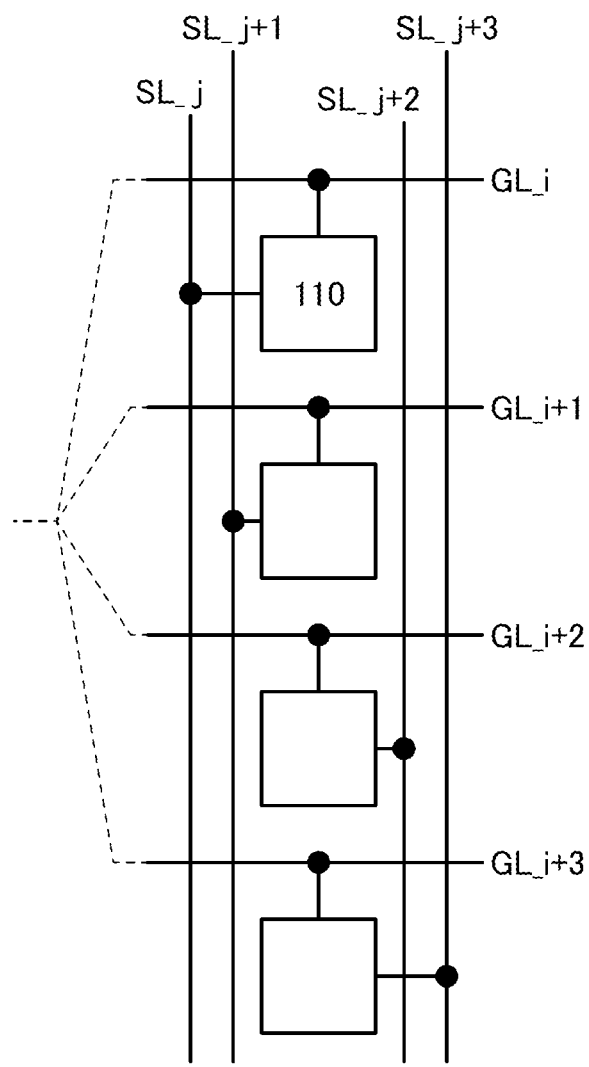

The display portion is not limited to a double-source type display portion and may be a triple-source type display portion in which three wirings SL are provided for pixels 110 in one column or a quad-source type display portion in which four wirings SL are provided for pixels 110 in one column (see FIG. 5B). Five or more wirings SL may be provided for pixels 110 in one column.

MODIFICATION EXAMPLE 3

Figure 6:
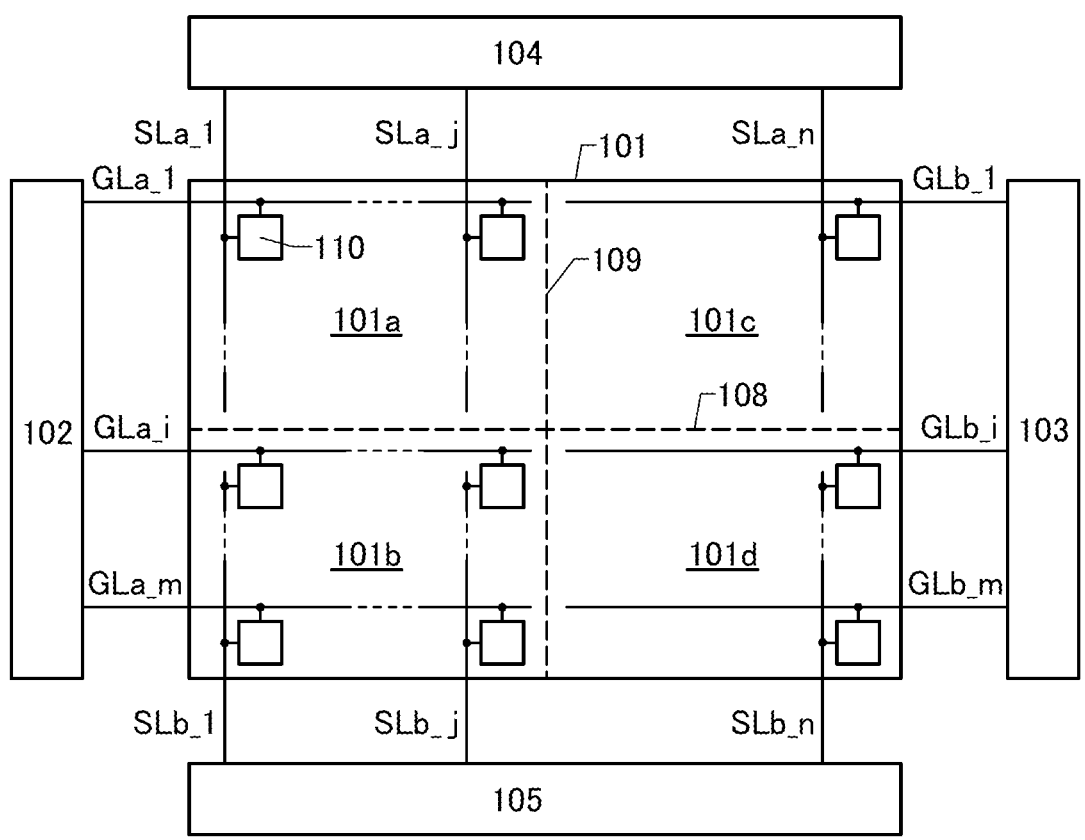
FIG. 6 illustrates a display device.
Figure 7:
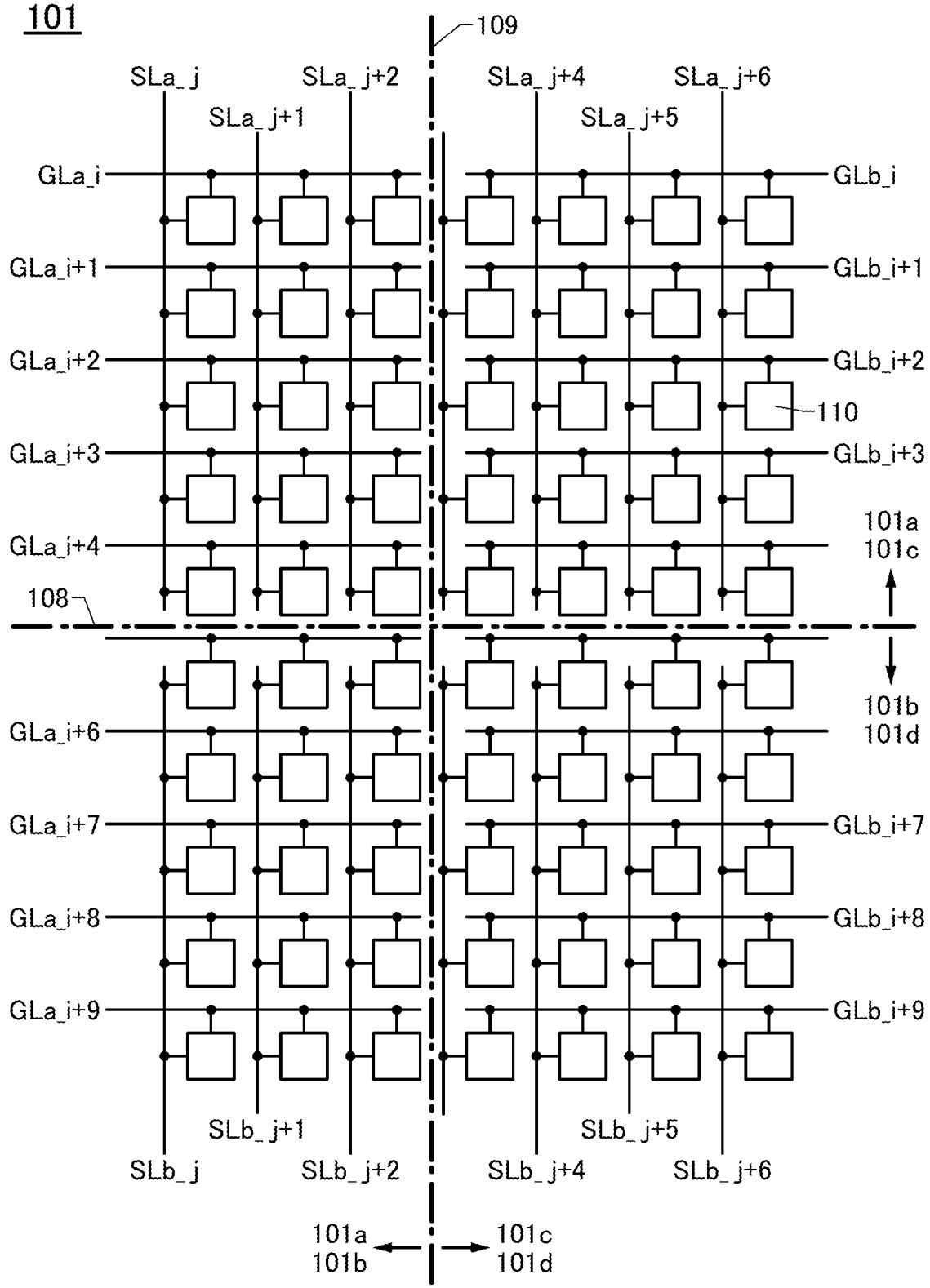
FIG. 7 illustrates a display portion.

In the display device 100, the display portion 101 may be divided into four. A display device 100A shown in FIG. 6 includes the display portion 101 divided into four regions, namely, the display portion 101a, the display portion 101b, a display portion 101c, and a display portion 101d. In FIG. 6 and FIG. 7, the boundary between the display portions 101a and 101c and the display portions 101b and 101d is indicated by the boundary line 108. Furthermore, in FIG. 6 and FIG. 7, the boundary between the display portions 101a and 101b and the display portions 101c and 101d is indicated by a boundary line 109. In the description given below, portions of the display device 100A that are different from those in the display device 100 are described.

In the display device 100A, in wirings GLa are included in the display portion 101a and the display portion 101b. Each of the in wirings GLa is electrically connected to a plurality of pixels 110 arranged in the row direction in the display portion 101a or the display portion 101b. The wiring GLa is electrically connected to the scan line driver circuit 102.

The scan line driver circuit 102 has a function of supplying a selection signal to the wiring GLa. The wiring GLa has a function of transferring, to the pixels 110, a selection signal supplied from the scan line driver circuit 102.

In the display device 100A, in wirings GLb are included in the display portion 101c and the display portion 101d. Each of the in wirings GLb is electrically connected to a plurality of pixels 110 arranged in the row direction in the display portion 101c or the display portion 101d. The wiring GLb is electrically connected to the scan line driver circuit 103.

The scan line driver circuit 103 has a function of supplying a selection signal to the wiring GLb. The wiring GLb has a function of transferring, to the pixels 110, a selection signal supplied from the scan line driver circuit 103.

When the display device 100A in which the wiring GL is divided into the wiring GLa and the wiring GLb is driven, the wiring resistance and the parasitic capacitance of the wiring GL can be reduced. Accordingly, the load on the scan line driver circuit 102 and the scan line driver circuit 103 can be reduced, and the display device 100A can perform high-speed operation easily.

Note that the boundary line 109 may be bent like the above-described boundary line 108.

Figure 8A:
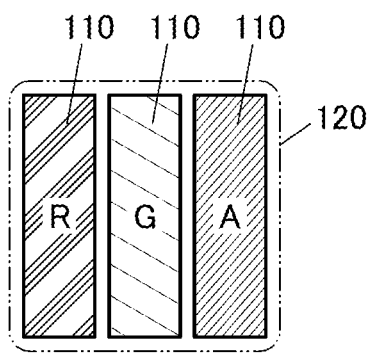
FIGS. 8A to 8E illustrate subpixels.
Figure 8B:
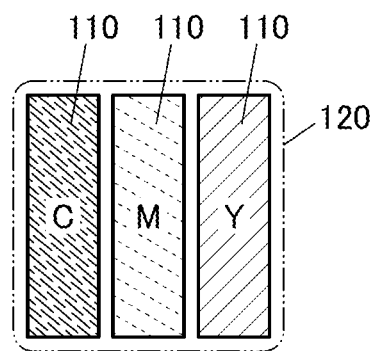

Full-color display can be achieved by making a pixel 110 that controls red light, a pixel 110 that controls green light, and a pixel 110 that controls blue light collectively function as one pixel 120 and controlling the amount of light emitted from each pixel 110 (the emission luminance). Thus, these three pixels 110 each function as a sub-pixel. That is, three sub-pixels control, for example, the amount of light of red light, green light, and blue light (see FIG. 8A). The light colors controlled by the three sub-pixels are not limited to red (R), green (G), and blue (B) and may be cyan (C), magenta (M), and yellow (Y) (see FIG. 8B).

Figure 8C:
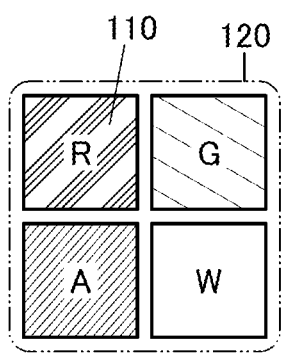
Figure 8D:
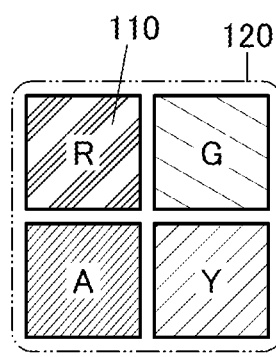
Figure 8E:
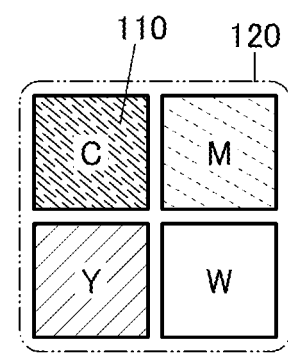

Four sub-pixels may collectively function as one pixel. For example, a sub-pixel that controls white light may be added to the three sub-pixels that control red light, green light, and blue light (see FIG. 8C). The addition of the sub-pixel that controls white light can increase the luminance of the display region. A sub-pixel that controls yellow light may be added to the three sub-pixels that control red light, green light, and blue light (see FIG. 8D). A sub-pixel that controls white light may be added to the three sub-pixels that control cyan light, magenta light, and yellow light (see FIG. 8E).

When sub-pixels that control light of colors such as red, green, blue, cyan, magenta, and yellow are combined as appropriate with more sub-pixels functioning as one pixel, the reproducibility of halftones can be increased. Thus, the display quality can be improved.

The display device of one embodiment of the present invention can reproduce the color gamut of various standards. For example, the display device of one embodiment of the present invention can reproduce the color gamut of the following standards: the Phase Alternating Line (PAL) or National Television System Committee (NTSC) standard used for TV broadcasting; the standard RGB (sRGB) or Adobe RGB standard used widely for display devices in electronic devices such as personal computers, digital cameras, and printers; the International Telecommunication Union Radiocommunication Sector Broadcasting Service (Television) 709 (ITU-R BT.709) standard used for high-definition televisions (HDTV, also referred to Hi-Vision); the Digital Cinema Initiatives P3 (DCI-P3) standard used for digital cinema projection; and the ITU-R BT.2020 (Recommendation 2020 (REC.2020)) standard used for ultra-high-definition televisions (UHDTV, also referred to as Super Hi-Vision); and the like.

Using the pixels 120 arranged in a matrix of 1920×1080, the display device 100 can achieve full color display with full high definition (also referred to as 2K resolution, 2K1K, 2K, and the like). Using the pixels 120 arranged in a matrix of 3840×2160, the display device 100 can achieve full color display with ultra high definition (also referred to as 4K resolution, 4K2K, 4K, and the like). Using the pixels 120 arranged in a matrix of 7680×4320, the display device 100 can achieve full color display with super high definition (also referred to as 8K resolution, 8K4K, 8K, and the like). Using a larger number of pixels 120, the display device 100 can achieve full color display with 16K or 32K resolution.

One embodiment of the present invention can provide a display device having favorable display quality with a screen diagonal of 30 inches or more or even with a screen diagonal of 60 inches or more, also in the case where an amorphous silicon transistor is used as a transistor for driving a display element, for example. One embodiment of the present invention can provide a display device having favorable display quality with a resolution of 4K or more or even with a resolution of 8K or more, also in the case where an amorphous silicon transistor is used as a transistor for driving a display element, for example.

This embodiment can be implemented in an appropriate combination with any of the structures described in the other embodiments and the like.

Embodiment 2

In this embodiment, circuit configuration examples that can be used for the pixel 110 will be described with reference to FIGS. 9A and 9B. The pixel 110 includes a pixel circuit 438 and a display element 432.

[Example of Pixel Circuit for Light-Emitting Display Device]

Figure 9A:
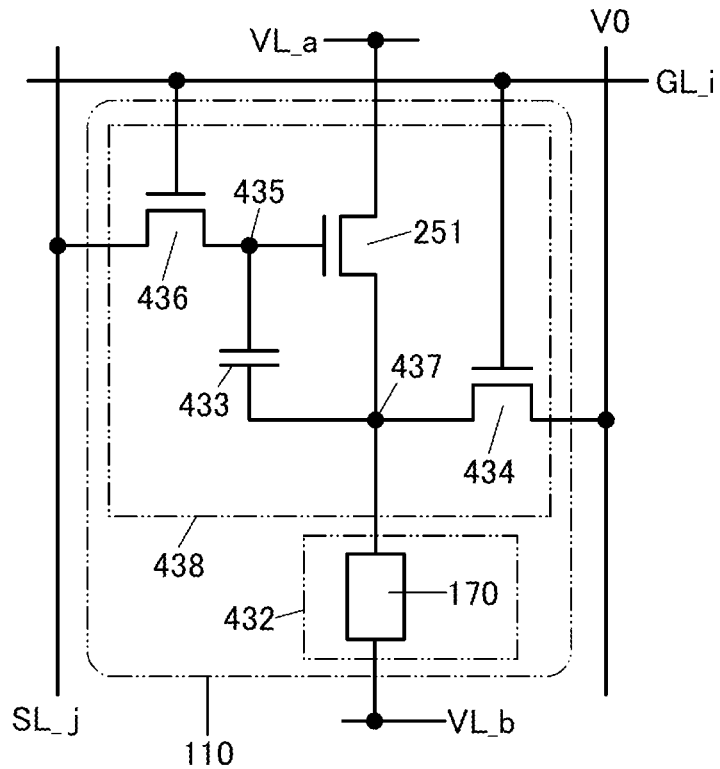
FIGS. 9A and 9B illustrate configuration examples of a pixel circuit.

FIG. 9A illustrates a circuit configuration example that can be used for the pixel 110. The pixel circuit 438 shown in FIG. 9A includes a transistor 436, a capacitor 433, a transistor 251, and a transistor 434. The pixel circuit 438 is electrically connected to the light-emitting element 4513 that can function as the display element 432.

One of a source electrode and a drain electrode of the transistor 436 is electrically connected to the wiring SL_j to which an image signal is supplied. A gate electrode of the transistor 436 is electrically connected to the wiring GL_i to which a selection signal is supplied.

The transistor 436 has a function of controlling whether to write an image signal to a node 435.

One of a pair of electrodes of the capacitor 433 is electrically connected to the node 435, and the other of the pair of electrodes of the capacitor 433 is electrically connected to a node 437. The other of the source electrode and the drain electrode of the transistor 436 is electrically connected to the node 435.

The capacitor 433 functions as a storage capacitor for storing data written to the node 435.

One of a source electrode and a drain electrode of the transistor 251 is electrically connected to a potential supply line VL_a, and the other of the source electrode and the drain electrode of the transistor 251 is electrically connected to the node 437. A gate electrode of the transistor 251 is electrically connected to the node 435.

One of a source electrode and a drain electrode of the transistor 434 is electrically connected to a potential supply line V0 and the other of the source electrode and the drain electrode of the transistor 434 is electrically connected to the node 437. A gate electrode of the transistor 434 is electrically connected to the wiring GL_i.

One of an anode and a cathode of the light-emitting element 4513 is electrically connected to a potential supply line VL_b, and the other is electrically connected to the node 437.

As the light-emitting element 4513, an organic electroluminescent element (also referred to as an organic EL element) or the like can be used, for example Note that the light-emitting element 4513 is not limited thereto and may be an inorganic EL element containing an inorganic material, for example.

As a power supply potential, a potential on the relatively high potential side or a potential on the relatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 438 in FIG. 9A, the pixel circuits 438 are sequentially selected row by row by the scan line driver circuit 102 and/or the scan line driver circuit 103, whereby the transistors 436 and the transistors 434 are turned on and an image signal is written to the nodes 435.

When the transistors 436 and the transistors 434 are turned off, the pixel circuits 438 in which the data has been written to the nodes 435 are brought into a holding state. Furthermore, the amount of current flowing between the source electrode and the drain electrode of the transistor 251 is controlled in accordance with the potential of the data written to the node 435. The light-emitting element 4513 emits light with a luminance corresponding to the amount of current flow. This operation is sequentially performed row by row; thus, an image can be displayed.

A transistor with low off-state current is preferably used for the transistor 436. With the use of a transistor with low off-state current for the transistor 436, the potential of the node 435 is stabilized, whereby the display quality of the display device can be improved. A transistor with low off-state current is preferably used also for the transistor 434.

[Example of Pixel Circuit for Liquid Crystal Display Device]

Figure 9B:
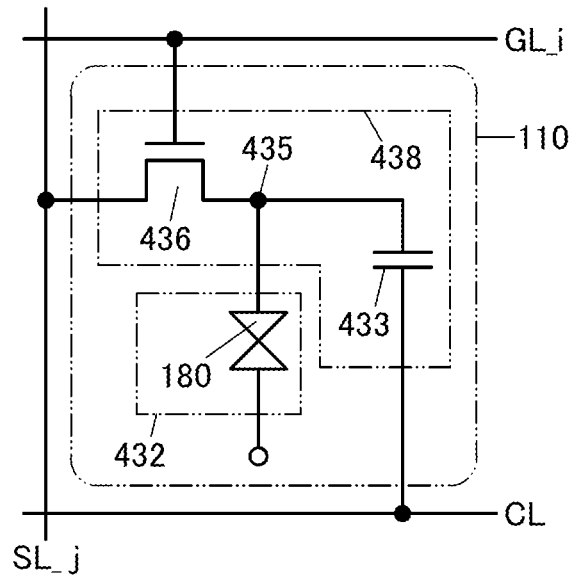

The pixel circuit 438 in FIG. 9B includes the transistor 436 and the capacitor 433. The pixel circuit 438 is electrically connected to a liquid crystal element 180 functioning as the display element 432.

The potential of one of a pair of electrodes of the liquid crystal element 180 is set in accordance with the specifications of the pixel circuit 438 as appropriate. The alignment state of the liquid crystal element 180 depends on data written to the node 435. A common potential may be applied to one of the pair of electrodes of the liquid crystal element 180 included in each of the plurality of pixel circuits 438. The potential applied to one of the pair of electrodes of the liquid crystal element 180 in the pixel circuit 438 may differ between rows.

The liquid crystal element 180 can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element 180 can employ a variety of modes. For example, a liquid crystal element using, instead of a VA mode, a twisted nematic (TN) mode, an in-plane switching (IPS) mode, a VA-IPS mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a guest-host mode, or the like can be used.

The liquid crystal element controls transmission or non-transmission of light utilizing an optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition which includes a liquid crystal exhibiting a blue phase and a chiral material has a short response time and optical isotropy, which makes the alignment process unneeded. In addition, the liquid crystal composition which includes a liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of a liquid crystal display device in the manufacturing process can be reduced.

Note that when a guest-host mode liquid crystal material is used for the liquid crystal element 180, a functional member such as a light diffusion layer or a polarizing plate is not necessarily provided. Accordingly, the productivity of the display device can be improved. In addition, since a functional member such as a polarizing plate is unnecessary, the luminance of reflected light of the liquid crystal element 180 can be increased. Accordingly, the visibility of the display device can be increased.

The on and off states (bright and dark states) of a reflective liquid crystal display device including a circularly polarizing plate are switched depending on the alignment direction of the major axes of liquid crystal molecules: a direction substantially perpendicular to a substrate or a direction substantially parallel to the substrate. In general, it is difficult to use a liquid crystal element that operates in a horizontal electric field mode such as an IPS mode in a reflective liquid crystal display device because the major axes of liquid crystal molecules in the liquid crystal element are aligned in a direction substantially parallel to a substrate in both of the on and off states.

The on and off states of a liquid crystal element that operates in a horizontal electric field mode such as a VA-IPS mode are switched depending on the alignment direction of the major axes of liquid crystal molecules: a direction substantially perpendicular to a substrate or a direction substantially parallel to the substrate. Thus, when a liquid crystal element that operates in a horizontal electric field mode is used in a reflective liquid crystal display device, the liquid crystal element preferably operates in a VA-IPS mode.

Note that, as described later, a display element other than the light-emitting element 4513 and the liquid crystal element 180 can be used.

In the pixel circuit 438 in the i-th row and the j-th column, one of the source electrode and the drain electrode of the transistor 436 is electrically connected to the wiring SL_j, and the other of the source electrode and the drain electrode of the transistor 436 is electrically connected to the node 435. The gate electrode of the transistor 436 is electrically connected to the wiring GL_i. The transistor 436 has a function of controlling whether to write an image signal to the node 435.

One of the pair of electrodes of the capacitor 433 is electrically connected to a wiring to which a specific potential is supplied (hereinafter, referred to as a capacitor line CL), and the other of the pair of electrodes of the capacitor 433 is electrically connected to the node 435. The other of the pair of electrodes of the liquid crystal element 180 is electrically connected to the node 435. The potential of the capacitor line CL is set in accordance with the specifications of the pixel circuit 438 as appropriate. The capacitor 433 functions as a storage capacitor for storing data written to the node 435.

For example, in the display device including the pixel circuit 438 in FIG. 9B, the pixel circuits 438 are sequentially selected row by row by the scan line driver circuit 102 and/or the scan line driver circuit 103, whereby the transistors 436 are turned on and an image signal is written to the nodes 435.

When the transistors 436 are turned off, the pixel circuits 438 in which the image signal has been written to the nodes 435 are brought into a holding state. This operation is sequentially performed row by row; thus, an image can be displayed on a display region 235.

A transistor with low off-state current is preferably used for the transistor 436. With the use of a transistor with low off-state current for the transistor 436, the potential of the node 435 is stabilized, whereby the display quality of the display device can be improved.

[Display Element]

The display device of one embodiment of the present invention can employ various modes and include various display elements. The display element includes at least one of an electroluminescent (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), a plasma display panel (PDP), an electron emitter, a liquid crystal element, an electrophoretic element, a display element using micro electro mechanical systems (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, display media whose contrast, luminance, reflectivity, transmittance, or the like is changed by an electrical or magnetic effect may be included. Alternatively, quantum dots may be used as the display element.

Note that examples of display devices having EL elements include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including an electrophoretic element include electronic paper. Examples of a display device including quantum dots include a quantum dot display.

In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

This embodiment can be implemented in an appropriate combination with any of the structures described in the other embodiments and the like.

Embodiment 3

In this embodiment, examples of a transistor that can be used for the display device and the like described in the above embodiments will be described with reference to drawings.

The display device 100 of one embodiment of the present invention can be fabricated by using a transistor with any of various structures, such as a bottom-gate transistor, a top-gate transistor, or the like. For example, a planar transistor or a staggered transistor may be used. Therefore, a material for a semiconductor layer or the structure of a transistor can be easily changed depending on the existing production line.

[Bottom-Gate Transistor]

FIG. 10A1 is a cross-sectional view of a transistor 410 that is a channel-protective transistor, which is a type of bottom-gate transistor. In FIG. 10A1, the transistor 410 is formed over a substrate 271. The transistor 410 includes an electrode 246 over the substrate 271 with an insulating layer 272 provided therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 241 over a channel formation region in the semiconductor layer 242. The transistor 410 includes an electrode 244a and an electrode 244b which are partly in contact with the semiconductor layer 242 and over the insulating layer 226. The electrode 244a can function as one of a source electrode and a drain electrode. The electrode 244b can function as the other of the source electrode and the drain electrode. Part of the electrode 244a and part of the electrode 244b are formed over the insulating layer 241.

The insulating layer 241 can function as a channel protective layer. With the insulating layer 241 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. In accordance with one embodiment of the present invention, a transistor with favorable electrical characteristics can be provided.

The transistor 410 includes an insulating layer 228 over the electrode 244a, the electrode 244b, and the insulating layer 241 and further includes an insulating layer 229 over the insulating layer 228.

In the case where a semiconductor such as silicon is used for the semiconductor layer 242, a layer that functions as an n-type semiconductor or a p-type semiconductor is preferably provided between the semiconductor layer 242 and the electrode 244a and between the semiconductor layer 242 and the electrode 244b. The layer that functions as an n-type semiconductor or a p-type semiconductor can function as the source region or the drain region in the transistor.

The insulating layer 229 is preferably formed using a material that can prevent or reduce diffusion of impurities into the transistor from the outside. The formation of the insulating layer 229 may also be omitted.

A transistor 411 shown in FIG. 10A2 is different from the transistor 410 in that an electrode 223 that can function as a back gate electrode is provided over the insulating layer 229. The electrode 223 can be formed using a material and a method similar to those of the electrode 246.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 246 and the electrode 223 can each function as a gate electrode. Thus, the insulating layers 226, 228, and 229 can each function as a gate insulating layer. The electrode 223 may also be provided between the insulating layers 228 and 229.

In the case where one of the electrode 246 and the electrode 223 is simply referred to as a "gate electrode", the other can be referred to as a "back gate electrode". For example, in the transistor 411, in the case where the electrode 223 is referred to as a "gate electrode", the electrode 246 is referred to as a "back gate electrode". In the case where the electrode 223 is used as a "gate electrode", the transistor 411 is a kind of top-gate transistor. Alternatively, one of the electrode 246 and the electrode 223 may be referred to as a "first gate electrode", and the other may be referred to as a "second gate electrode".

By providing the electrode 246 and the electrode 223 with the semiconductor layer 242 provided therebetween and setting the potentials of the electrode 246 and the electrode 223 to be the same, a region of the semiconductor layer 242 through which carriers flow is enlarged in the film thickness direction; thus, the number of transferred carriers is increased. As a result, the on-state current and field-effect mobility of the transistor 411 are increased.

Therefore, the transistor 411 has a comparatively high on-state current for its area. That is, the area of the transistor 411 can be small for a required on-state current. In accordance with one embodiment of the present invention, the area of a transistor can be reduced. Therefore, in accordance with one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the gate electrode and the back gate electrode each have a function of blocking an electric field from the outside, charges of charged particles and the like generated above and below the transistor do not influence the channel formation region of the semiconductor layer. Thus, degradation induced by a stress test (e.g., a negative gate bias temperature (NGBT) stress test where negative voltage is applied to a gate (this stress test is also referred to as NBT or NBTS)) is reduced. In addition, the gate electrode and the back gate electrode can block an electric field generated from the drain electrode so as not to affect the semiconductor layer. Thus, changes in the rising voltage of on-state current due to changes in drain voltage can be suppressed. Note that this effect is significant when a potential is applied to the gate electrode and the back gate electrode.

Before and after a positive gate bias temperature (PGBT) stress test where positive voltage is applied to a gate (this stress test is also referred to as PBT or PBTS), a transistor including a back gate electrode has a smaller change in threshold voltage than a transistor including no back gate.

The BT stress test such as NGBT or PGBT is a kind of accelerated test and can evaluate, in a short time, a change by long-term use (i.e., a change over time) in characteristics of transistors. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

By providing the gate electrode and the back gate electrode and setting the potentials of the gate electrode and the back gate electrode to be the same, the change in threshold voltage is reduced. Accordingly, variation in electrical characteristics among a plurality of transistors is also reduced.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

In accordance with one embodiment of the present invention, a transistor with favorable reliability can be provided. Moreover, a semiconductor device with favorable reliability can be provided.

FIG. 10B1 is a cross-sectional view of a channel-protective transistor 420 that is a type of bottom-gate transistor. The transistor 420 has substantially the same structure as the transistor 410 but is different from the transistor 410 in that the insulating layer 241 covers the semiconductor layer 242. The semiconductor layer 242 is electrically connected to the electrode 244a through an opening formed by selectively removing part of the insulating layer 241 which overlaps with the semiconductor layer 242. The semiconductor layer 242 is electrically connected to the electrode 244b through another opening formed by selectively removing part of the insulating layer 241 which overlaps with the semiconductor layer 242. A region of the insulating layer 241 which overlaps with the channel formation region can function as a channel protective layer.

A transistor 421 shown in FIG. 10B2 is different from the transistor 420 in that the electrode 223 that can function as a back gate electrode is provided over the insulating layer 229.

With the insulating layer 241, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The length between the electrode 244a and the electrode 246 and the length between the electrode 244b and the electrode 246 in the transistors 420 and 421 are larger than those in the transistors 410 and 411. Thus, the parasitic capacitance generated between the electrode 244a and the electrode 246 can be reduced. Moreover, the parasitic capacitance generated between the electrode 244b and the electrode 246 can be reduced. In accordance with one embodiment of the present invention, a transistor with favorable electrical characteristics can be provided.

A transistor 425 illustrated in FIG. 10C1 is a channel-etched transistor that is a type of bottom-gate transistor. In the transistor 425, the electrodes 244a and 244b are formed without providing the insulating layer 241. Thus, part of the semiconductor layer 242 that is exposed at the time forming the electrodes 244a and 244b is etched in some cases. However, since the insulating layer 241 is not provided, the productivity of the transistor can be increased.

A transistor 426 shown in FIG. 10C2 is different from the transistor 425 in that the electrode 223 which can function as a back gate electrode is provided over the insulating layer 229.

[Top-Gate Transistor]

FIG. 11A1 is a cross-sectional view of a transistor 430 that is a type of top-gate transistor. The transistor 430 includes the semiconductor layer 242 over the insulating layer 272, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 11A3). In accordance with one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity 255.

A transistor 431 shown in FIG. 11A2 is different from the transistor 430 in that the electrode 223 and the insulating layer 227 are included. The transistor 431 includes the electrode 223 formed over the insulating layer 272 and the insulating layer 227 formed over the electrode 223. The electrode 223 can function as a back gate electrode. Thus, the insulating layer 227 can function as a gate insulating layer. The insulating layer 227 can be formed using a material and a method similar to those of the insulating layer 226.

Like the transistor 411, the transistor 431 has a high on-state current for its area. That is, the area of the transistor 431 can be small for a required on-state current. In accordance with one embodiment of the present invention, the area of a transistor can be reduced. Therefore, in accordance with one embodiment of the present invention, a semiconductor device having a high degree of integration can be provided.

A transistor 440 shown in FIG. 11B1 is a type of top-gate transistor. The transistor 440 is different from the transistor 430 in that the semiconductor layer 242 is formed after the formation of the electrodes 244a and 244b. A transistor 441 illustrated in FIG. 11B2 is different from the transistor 440 in that the electrode 223 and the insulating layer 227 are included. In the transistors 440 and 441, part of the semiconductor layer 242 is formed over the electrode 244a and another part of the semiconductor layer 242 is formed over the electrode 244b.

Like the transistor 411, the transistor 441 has a high on-state current for its area. That is, the area of the transistor 441 can be small for a required on-state current. In accordance with one embodiment of the present invention, the area of a transistor can be reduced. Therefore, in accordance with one embodiment of the present invention, a semiconductor device having a high degree of integration can be provided.

A transistor 442 shown in FIG. 12A1 is a type of top-gate transistor. The transistor 442 is different from the transistor 430 or 440 in that the electrodes 244a and 244b are formed after the formation of the insulating layer 229. The electrodes 244a and 244b are electrically connected to the semiconductor layer 242 through openings formed in the insulating layers 228 and 229.

Part of the insulating layer 226 that does not overlap with the electrode 246 is removed, and the impurity 255 is introduced into the semiconductor layer 242 using the electrode 246 and the insulating layer 226 that is left as a mask, so that an impurity region can be formed in the semiconductor layer 242 in a self-aligned manner (see FIG. 12A3). The transistor 442 includes a region where the insulating layer 226 extends beyond an end portion of the electrode 246. The semiconductor layer 242 in a region into which the impurity 255 is introduced through the insulating layer 226 has a lower impurity concentration than the semiconductor layer 242 in a region into which the impurity 255 is introduced without through the insulating layer 226. Thus, a lightly doped drain (LDD) region is formed in a region that does not overlap with the electrode 246.

A transistor 443 shown in FIG. 12A2 is different from the transistor 442 in that the electrode 223 is included. The transistor 443 includes the electrode 223 that is formed over the substrate 271 and overlaps with the semiconductor layer 242 with the insulating layer 272 provided therebetween. The electrode 223 can function as a back gate electrode.

As in a transistor 444 shown in FIG. 12B1 and a transistor 445 shown in FIG. 12B2, the insulating layer 226 in a region that does not overlap with the electrode 246 may be completely removed. Alternatively, as in a transistor 446 shown in FIG. 12C1 and a transistor 447 shown in FIG. 12C2, the insulating layer 226 may be left.

In the transistors 442 to 447, after the formation of the electrode 246, the impurity 255 is introduced into the semiconductor layer 242 using the electrode 246 as a mask, so that an impurity region can be formed in the semiconductor layer 242 in a self-aligned manner. In accordance with one embodiment of the present invention, a transistor with favorable electrical characteristics can be provided. Furthermore, in accordance with one embodiment of the present invention, a semiconductor device having a high degree of integration can be provided.

[Substrate]

There is no great limitation on a material used for the substrate. The material is determined according to the purpose in consideration of whether it has a light-transmitting property, heat resistance high enough to withstand heat treatment, or the like. For example, a glass substrate of barium borosilicate glass, aluminosilicate glass, or the like, a ceramic substrate, a quartz substrate, a sapphire substrate, or the like can be used. Alternatively, a semiconductor substrate, a flexible substrate, an attachment film, a base film, or the like may be used.

As the semiconductor substrate, a semiconductor substrate of silicon, germanium, or the like or a compound semiconductor substrate of silicon carbide, silicon germanium, gallium arsenide, indium phosphide, zinc oxide, or gallium oxide, or the like is used, for example. As the semiconductor substrate, a single-crystal semiconductor or a polycrystalline semiconductor may be used.

As the substrate, a large-sized glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. With the increase in area of glass substrates, a larger number of display devices can be produced from one glass substrate, which can reduce production cost.

To increase the flexibility of the display device 100, a flexible substrate, an attachment film, a base film, or the like may be used as the substrate.

Examples of materials that can be used for the flexible substrate, the attachment film, the base film, and the like include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber.

When any of the above-described materials is used for the substrate, a lightweight display device can be provided. Furthermore, when any of the above-described materials is used for the substrate, a shock-resistant display device can be provided. Moreover, when any of the above-described materials is used for the substrate, a display device that is less likely to be broken can be provided.

The flexible substrate used as the substrate preferably has a lower coefficient of linear expansion because deformation due to an environment is suppressed. The flexible substrate used as the substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. In particular, aramid is preferably used for the flexible substrate because of its low coefficient of linear expansion.

[Conductive Layer]

As conductive materials for the gate, the source, and the drain of the transistor, and the conductive layer such as a wiring or an electrode included in the display device, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements as a component; an alloy containing a combination of the above metal elements; or the like can be used. Alternatively, a semiconductor typified by polycrystalline silicon including an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

The conductive layer can be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. In addition, a stacked-layer structure formed using a conductive material containing oxygen, a conductive material containing nitrogen, and a material containing any of the above metal elements can be used.

The conductive material that can be used for the conductive layer may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, an aluminum alloy containing one or more elements selected from titanium, tantalum, tungsten, molybdenum, chromium, neodymium, and scandium may be used as the conductive material.

[Insulating Layer]

The insulating layers can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layers 272 and 229 be formed using an insulating material that is relatively impermeable to impurities. For example, a single layer or a stack of layers of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Examples of an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 272, impurity diffusion from the substrate 271 side can be suppressed, and the reliability of the transistor can be improved. When the insulating material that is relatively impermeable to impurities is used for the insulating layer 229, impurity diffusion from layers above the insulating layer 229 can be suppressed, and the reliability of the transistor can be improved.

As the insulating layer, an insulating layer that can function as a planarization layer may be used. The insulating layer that can function as a planarization layer can be formed using an organic material having heat resistance, such as a polyimide, an acrylic resin, a benzocyclobutene resin, a polyamide, or an epoxy resin. Other than such organic materials, it is also possible to use a low-dielectric constant material (a low-k material), a siloxane resin, PSG (phosphosilicate glass), BPSG (borophosphosilicate glass), or the like. Note that a plurality of insulating layers formed of these materials may be stacked.

Note that the siloxane resin corresponds to a resin including a Si—O—Si bond formed using a siloxane-containing material as a starting material. The siloxane resin may include as a substituent an organic group (e.g., an alkyl group or an aryl group) or a fluoro group. In addition, the organic group may include a fluoro group.

A surface of the insulating layer or the like may be subjected to CMP treatment. By the CMP treatment, unevenness of the surface can be reduced, and coverage with an insulating layer or a conductive layer formed later can be increased.

[Semiconductor Layer]

As a semiconductor material used for the semiconductor layer of the transistor, an amorphous semiconductor or a semiconductor having crystallinity (a microcrystalline semiconductor, a polycrystalline semiconductor, a single crystal semiconductor, or a semiconductor partly including crystal regions) may be used.

For example, silicon or germanium can be used as a semiconductor material used for the semiconductor layer of the transistor. Furthermore, a compound semiconductor such as a silicon carbide, a gallium arsenide, a metal oxide, or a nitride semiconductor, an organic semiconductor, or the like can be used.

For example, amorphous silicon can be used as a semiconductor material used for the transistor. In particular, amorphous silicon is easily mass-produced and provided over a large-sized substrate. Note that in general, amorphous silicon used for a transistor contains a large amount of hydrogen; hence, amorphous silicon containing a large amount of hydrogen is referred to as hydrogenated amorphous silicon or a-Si:H in some cases. Moreover, amorphous silicon can be formed at temperatures lower than temperatures at which polycrystalline silicon is formed, and thus, the highest temperature in the manufacturing process can be lowered. Accordingly, low heat-resistance materials can be used for a substrate, a conductive layer, an insulating layer, and the like.

Furthermore, silicon with crystallinity such as microcrystalline silicon, polycrystalline silicon, or a single crystal silicon can be used as a semiconductor material used for the transistor. In particular, polycrystalline silicon can be formed at a lower temperature than a temperature at which single crystal silicon is formed and has higher field-effect mobility and higher reliability than those of amorphous silicon.

Furthermore, an oxide semiconductor, which is a kind of a metal oxide, can be used as a semiconductor material used for the transistor. As a typical example, an oxide semiconductor containing indium can be given. An oxide semiconductor enables higher field-effect mobility and higher reliability than those of amorphous silicon. Moreover, an oxide semiconductor is easily mass-produced and provided over a large-sized substrate.

An oxide semiconductor, which is a kind of a metal oxide, has a wider bandgap and lower carrier density than those of silicon; thus, an oxide semiconductor is preferably used for the semiconductor layer of the transistor. The use of an oxide semiconductor for the semiconductor layer of the transistor is preferable in terms of reducing current flowing between a source and a drain in an off state of the transistor.

An oxide semiconductor, which is a kind of a metal oxide, preferably has an energy gap of 2 eV or more, further preferably 2.5 eV or more, still further preferably 3 eV or more. The use of such an oxide semiconductor having a wide energy gap leads to a reduction in off-state current of the transistor.

An oxide semiconductor, which is a kind of a metal oxide, preferably includes, for example, a material represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to indium, zinc, and M.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Note that a metal oxide that can be used for the semiconductor layer of the transistor is described in detail in other embodiments.

[Methods for Forming Layers]

Note that insulating layers, semiconductor layers, conductive layers for forming electrodes and wirings, and the like included in the display device can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

The insulating layers, the semiconductor layers, the conductive layers for forming the electrodes and the wirings, and the like included in the display device may be formed by a method such as spin coating, dipping, spray coating, ink-jetting, dispensing, screen printing, or offset printing, or with a slit coater, a roll coater, a curtain coater, or a knife coater.

In the case of a PECVD method, a high quality film can be obtained at relatively low temperature. By using a deposition method that does not use plasma for deposition, such as the MOCVD method, the ALD method, or the thermal CVD method, damage is not easily caused on a surface on which the film is deposited. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a deposition method without using plasma, and thus the yield of a semiconductor device can be increased. In addition, since plasma damage does not occur in the deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

The layers (thin films) included in the display device can be processed by a photolithography method or the like. Alternatively, island-shaped layers may be formed by a film formation method using a blocking mask. Alternatively, the layers may be processed by a nanoimprinting method, a sandblasting method, a lift-off method, or the like. Examples of the photolithography method include a method in which a resist mask is formed over a layer (thin film) to be processed, part of the layer (thin film) is selectively removed by using the resist mask as a mask, and the resist mask is removed, and a method in which a photosensitive layer is formed and exposed to light and developed to be processed into a desired shape.

In the case of using light in the photolithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For the removal (etching) of the layers (thin films), a dry etching method, a wet etching method, a sandblast method, or the like can be used. Alternatively, these etching methods may be employed in combination.

This embodiment can be implemented in an appropriate combination with any of the structures described in the other embodiments and the like.

Embodiment 4

In this embodiment, a metal oxide that can be used for the semiconductor layer of the transistor is described.
<Composition of Metal Oxide>
Described in this section is the composition of a cloud-aligned composite oxide semiconductor (CAC-OS) or a cloud-aligned composite (CAC) metal oxide, which is one embodiment of a metal oxide that can be used for the semiconductor device, e.g., the transistor, disclosed in one embodiment of the present invention.

Note that in this specification and the like, CAC or c-axis-aligned crystal (CAAC) might be stated. In this case, CAC refers to an example of a function or a material composition, and CAAC refers to an example of a structure.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

Thus, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be connected in a cloud-like manner with their boundaries blurred, in some cases.

Note that in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, a CAC-OS or a CAC metal oxide can be called a matrix composite or a metal matrix composite.
<Structure of Metal Oxide>
Described in this section is a structure of a metal oxide that can be used for the semiconductor device, e.g., the transistor, disclosed in one embodiment of the present invention.

Metal oxides are classified into a metal oxide made of a single crystal material and a metal oxide made of a non-single-crystal material. A single crystal material has a single crystal structure. A non-single-crystal material has one or more of an amorphous structure, a microcrystalline structure, and a polycrystalline structure.

As a non-single-crystal material, a semi-crystalline material is given. A semi-crystalline material has a structure intermediate between a single crystal structure and an amorphous structure.

In the structure of a single crystal of a metal oxide, oxygen polyhedrons each having a metal atom at the center are connected to each other with particular regularity. Specifically, an $InGaZnO_4$ single crystal has a layered crystalline structure in which oxygen octahedrons each having an In atom at the center and oxygen trigonal bipyramids each having a Ga atom or a Zn atom at the center are connected to each other with particular regularity.

In the structure of a semi-crystalline material, a plurality of oxygen polyhedrons each having a metal atom at the center is included and the polyhedrons are connected to each other without particular regularity. A polyhedron included in a semi-crystalline material is significantly broken compared with a polyhedron included in a single crystal material and is not observed in a single crystal. Note that in some cases, part of a semi-crystalline material includes a polyhedron included in a single crystal structure, a region in which polyhedrons included in a single crystal structure are connected to each other with regularity, or the like.

A structure of a semi-crystalline material in which polyhedrons are connected to each other without particular regularity is more stable than a structure of a so-called amorphous material.

In the case where metal oxides are oxide semiconductors, for example, metal oxides are classified into a single crystal oxide semiconductor and a non-single-crystal oxide semiconductor. Examples of the non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

As an example of a semi-crystalline oxide semiconductor, an oxide semiconductor having a CAAC structure and a CAC composition (hereinafter also referred to as CAAC/CAC) is given.

A CAAC-OS is an oxide semiconductor having a CAAC structure having c-axis alignment, its nanocrystals are connected to each other in the a-b plane direction, and the crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the elements M of the (M,Zn) layer are partly replaced with indium, the layer can also be referred to as an (In,M,Zn) layer. Also, when indium in the In layer is partly replaced with the element M, the layer can be referred to as an (In,M) layer.

The CAAC-OS is an oxide semiconductor with high crystallinity. In the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, a CAAC-OS is physically stable. Therefore, a CAAC-OS is resistant to heat and has high reliability.

An nc-OS is an oxide semiconductor having a structure in which a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS is an oxide semiconductor having a structure intermediate between those of the nc-OS and the amorphous oxide semiconductor. The a-like OS includes a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

This embodiment can be implemented in an appropriate combination with any of the structures described in the other embodiments and the like.

Embodiment 5

In this embodiment, examples of a transistor that can be used for the display device and the like described in the above embodiments will be described with reference to drawings.

<Structure Example 1 of Transistor>

Figure 13A:
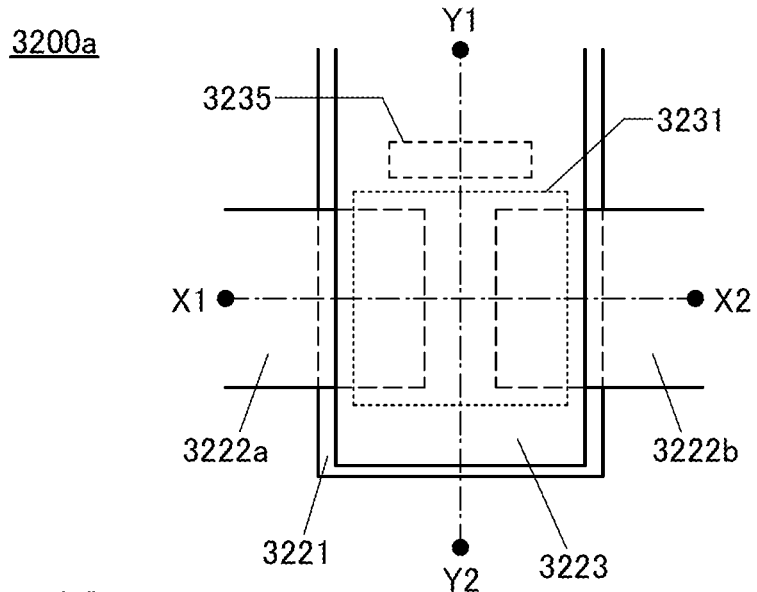
FIGS. 13A to 13C are a top view and cross-sectional views showing an example of a transistor used in a display device.
Figure 13B:
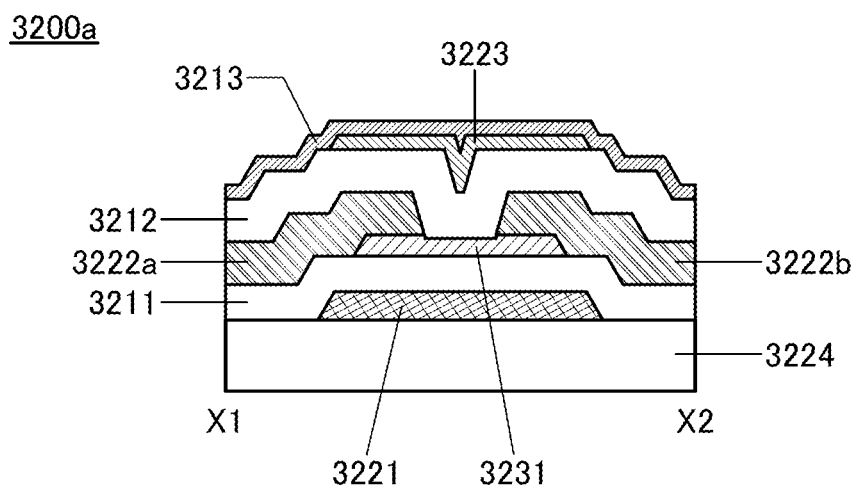
Figure 13C:
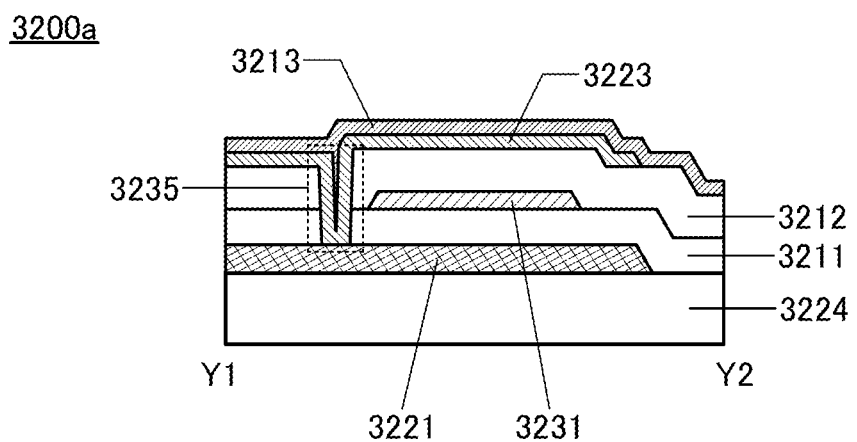

As a structure example of a transistor, a transistor 3200a is described with reference to FIGS. 13A to 13C. FIG. 13A is a top view of the transistor 3200a. FIG. 13B is a cross-sectional view taken along the dashed-dotted line X1-X2 in FIG. 13A, and FIG. 13C is a cross-sectional view taken along the dashed-dotted line Y1-Y2 in FIG. 13A. Note that in FIG. 13A, some components of the transistor 3200a (e.g., an insulating layer serving as a gate insulating layer) are not shown to avoid complexity. Note that hereinafter, the direction of the dashed-dotted line X1-X2 may be called the channel length direction, and the direction of the dashed-dotted line Y1-Y2 may be called the channel width direction. As in FIG. 13A, some components are not illustrated in some cases in top views of transistors described below.

The transistor 3200a includes a conductive layer 3221 over an insulating layer 3224; an insulating layer 3211 over the insulating layer 3224 and the conductive layer 3221; a metal oxide layer 3231 over the insulating layer 3211; a conductive layer 3222a over the metal oxide layer 3231; a conductive layer 3222b over the metal oxide layer 3231; an insulating layer 3212 over the metal oxide layer 3231, the conductive layer 3222a, and the conductive layer 3222b; a conductive layer 3223 over the insulating layer 3212; and an insulating layer 3213 over the insulating layer 3212 and the conductive layer 3223.

The insulating layers 3211 and 3212 have an opening 3235. The conductive layer 3223 is electrically connected to the conductive layer 3221 in the opening 3235.

The insulating layer 3211 serves as a first gate insulating layer of the transistor 3200a. The insulating layer 3212 serves as a second gate insulating layer of the transistor 3200a. The insulating layer 3213 serves as a protective insulating layer of the transistor 3200a. The conductive layer 3221 serves as a first gate of the transistor 3200a. The conductive layer 3222a serves as one of a source and a drain of the transistor 3200a and the conductive layer 3222b serves as the other of the source and the drain. The conductive layer 3223 serves as a second gate of the transistor 3200a.

Note that the transistor 3200a is a channel-etched transistor, and has a dual-gate structure.

The transistor 3200a without the conductive layer 3223 is also available. In that case, the transistor 3200a is a channel-etched transistor, and has a bottom-gate structure.

As shown in FIGS. 13B and 13C, the metal oxide layer 3231 faces the conductive layer 3221 and the conductive layer 3223, and is between the conductive layers serving as the two gates. The length of the conductive layer 3223 in the channel length direction is longer than the length of the metal oxide layer 3231 in the channel length direction. The length of the conductive layer 3223 in the channel width direction is longer than the length of the metal oxide layer 3231 in the channel width direction. The whole metal oxide layer 3231 is covered with the conductive layer 3223 with the insulating layer 3212 positioned therebetween.

In other words, the conductive layers 3221 and 3223 are connected to each other in the opening 3235 provided in the insulating layers 3211 and 3212, and have a region located outside a side end portion of the metal oxide layer 3231.

With this structure, the metal oxide layer 3231 included in the transistor 3200a can be electrically surrounded by electric fields of the conductive layers 3221 and 3223. A device structure of a transistor in which electric fields of a first gate and a second gate electrically surround a metal oxide layer where a channel formation region is formed, like in the transistor 3200a, can be referred to as a surrounded channel (S-channel) structure.

Since the transistor 3200a has the S-channel structure, an electric field for inducing a channel can be effectively applied to the metal oxide layer 3231 by the conductive layer 3221 serving as the first gate; therefore, the current drive capability of the transistor 3200a can be improved and high on-state current characteristics can be obtained. Since the on-state current can be increased, it is possible to reduce the size of the transistor 3200a. In addition, since the transistor 3200a has a structure in which the metal oxide layer 3231 is surrounded by the conductive layer 3221 serving as the first gate and the conductive layer 3223 serving as the second gate, the mechanical strength of the transistor 3200a can be increased.

For example, it is preferable that the metal oxide layer 3231 contain In, M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn.

The metal oxide layer 3231 preferably includes a region in which the atomic proportion of In is larger than the atomic proportion of M. For example, the atomic ratio of In to M and Zn in the metal oxide layer 3231 is preferably In:M:Zn=4:2:3 or in the neighborhood thereof. As for the range expressed by the term "neighborhood" here, when In is 4, M ranges from 1.5 to 2.5 and Zn ranges from 2 to 4. Alternatively, the atomic ratio of In to M and Zn in the metal oxide layer 3231 is preferably In:M:Zn=5:1:6 or in the neighborhood thereof.

The metal oxide layer 3231 is preferably a CAC-OS or a CAC metal oxide. When the metal oxide layer 3231 is a CAC-OS or a CAC metal oxide and has a region in which the atomic proportion of In is higher than the atomic proportion of M, the transistor 3200a can have high field-effect mobility.

Since the transistor 3200a having the S-channel structure has high field-effect mobility and high driving capability, the use of the transistor 3200a in the driver circuit, a typical example of which is a gate driver that generates a gate signal, allows the display device to have a narrow bezel. The use of the transistor 3200a in a source driver (particularly in a demultiplexer connected to an output terminal of a shift register included in the source driver) included in the display device can reduce the number of wirings connected to the display device.

Furthermore, the transistor 3200a is a channel-etched transistor and thus can be fabricated through a smaller number of steps than a transistor formed using low-temperature polysilicon. In addition, unlike the transistor formed using low-temperature polysilicon, the transistor 3200a including the metal oxide layer in the channel does not need a laser crystallization step. Accordingly, the manufacturing cost can be reduced even in the case of a display device formed using a large substrate. Transistors having high field-effect mobility like the transistor 3200a are preferably used in a driver circuit and a display portion of a large display device having high resolution such as ultra high definition (4K resolution, 4K2K, or 4K) or super high definition (8K resolution, 8K4K, or 8K), in which case writing can be performed in a short time and display defects can be reduced.

The insulating layers 3211 and 3212 in contact with the metal oxide layer 3231 are preferably oxide insulating films, and further preferably includes a region containing oxygen in excess of the stoichiometric composition (oxygen-excess region). In other words, the insulating layers 3211 and 3212 are insulating films from which oxygen can be released. In order to provide the oxygen-excess region in the insulating layers 3211 and 3212, the insulating layers 3211 and 3212 are formed in an oxygen atmosphere, or the deposited insulating layers 3211 and 3212 are subjected to heat treatment in an oxygen atmosphere, for example.

An oxide semiconductor, which is a kind of a metal oxide, can be used for the metal oxide layer 3231.

In the case where the metal oxide layer 3231 includes an In-M-Zn oxide, it is preferable that the atomic ratio of metal elements of a sputtering target used for forming the In-M-Zn oxide satisfy In>M. The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, or In:M:Zn=5:2:5.

In the case where the metal oxide layer 3231 is formed using an In-M-Zn oxide, it is preferable to use a target including a polycrystalline In-M-Zn oxide as the sputtering target. The use of the target including a polycrystalline In-M-Zn oxide facilitates formation of the metal oxide layer 3231 having crystallinity. Note that the atomic ratio of metal elements in the formed metal oxide layer 3231 varies from the above atomic ratios of metal elements of the sputtering targets in a range of ±40%. For example, when a sputtering target with an atomic ratio of In:Ga:Zn=4:2:4.1 is used for forming the metal oxide layer 3231, the atomic ratio of In to Ga and Zn in the formed metal oxide layer 3231 may be 4:2:3 or in the neighborhood of 4:2:3.

The energy gap of the metal oxide layer 3231 is 2 eV or more, preferably 2.5 eV or more. The use of such an oxide semiconductor having a wide energy gap leads to a reduction in off-state current of a transistor.

Furthermore, the metal oxide layer 3231 preferably has a non-single-crystal structure. The non-single-crystal structure includes a c-axis-aligned crystalline (CAAC) structure, a polycrystalline structure, a microcrystalline structure, or an amorphous structure, for example Among the non-single-crystal structures, the amorphous structure has the highest density of defect states, whereas the CAAC structure has the lowest density of defect states.

The metal oxide layer 3231 formed with a metal oxide film with low impurity concentration and low density of defect states can give the transistor excellent electrical characteristics. Thus, the use of such a metal oxide film is preferable. Here, the state in which impurity concentration is low and density of defect states is low (the number of oxygen vacancies is small) is referred to as "highly purified intrinsic" or "substantially highly purified intrinsic". Note that impurities in the metal oxide film are typically water, hydrogen, and the like. In this specification and the like, reducing or removing water and hydrogen from the metal oxide film is referred to as dehydration or dehydrogenation in some cases. Moreover, adding oxygen to a metal oxide film or an oxide insulating film is referred to as oxygen addition in some cases, and a state in which oxygen in excess of the stoichiometric composition is contained due to the oxygen addition is referred to as an oxygen-excess state in some cases.

A highly purified intrinsic or substantially highly purified intrinsic metal oxide film has few carrier generation sources, and thus has a low carrier density. Thus, a transistor in which a channel formation region is formed in the metal oxide film rarely has a negative threshold voltage (is rarely normally on). The highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width of $1 \times 10^6$ μm and a channel length L of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

The insulating layer 3213 includes one or both of hydrogen and nitrogen. Alternatively, the insulating layer 3213 includes nitrogen and silicon. The insulating layer 3213 has a function of blocking oxygen, hydrogen, water, alkali metal, alkaline earth metal, or the like. The insulating layer 3213 can prevent outward diffusion of oxygen from the metal oxide layer 3231, outward diffusion of oxygen from the insulating layer 3212, and entry of hydrogen, water, or the like into the metal oxide layer 3231 from the outside.

The insulating layer 3213 can be a nitride insulating film, for example. The nitride insulating film is formed using silicon nitride, silicon nitride oxide, aluminum nitride, aluminum nitride oxide, or the like.

<Structure Example 2 of Transistor>

Figure 14A:
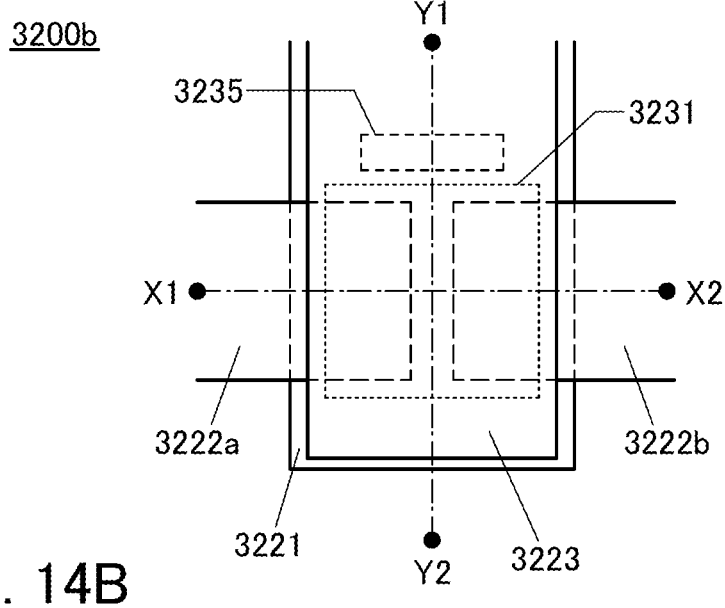
FIGS. 14A to 14C are a top view and cross-sectional views showing an example of a transistor used in a display device.
Figure 14B:
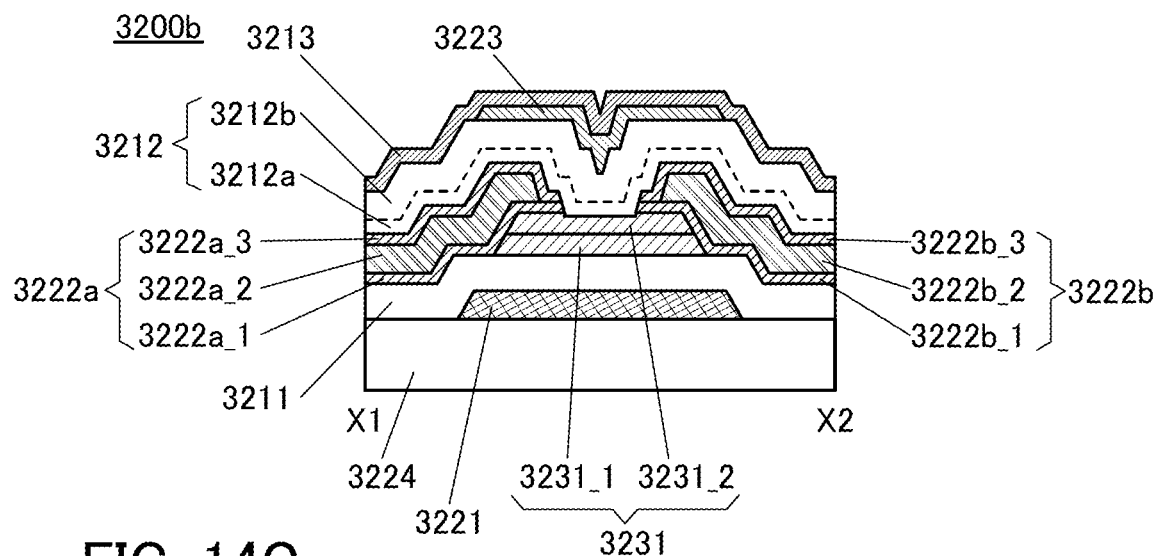
Figure 14C:
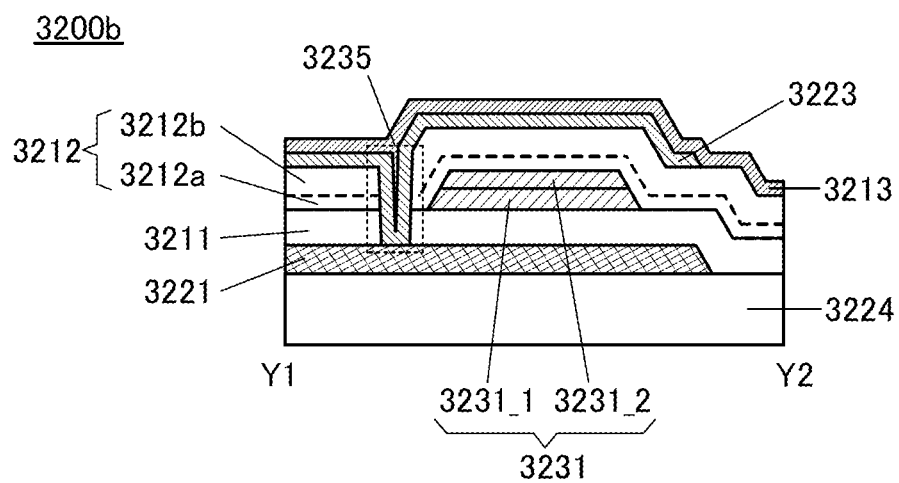

As a structure example of a transistor, a transistor 3200b is described with reference to FIGS. 14A to 14C. FIG. 14A is a top view of the transistor 3200b. FIG. 14B is a cross-sectional view taken along the dashed-dotted line X1-X2 in FIG. 14A, and FIG. 14C is a cross-sectional view taken along the dashed-dotted line Y1-Y2 in FIG. 14A.

The transistor 3200b is different from the transistor 3200a in that the metal oxide layer 3231, the conductive layer 3222a, the conductive layer 3222b, and the insulating layer 3212 each have a stacked-layer structure.

The insulating layer 3212 includes an insulating layer 3212a over the metal oxide layer 3231 and the conductive layers 3222a and 3222b, and an insulating layer 3212b over the insulating layer 3212a. The insulating layer 3212 has a function of supplying oxygen to the metal oxide layer 3231. That is, the insulating layer 3212 contains oxygen. The insulating layer 3212a is an insulating layer that allows oxygen to pass therethrough. Note that the insulating layer 3212a serves also as a film that relieves damage to the metal oxide layer 3231 at the time of forming the insulating layer 3212b.

A silicon oxide, a silicon oxynitride, or the like with a thickness greater than or equal to 5 nm and less than or equal to 150 nm, preferably greater than or equal to 5 nm and less than or equal to 50 nm can be used for the insulating layer 3212a.

Furthermore, it is preferable that the number of defects in the insulating layer 3212a be small and typically, the spin density of a signal that appears at g=2.001 due to a dangling bond of silicon be lower than or equal to $3 \times 10^{17}$ spins/cm$^3$ by ESR measurement. This is because if the density of defects in the insulating layer 3212a is high, oxygen is bonded to the defects and the property of transmitting oxygen of the insulating layer 3212a is lowered.

Note that not all oxygen that has entered the insulating layer 3212a from the outside moves to the outside of the insulating layer 3212a but some oxygen remains in the insulating layer 3212a. In some cases, movement of oxygen occurs in the insulating layer 3212a in such a manner that oxygen enters the insulating layer 3212a and oxygen contained in the insulating layer 3212a moves to the outside of the insulating layer 3212a. When an oxide insulating layer that can transmit oxygen is formed as the insulating layer 3212a, oxygen released from the insulating layer 3212b provided over the insulating layer 3212a can be moved to the metal oxide layer 3231 through the insulating layer 3212a.

Note that the insulating layer 3212a can be formed using an oxide insulating layer having a low density of states due to nitrogen oxide. Note that the density of states due to nitrogen oxide can be formed between the valence band maximum (Ev_os) and the conduction band minimum (Ec_os) of the metal oxide film. A silicon oxynitride film that releases a small amount of nitrogen oxide, an aluminum oxynitride film that releases a small amount of nitrogen oxide, or the like can be used as the above oxide insulating layer.

Note that a silicon oxynitride film that releases a small amount of nitrogen oxide is a film of which the amount of released ammonia is larger than the amount of released nitrogen oxide in thermal desorption spectroscopy (TDS) analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

A nitrogen oxide (NO$_x$; x is greater than 0 and less than or equal to 2, preferably greater than or equal to 1 and less than or equal to 2), typically NO$_2$ or NO, forms levels in the insulating layer 3212a, for example. The level is positioned in the energy gap of the metal oxide layer 3231. Therefore, when nitrogen oxide is diffused to the interface between the insulating layer 3212a and the metal oxide layer 3231, an electron is in some cases trapped by the level on the insulating layer 3212a side. As a result, the trapped electron remains in the vicinity of the interface between the insulating layer 3212a and the metal oxide layer 3231; thus, the threshold voltage of the transistor is shifted in the positive direction.

A nitrogen oxide reacts with ammonia and oxygen in heat treatment. Since a nitrogen oxide contained in the insulating layer 3212a reacts with ammonia contained in the insulating layer 3212b in heat treatment, a nitrogen oxide contained in the insulating layer 3212a is reduced. Therefore, an electron is hardly trapped at the interface between the insulating layer 3212a and the metal oxide layer 3231.

By using the above oxide insulating layer for the insulating layer 3212a, a shift in the threshold voltage of the transistor can be reduced, which leads to reduced fluctuations in the electrical characteristics of the transistor.

The concentration of nitrogen of the above oxide insulating layer measured by SIMS is lower than or equal to $6 \times 10^{20}$ atoms/cm$^3$.

The above oxide insulating layer is formed by a PECVD method at a substrate temperature higher than or equal to 220° C. and lower than or equal to 350° C. using silane and dinitrogen monoxide, whereby a dense and hard film can be formed.

The insulating layer 3212b is an oxide insulating layer that contains oxygen at a higher proportion than the stoichiometric composition. Part of oxygen is released from the above oxide insulating layer by heating. The amount of oxygen released from the oxide insulating layer in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used for the insulating layer 3212b.

It is preferable that the amount of defects in the insulating layer 3212b be small and typically, the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating layer 3212b is provided more apart from the metal oxide layer 3231 than the insulating layer 3212a is; thus, the insulating layer 3212b may have higher density of defects than the insulating layer 3212a.

Furthermore, the insulating layer 3212 can include insulating layers including the same kind of material; thus, a boundary between the insulating layer 3212a and the insulating layer 3212b cannot be clearly observed in some cases. Thus, in this embodiment, the boundary between the insulating layer 3212a and the insulating layer 3212b is shown by a dashed line. Although a two-layer structure including the insulating layers 3212a and 3212b is described in this embodiment, this embodiment is not limited to this. For example, a single-layer structure including only the insulating layer 3212a or a stacked-layer structure including three or more layers may be employed.

The metal oxide layer 3231 in the transistor 3200b includes a metal oxide layer 3231_1 over the insulating layer 3211 and a metal oxide layer 3231_2 over the metal oxide layer 3231_1. The metal oxide layers 3231_1 and 3231_2 contain the same kind of element. For example, it is preferable that the metal oxide layers 3231_1 and 3231_2 each independently contain the same element as the element in the metal oxide layer 3231 that is described above.

Each of the metal oxide layers 3231_1 and 3231_2 preferably contains a region where the atomic proportion of In is higher than the atomic proportion of M. For example, the atomic ratio of In to M and Zn in each of the metal oxide layers 3231_1 and 3231_2 is preferably In:M:Zn=4:2:3 or in the neighborhood thereof. As for the range expressed by the term "neighborhood" here, when In is 4, M ranges from 1.5 to 2.5 and Zn ranges from 2 to 4. Alternatively, the atomic ratio of In to M and Zn in each of the metal oxide layers 3231_1 and 3231_2 is preferably In:M:Zn=5:1:6 or in the neighborhood thereof. The metal oxide layers 3231_1 and 3231_2 having substantially the same composition as described above can be formed using the same sputtering target; thus, the manufacturing cost can be reduced. When the same sputtering target is used, the metal oxide layers 3231_1 and 3231_2 can be formed successively in the same vacuum chamber. This can suppress entry of impurities into the interface between the metal oxide layers 3231_1 and 3231_2.

Here, the metal oxide layer 3231_1 may include a region whose crystallinity is lower than that of the metal oxide layer 3231_2. Note that the crystallinity of the metal oxide layers 3231_1 and 3231_2 can be determined by analysis by X-ray diffraction (XRD) or with a transmission electron microscope (TEM), for example.

The region with low crystallinity in the metal oxide layer 3231_1 serves as a diffusion path of excess oxygen, through which excess oxygen can be diffused into the metal oxide layer 3231_2 having higher crystallinity than the metal oxide layer 3231_1. When a stacked-layer structure including the metal oxide layers having different crystal structures is employed and the region with low crystallinity is used as a diffusion path of excess oxygen as described above, the transistor can be highly reliable.

The metal oxide layer 3231_2 having a region with higher crystallinity than the metal oxide layer 3231_1 can prevent impurities from entering the metal oxide layer 3231. In particular, the increased crystallinity of the metal oxide layer 3231_2 can reduce damage at the time of processing into the conductive layers 3222a and 3222b. The surface of the metal oxide layer 3231, i.e., the surface of the metal oxide layer 3231_2 is exposed to an etchant or an etching gas at the time of processing into the conductive layers 3222a and 3222b. However, when the metal oxide layer 3231_2 has a region with high crystallinity, the metal oxide layer 3231_2 has higher etching resistance than the metal oxide layer 3231_1. Thus, the metal oxide layer 3231_2 serves as an etching stopper.

By including a region having lower crystallinity than the metal oxide layer 3231_2, the metal oxide layer 3231_1 sometimes has a high carrier density.

When the metal oxide layer 3231_1 has a high carrier density, the Fermi level is sometimes high relative to the conduction band of the metal oxide layer 3231_1. This lowers the conduction band minimum of the metal oxide layer 3231_1, so that the energy difference between the conduction band minimum of the metal oxide layer 3231_1 and the trap level, which might be formed in a gate insulating film (here, the insulating layer 3211), is increased in some cases. The increase of the energy difference can reduce trap of charges in the gate insulating film and reduce variation in the threshold voltage of the transistor, in some cases. In addition, when the metal oxide layer 3231_1 has a high carrier density, the metal oxide layer 3231 can have high field-effect mobility.

Although the metal oxide layer 3231 in the transistor 3200b has a stacked-layer structure including two layers in this example, the structure is not limited thereto, and the metal oxide layer 3231 may have a stacked-layer structure including three or more layers.

The conductive layer 3222a in the transistor 3200b includes a conductive layer 3222a_1, a conductive layer 3222a_2 over the conductive layer 3222a_1, and a conductive layer 3222a_3 over the conductive layer 3222a_2. The conductive layer 3222b in the transistor 3200b includes a conductive layer 3222b_1, a conductive layer 3222b_2 over the conductive layer 3222b_1, and a conductive layer 3222b_3 over the conductive layer 3222b_2.

For example, it is preferable that the conductive layers 3222a_1, 3222b_1, 3222a_3, and 3222b_3 contain one or more elements selected from titanium, tungsten, tantalum, molybdenum, indium, gallium, tin, and zinc. Furthermore, it is preferable that the conductive layers $3222a\_2$ and $3222b\_2$ contain one or more elements selected from copper, aluminum, and silver.

Specifically, the conductive layers $3222a\_1$, $3222b\_1$, $3222a\_3$, and $3222b\_3$ can contain an In—Sn oxide or an In—Zn oxide and the conductive layers $3222a\_2$ and $3222b\_2$ can contain copper.

An end portion of the conductive layer $3222a\_1$ has a region located outside an end portion of the conductive layer $3222a\_2$. The conductive layer $3222a\_3$ covers a top surface and a side surface of the conductive layer $3222a\_2$ and has a region that is in contact with the conductive layer $3222a\_1$. An end portion of the conductive layer $3222b\_1$ has a region located outside an end portion of the conductive layer $3222b\_2$. The conductive layer $3222b\_3$ covers a top surface and a side surface of the conductive layer $3222b\_2$ and has a region that is in contact with the conductive layer $3222b\_1$.

The above structure is preferred because the structure can reduce the wiring resistance of the conductive layers $3222a$ and $3222b$ and inhibit diffusion of copper to the metal oxide layer 3231.

<Structure Example 3 of Transistor>

Figure 15A:
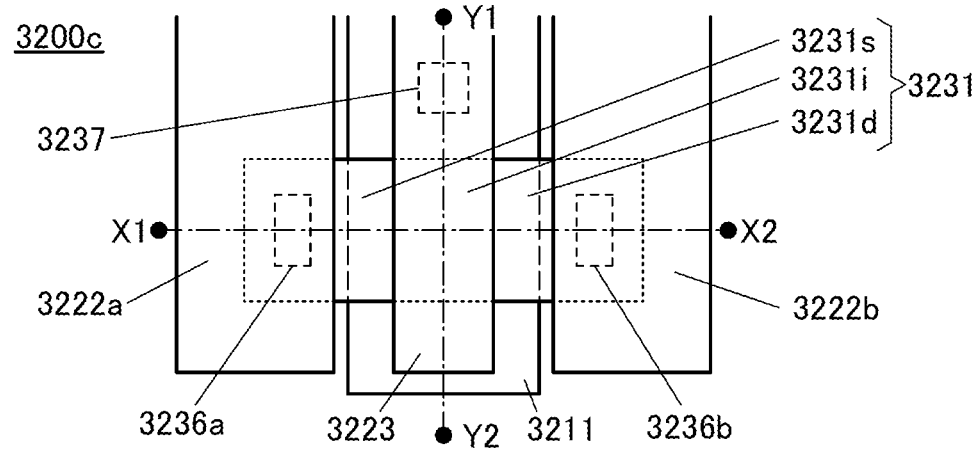
FIGS. 15A to 15C are a top view and cross-sectional views showing an example of a transistor used in a display device.
Figure 15B:
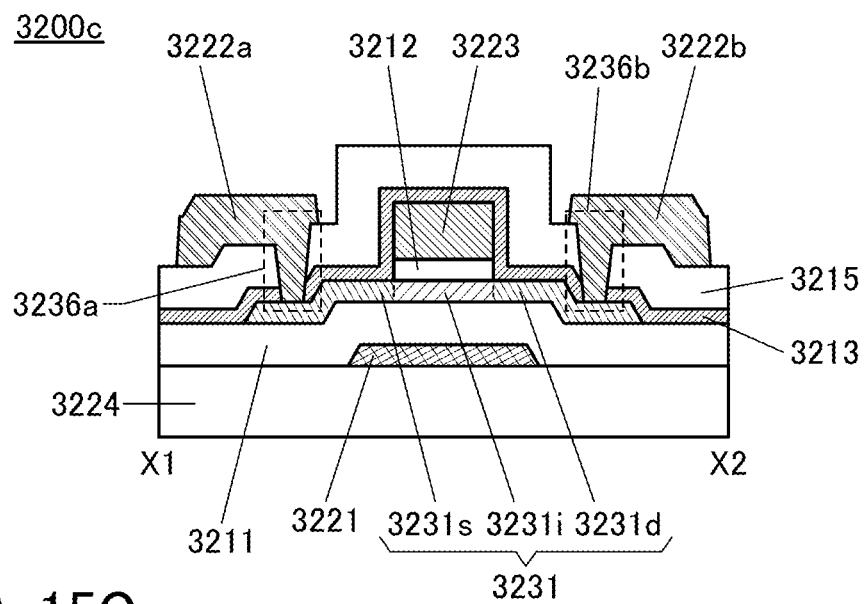

As a structure example of a transistor, a transistor $3200c$ is described with reference to FIGS. 15A to 15C. FIG. 15A is a top view of the transistor $3200c$. FIG. 15B is a cross-sectional view taken along the dashed-dotted line X1-X2 in FIG. 15A, and FIG. 15C is a cross-sectional view taken along the dashed-dotted line Y1-Y2 in FIG. 15A.

Figure 15C:
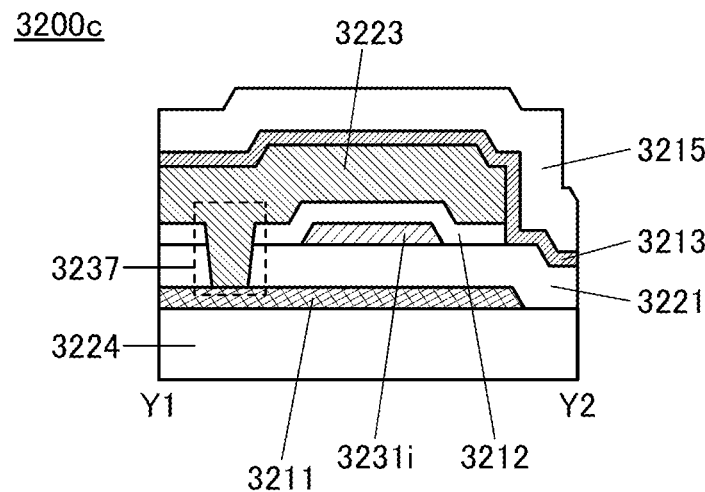

The transistor $3200c$ illustrated in FIGS. 15A to 15C includes the conductive layer 3221 over the insulating layer 3224; the insulating layer 3211 over the conductive layer 3221; the metal oxide layer 3231 over the insulating layer 3211; the insulating layer 3212 over the metal oxide layer 3231; the conductive layer 3223 over the insulating layer 3212; and the insulating layer 3213 over the insulating layer 3211, the metal oxide layer 3231, and the conductive layer 3223. The metal oxide layer 3231 includes a channel formation region $3231i$ overlapping with the conductive layer 3223, a source region $3231s$ in contact with the insulating layer 3213, and a drain region $3231d$ in contact with the insulating layer 3213.

The insulating layer 3213 contains nitrogen or hydrogen. The insulating layer 3213 is in contact with the source region $3231s$ and the drain region $3231d$, so that nitrogen or hydrogen that is contained in the insulating layer 3213 is added to the source region $3231s$ and the drain region $3231d$. The source region $3231s$ and the drain region $3231d$ each have a high carrier density when nitrogen or hydrogen is added thereto.

The transistor $3200c$ may further include an insulating layer 3215 over the insulating layer 3213, the conductive layer $3222a$ electrically connected to the source region $3231s$ through an opening $3236a$ provided in the insulating layers 3213 and 3215, and the conductive layer $3222b$ electrically connected to the drain region $3231d$ through an opening $3236b$ provided in the insulating layers 3213 and 3215.

The insulating layer 3215 can be an oxide insulating film. Alternatively, a stacked-layer film including an oxide insulating film and a nitride insulating film can be used as the insulating layer 3215. The insulating layer 3215 can include, for example, a silicon oxide, a silicon oxynitride, a silicon nitride oxide, an aluminum oxide, a hafnium oxide, a gallium oxide, or a Ga—Zn oxide. Furthermore, the insulating layer 3215 preferably functions as a barrier film against hydrogen, water, and the like from the outside.

The insulating layer 3211 serves as a first gate insulating film, and the insulating layer 3212 serves as a second gate insulating film. The insulating layers 3213 and 3215 serve as a protective insulating film.

The insulating layer 3212 includes an excess oxygen region. Since the insulating layer 3212 includes the excess oxygen region, excess oxygen can be supplied to the channel formation region $3231i$ included in the metal oxide layer 3231. As a result, oxygen vacancies that might be formed in the channel formation region $3231i$ can be filled with excess oxygen, which can provide a highly reliable semiconductor device.

To supply excess oxygen to the metal oxide layer 3231, excess oxygen may be supplied to the insulating layer 3211 that is formed below the metal oxide layer 3231. However, in that case, excess oxygen contained in the insulating layer 3211 might also be supplied to the source region $3231s$ and the drain region $3231d$ included in the metal oxide layer 3231. When excess oxygen is supplied to the source region $3231s$ and the drain region $3231d$, the resistance of the source region $3231s$ and the drain region $3231d$ might be increased.

In contrast, in the structure in which the insulating layer 3212 formed over the metal oxide layer 3231 contains excess oxygen, excess oxygen can be selectively supplied only to the channel formation region $3231i$. Alternatively, the carrier density of the source and drain regions $3231s$ and $3231d$ can be selectively increased after excess oxygen is supplied to the channel formation region $3231i$ and the source and drain regions $3231s$ and $3231d$, in which case an increase in the resistance of the source and drain regions $3231s$ and $3231d$ can be prevented.

Furthermore, each of the source region $3231s$ and the drain region $3231d$ included in the metal oxide layer 3231 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. In the case where one or more of the elements that form oxygen vacancies are contained in the insulating layer 3213, the one or more of the elements are diffused from the insulating layer 3213 to the source region $3231s$ and the drain region $3231d$, and/or may be added to the source region $3231s$ and the drain region $3231d$ by impurity addition treatment.

An impurity element added to the oxide semiconductor film cuts a bond between a metal element and oxygen in the oxide semiconductor film, so that an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity thereof becomes higher.

The conductive layer 3221 functions as a first gate electrode and the conductive layer 3223 functions as a second gate electrode. The conductive layer $3222a$ functions as a source electrode and the conductive layer $3222b$ functions as a drain electrode.

As shown in FIG. 15C, an opening 3237 is formed in the insulating layers 3211 and 3212. The conductive layer 3221 is electrically connected to the conductive layer 3223 in the opening 3237. Thus, the conductive layers 3221 and 3223 are supplied with the same potential. Note that different potentials may be applied to the conductive layers 3221 and 3223 without providing the opening 3237. Alternatively, the conductive layer 3221 may be used as a light-blocking film without providing the opening 3237. For example, light irradiating the channel formation region 3231*i* from the bottom can be reduced by the conductive layer 3221 formed with a light-blocking material.

As shown in FIGS. 15B and 15C, the metal oxide layer 3231 faces the conductive layer 3221 functioning as the first gate electrode and the conductive layer 3223 functioning as the second gate electrode and is between the two conductive films functioning as the gate electrodes.

As with the transistors 3200*a* and 3200*b*, the transistor 3200*c* has the S-channel structure. Such a structure enables the metal oxide layer 3231 included in the transistor 3200*c* to be electrically surrounded by electric fields of the conductive layer 3221 functioning as the first gate electrode and the conductive layer 3223 functioning as the second gate electrode.

Since the transistor 3200*c* has the S-channel structure, an electric field for inducing a channel can be effectively applied to the metal oxide layer 3231 by the conductive layer 3221 or 3223; thus, the current drive capability of the transistor 3200*c* can be improved and high on-state current characteristics can be obtained. As a result of the high on-state current, it is possible to reduce the size of the transistor 3200*c*. Furthermore, since the transistor 3200*c* has a structure in which the metal oxide layer 3231 is surrounded by the conductive layers 3221 and 3223, the mechanical strength of the transistor 3200*c* can be increased.

The transistor 3200*c* may be called a top-gate self-aligned (TGSA) FET from the position of the conductive layer 3223 relative to the metal oxide layer 3231 or the formation method of the conductive layer 3223.

The metal oxide layer 3231 in the transistor 3200*c* may have a stacked-layer structure including two or more layers, as in the transistor 3200*b*.

Although the insulating layer 3212 is present only in a portion overlapping with the conductive layer 3223 in the transistor 3200*c*, the structure is not limited thereto, and the insulating layer 3212 may cover the metal oxide layer 3231. Alternatively, the conductive layer 3221 may be omitted.

This embodiment can be implemented in an appropriate combination with any of the structures described in the other embodiments and the like.

Embodiment 6

Figure 16A:
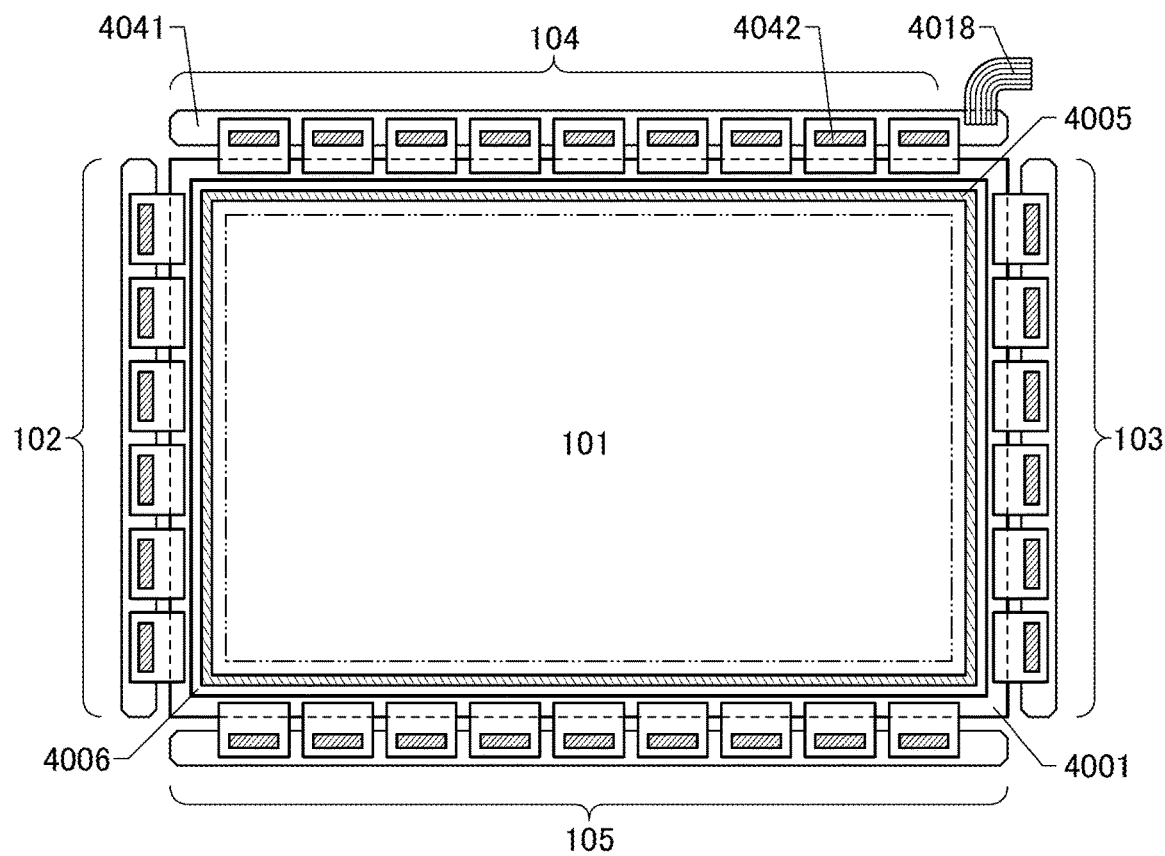
FIGS. 16A and 16B each illustrate a display device.

In this embodiment, a structure example of a display device including a liquid crystal element and a structure example of a display device including an EL element are described. In FIG. 16A, a sealant 4005 is provided so as to surround the display portion 101 provided over a first substrate 4001, and the display portion 101 is sealed by the sealant 4005 and a second substrate 4006.

In FIG. 16A, the scan line driver circuit 102, the scan line driver circuit 103, the signal line driver circuit 104, and the signal line driver circuit 105 each include a plurality of integrated circuits 4042 provided over a printed circuit board 4041. The integrated circuits 4042 are each formed using a single crystal semiconductor or a polycrystalline semiconductor.

The integrated circuits 4042 included in the scan line driver circuit 102 and the scan line driver circuit 103 each have a function of supplying a selection signal to the display portion 101. The integrated circuits 4042 included in the signal line driver circuit 104 and the signal line driver circuit 105 each have a function of supplying an image signal to the display portion 101. The integrated circuits 4042 are mounted by a tape automated bonding (TAB) method in a region different from a region surrounded by the sealant 4005 over the first substrate 4001.

Signals and potentials are supplied from a flexible printed circuit (FPC) 4018 to the scan line driver circuit 102, the scan line driver circuit 103, the signal line driver circuit 104, and the signal line driver circuit 105.

Note that the connection method of the integrated circuit 4042 is not particularly limited; a wire bonding method, a chip on glass (COG) method, a tape carrier package (TCP) method, a chip on film (COF) method, or the like can be used.

Figure 16B:
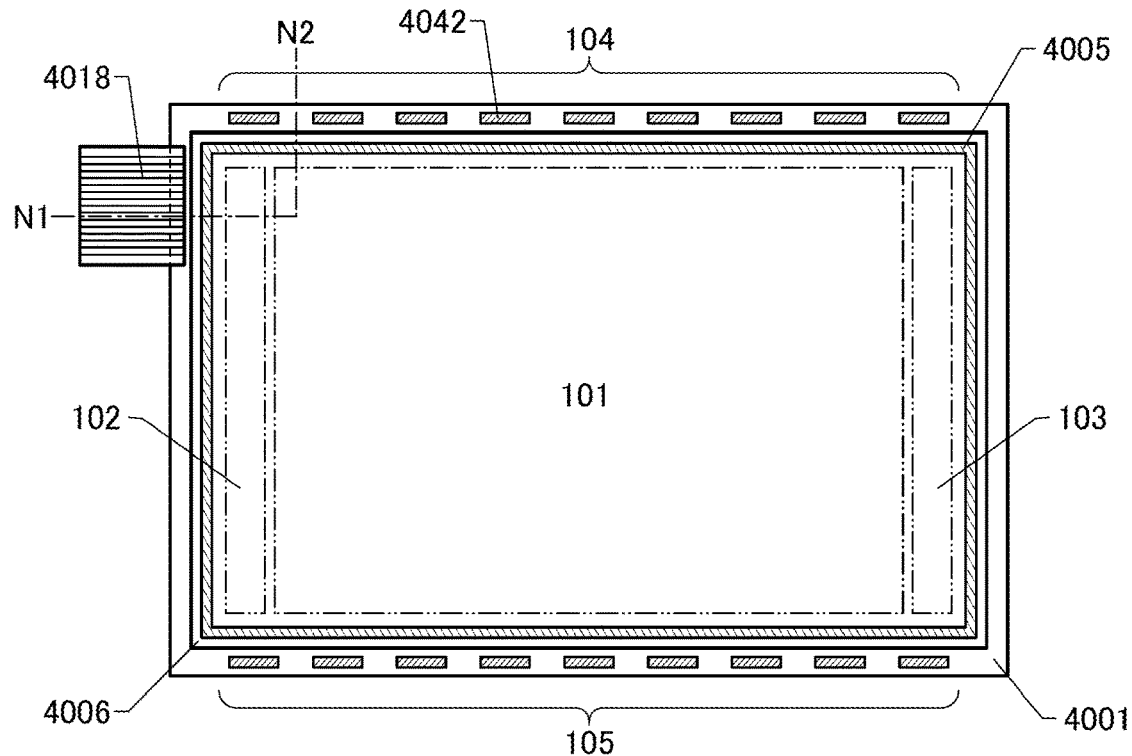

FIG. 16B shows an example of mounting the integrated circuits 4042 included in the signal line driver circuit 104 and the signal line driver circuit 105 by a COG method. With use of any of the transistors described in the above embodiments, some or all of driver circuits can be formed over a substrate over which the display portion 101 is formed, whereby a system-on-panel can be obtained.

In the example shown in FIG. 16B, the scan line driver circuit 102 and the scan line driver circuit 103 are formed over the substrate over which the display portion 101 is formed. When the driver circuits are formed concurrently with the pixel circuit in the display portion 101, the number of components can be reduced. Accordingly, the productivity can be increased.

In FIG. 16B, the sealant 4005 is provided to surround the display portion 101, the scan line driver circuit 102, and the scan line driver circuit 103 over the first substrate 4001. The second substrate 4006 is provided over the display portion 101, the scan line driver circuit 102, and the scan line driver circuit 103. Consequently, the display portion 101, the scan line driver circuit 102, and the scan line driver circuit 103 are sealed together with a display element by the first substrate 4001, the sealant 4005, and the second substrate 4006.

Although the signal line driver circuit 104 and the signal line driver circuit 105 are formed separately and mounted on the first substrate 4001 in the example shown in FIG. 16B, one embodiment of the present invention is not limited to this structure. The scan line driver circuits may be separately formed and then mounted, or part of the signal line driver circuits or part of the scan line driver circuits may be separately formed and then mounted.

In some cases, the display device encompasses a panel in which a display element is sealed, and a module in which an IC or the like including a controller is mounted on the panel.

The display portion and the scan line driver circuit over the first substrate each include a plurality of transistors. Any of the transistors described in the above embodiments can be applied to the transistors.

A transistor included in a peripheral driver circuit and a transistor included in the pixel circuit of the display portion may have the same structure or different structures. Transistors included in the peripheral driver circuit may have the same structure or a combination of two or more kinds of structures. Similarly, transistors included in the pixel circuit may have the same structure or a combination of two or more kinds of structures.

FIGS. 17A and 17B correspond to cross-sectional views taken along the chain line N1-N2 in FIG. 16B. Display devices shown in FIGS. 17A and 17B each have an electrode 4015, and the electrode 4015 is electrically connected to a terminal included in the FPC 4018 through an anisotropic conductive layer 4019. In FIGS. 17A and 17B, the electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as a source and drain electrodes of transistors 4010 and 4011.

The pixel portion 101 and the scan line driver circuit 102 provided over the first substrate 4001 include a plurality of transistors. In FIGS. 17A and 17B, the transistor 4010 included in the display portion 101 and the transistor 4011 included in the scan line driver circuit 102 are shown as an example. In the examples shown in FIGS. 17A and 17B, the transistors 4010 and 4011 are bottom-gate transistors.

In FIGS. 17A and 17B, the insulating layer 4112 is provided over the transistors 4010 and 4011. A bank 4510 is provided over the insulating layer 4112 in FIG. 17B.

The transistors 4010 and 4011 are provided over an insulating layer 4102. The transistors 4010 and 4011 each include an electrode 4017 formed over the insulating layer 4111. The electrode 4017 can serve as a back gate electrode.

The transistor described in the above embodiment can be applied to the transistors 4010 and 4011.

The display devices shown in FIGS. 17A and 17B each include a capacitor 4020. The capacitor 4020 includes an electrode 4021 formed in the same step as that for forming a gate electrode of the transistor 4010, and an electrode formed in the same step as that for forming a source electrode and a drain electrode of the transistor 4010. The electrodes overlap with each other with the insulating layer 4103 provided therebetween.

In general, the capacitance of a capacitor provided in a pixel portion of a display device is set in consideration of leakage current or the like of transistors provided in a pixel portion so that charges can be held for a predetermined period. The capacitance of the capacitor may be set considering off-state current of the transistor or the like.

The transistor 4010 included in the display portion 101 is electrically connected to the display element. An example of a liquid crystal display device using a liquid crystal element as a display element is shown in FIG. 17A. In FIG. 17A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

A black matrix (a light-blocking layer); a coloring layer (a color filter); an optical member (an optical substrate) such as a polarizing member, a retardation member, or an anti-reflection member; and the like may be provided as appropriate as needed. For example, circular polarization may be employed by using a polarizing substrate and a retardation substrate. In addition, a backlight, a side light, or the like may be used as a light source.

In the display device shown in FIG. 17A, a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

As examples of a material that can be used for the coloring layer, a metal material, a resin material, and a resin material containing a pigment or dye can be given. The light-blocking layer and the coloring layer may be formed by a method similar to the above-described methods for forming the layers. For example, an inkjet method may be used.

The display devices shown in FIGS. 17A and 17B include the insulating layer 4111 and an insulating layer 4104. As the insulating layers 4104 and 4111, insulating layers through which an impurity element does not easily pass are used. A semiconductor layer of the transistor is sandwiched between the insulating layers 4104 and 4111, whereby entry of impurities from the outside can be prevented.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. Here, the case will be described in which an organic EL element is used as a light-emitting element.

In order to extract light emitted from the light-emitting element, at least one of a pair of electrodes needs to be transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 17B shows an example of a light-emitting display device (also referred to as an "EL display device") using a light-emitting element as a display element. The light-emitting element 4513 which is a display element is electrically connected to the transistor 4010 provided in the display portion 101. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

The emission color of the light-emitting element 4513 can be changed to white, red, green, blue, cyan, magenta, yellow, or the like depending on the material that forms the light-emitting layer 4511.

As a color display method, there are a method in which the light-emitting element 4513 whose emission color is white is combined with a coloring layer and a method in which the light-emitting element 4513 with a different emission color is provided in each pixel. The former method is more productive than the latter method. On the other hand, the latter method, which requires separate formation of the light-emitting layer 4511 subpixel by subpixel, is less productive than the former method. However, the latter method can produce the emission color with higher color purity than that of the emission color produced by the former method. When the light-emitting element 4513 has a microcavity structure in the latter method, the color purity can be further increased.

The light-emitting layer 4511 may contain an inorganic compound such as quantum dots. For example, when used for the light-emitting layer, the quantum dot can serve as a light-emitting material.

A protective layer may be formed over the second electrode layer 4031 and the bank 4510 in order to prevent entry of oxygen, hydrogen, moisture, carbon dioxide, or the like into the light-emitting element 4513. For the protective layer, a silicon nitride, a silicon nitride oxide, an aluminum oxide, an aluminum nitride, an aluminum oxynitride, an aluminum nitride oxide, diamond like carbon (DLC), or the like can be used. In a space which is formed with the first substrate 4001, the second substrate 4006, and the sealant 4005, a filler 4514 is provided for sealing. It is preferable that the panel be packaged (sealed) with a protective film (such as a laminate film or an ultraviolet curable resin film) or a cover member with high air-tightness and little degasification so that the panel is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

For example, a glass material such as a glass frit, or a resin that is curable at room temperature such as a two-component-mixture-type resin, a light curable resin, a thermosetting resin, and the like can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also referred to as a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as an indium oxide containing a tungsten oxide, an indium zinc oxide containing a tungsten oxide, an indium oxide containing a titanium oxide, an indium tin oxide, an indium tin oxide containing a titanium oxide, an indium zinc oxide, or an indium tin oxide to which a silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as conductive polymer) can be used for the first electrode layer 4030 and the second electrode layer 4031. As the conductive high molecule, a so-called π electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protective circuit for protecting the driver circuit is preferably provided. The protective circuit is preferably formed using a nonlinear element.

This embodiment can be implemented in appropriate combination with any of the structures described in the other embodiments and the like.

Embodiment 7

Figure 18:
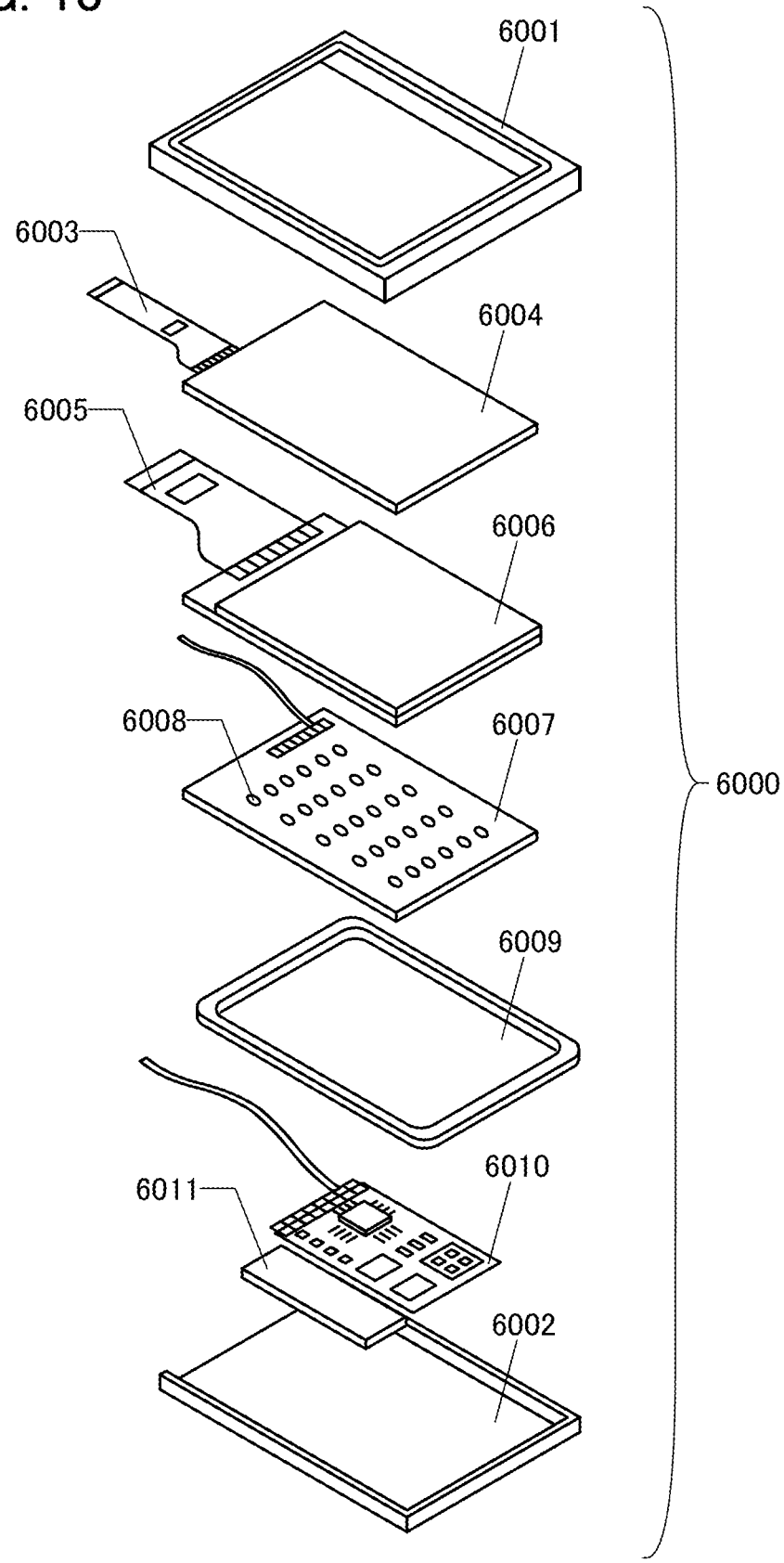
FIG. 18 illustrates a display module.

In this embodiment, a display module will be described. In a display module 6000 shown in FIG. 18, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on the printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added. In the case where the touch sensor 6004 is not necessarily provided, the touch sensor 6004 can be omitted.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be implemented in an appropriate combination with any of the structures described in the other embodiments and the like.

Embodiment 8

In this embodiment, electronic devices to which the display device of one embodiment of the present invention can be applied are described with reference to FIGS. 19A to 19F and FIGS. 20A to 20F.

FIGS. 19A to 19F and FIGS. 20A to 20F show examples of an electronic device. With one embodiment of the present invention, a display device having an increased size and/or definition can have favorable display quality and high visibility. Thus, the display device can be suitably used for a television device, digital signage, a mobile electronic device, a wearable electronic device (a wearable device), an electronic book terminal, and the like. In addition, the display device can be suitably used for virtual reality (VR) devices, augmented reality (AR) devices, and the like.

The electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

Figure 19A:
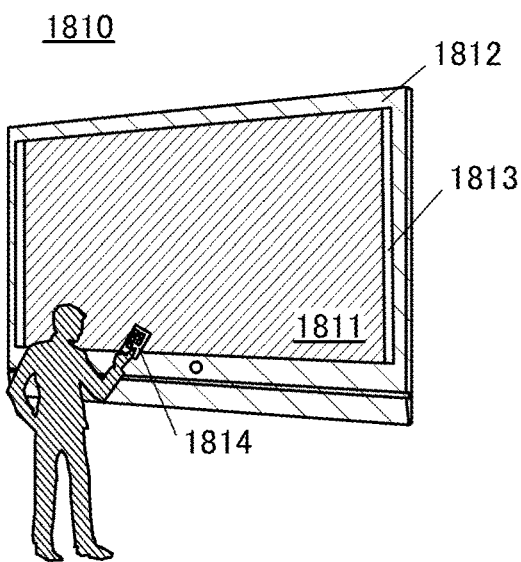
FIGS. 19A to 19F illustrate electronic devices.

FIG. 19A shows a television device 1810. The television device 1810 includes a display portion 1811, a housing 1812, a speaker 1813, and the like. Also, the television device can include an LED lamp, operation keys (including a power switch or an operation switch), a connection terminal, a variety of sensors, a microphone, and the like.

The television device 1810 can be controlled with a remote controller 1814.

The television device 1810 can receive airwaves such as a ground wave and a wave transmitted from a satellite. The television device 1810 can receive airwaves for analog broadcasting, digital broadcasting, and the like, and image-sound-only broadcasting, sound-only broadcasting, and the like. For example, the television device 1810 can receive airwaves transmitted in a certain frequency band, such as a UHF band (about 300 MHz to 3 GHz) or a VHF band (30 MHz to 300 MHz). When a plurality of pieces of data received in a plurality of frequency bands is used, the transfer rate can be increased and more information can thus be obtained. Accordingly, the display portion 1831 can display an image with a resolution higher than the full high definition, such as 4K, 8K, 16K, or more.

An image to be displayed on the display portion 1831 may be generated using broadcasting data transmitted with technology for transmitting data through a computer network such as the Internet, a local area network (LAN), or Wi-Fi (registered trademark). In that case, the television device 1810 does not necessarily include a tuner.

Figure 19B:
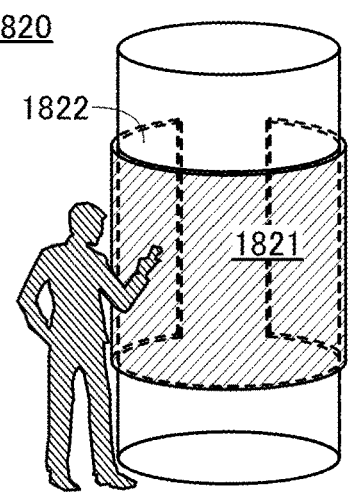

FIG. 19B shows a digital signage 1820 mounted on a cylindrical pillar 1822. The digital signage 1820 includes a display portion 1821.

The larger the display portion 1821 is, the more information the display portion 1821 can provide at a time. In addition, the larger the display portion 1821 is, the more the display portion 1821 attracts attention, so that the effectiveness of the advertisement can be increased, for example.

It is preferable to use a touch panel in the display portion 1821 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Figure 19C:
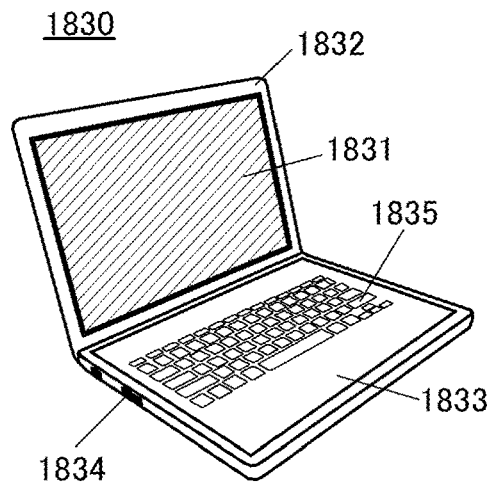

FIG. 19C shows a notebook personal computer 1830. The personal computer 1830 includes a display portion 1831, a housing 1832, a touch pad 1833, a connection port 1834, and the like.

The touch pad 1833 functions as an input unit such as a pointing device or a pen tablet and can be controlled with a finger, a stylus, or the like.

Furthermore, a display element is incorporated in the touch pad 1833. As shown in FIG. 19C, when an input key 1835 is displayed on a surface of the touch pad 1833, the touch pad 1833 can be used as a keyboard. In that case, a vibration module may be incorporated in the touch pad 1833 so that sense of touch is achieved by vibration when a user touches the input key 1835.

Figure 19D:
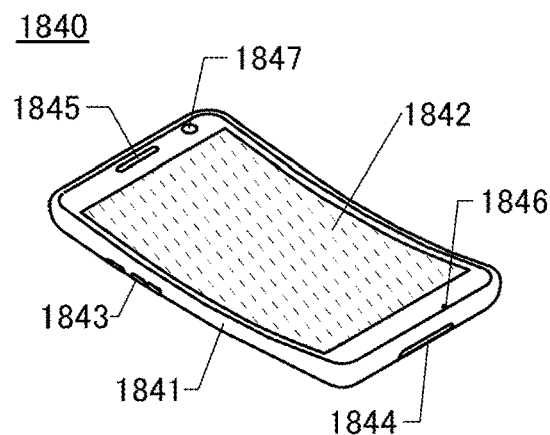

FIG. 19D shows an example of a portable information terminal. A portable information terminal 1840 shown in FIG. 19D includes a housing 1841, a display portion 1842, an operation button 1843, an external connection port 1844, a speaker 1845, a microphone 1846, a camera 1847, and the like.

The display portion 1842 is provided with the display device of one embodiment of the present invention.

The portable information terminal 1840 includes a touch sensor in the display portion 1842. Moreover, operations such as making a call and inputting a letter can be performed by touch on the display portion 1842 with a finger, a stylus, or the like.

The power can be turned on or off with the operation button 1843. In addition, types of images displayed on the display portion 1842 can be switched; for example, switching images from a mail creation screen to a main menu screen is performed with the operation button 1843.

When a detection device such as a gyroscope sensor or an acceleration sensor is provided inside the portable information terminal 1840, the direction of display on the screen of the display portion 1842 can be automatically changed by determining the orientation of the portable information terminal 1840 (whether the portable information terminal 1840 is placed horizontally or vertically). Furthermore, the direction of display on the screen can be changed by touch on the display portion 1842, operation with the operation button 1843, sound input using the microphone 1846, or the like.

The portable information terminal 1840 has one or more of a telephone function, a notebook function, an information browsing function, and the like, for example. Specifically, the portable information terminal can be used as a smartphone. The portable information terminal 1840 is capable of executing a variety of applications such as mobile phone calls, e-mailing, viewing and editing texts, music reproduction, reproducing a moving image, Internet communication, and computer games, for example.

Figure 19E:
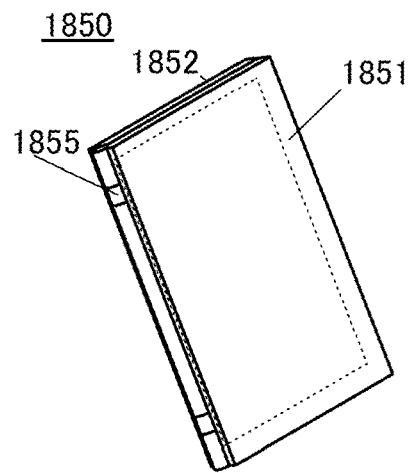
Figure 19F:
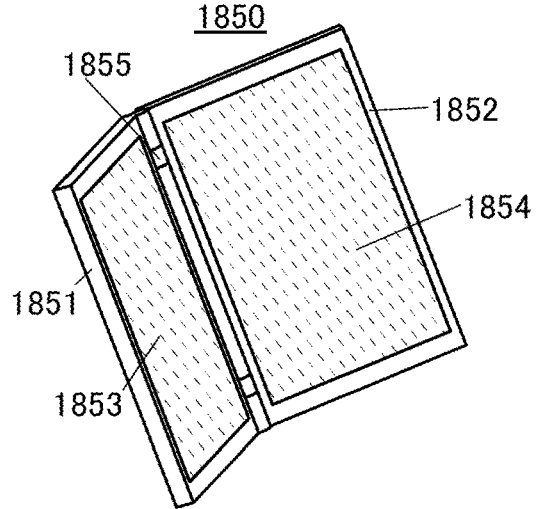

FIGS. 19E and 19F show an example of a portable information terminal 1850. The portable information terminal 1850 includes a housing 1851, a housing 1852, a display portion 1853, a display portion 1854, a hinge portion 1855, and the like.

The housing 1851 and the housing 1852 are joined together with the hinge portion 1855. The portable information terminal 1850 folded as in FIG. 19E can be changed into the state illustrated in FIG. 19F, in which the housing 1851 and the housing 1852 are opened.

For example, text information can be displayed on the display portion 1853 and the display portion 1854; thus, the portable information terminal 1850 can be used as an e-book reader. Furthermore, still images and moving images can be displayed on the display portions 1853 and 1854.

In this manner, the portable information terminal 1850 has high versatility because it can be folded when carried.

Note that the housing 1851 and the housing 1852 may have a power button, an operation button, an external connection port, a speaker, a microphone, and the like.

Figure 20A:
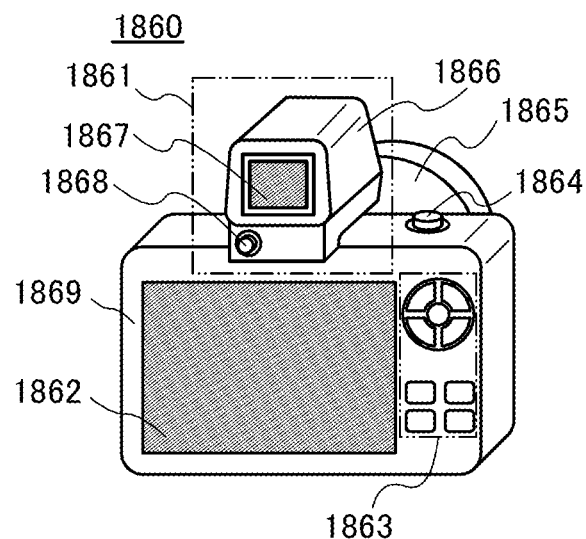
FIGS. 20A to 20F illustrate electronic devices.

FIG. 20A is an external view of a camera 1860 to which a finder 1861 is attached.

The camera 1860 includes a housing 1869, a display portion 1862, an operation button 1863, a shutter button 1864, and the like. Furthermore, an detachable lens 1865 is attached to the camera 1860.

Although the lens 1865 of the camera 1860 here is detachable from the housing 1869 for replacement, the lens 1865 may be integrated with the housing.

Images can be taken with the camera 1860 at the press of the shutter button 1864. In addition, images can be taken at the touch of the display portion 1862 which serves as a touch panel.

The housing 1869 of the camera 1860 includes a mount including an electrode, so that the finder 1861, a stroboscope, or the like can be connected to the housing 1869.

The finder 1861 includes a housing 1866, a display portion 1867, a button 1868, and the like.

The housing 1866 includes a mount for engagement with the mount of the camera 1860 so that the finder 1861 can be connected to the camera 1860. The mount includes an electrode, and an image or the like received from the camera 1860 through the electrode can be displayed on the display portion 1867.

The button 1868 serves as a power button. The display portion 1867 can be turned on and off using the button 1868.

The display device of one embodiment of the present invention can be used for the display portion 1862 of the camera 1860 and the display portion 1867 of the finder 1861.

Although the camera 1860 and the finder 1861 are separate and detachable electronic devices in FIG. 20A, the housing 1869 of the camera 1860 may include a finder having the display device of one embodiment of the present invention.

Figure 20B:
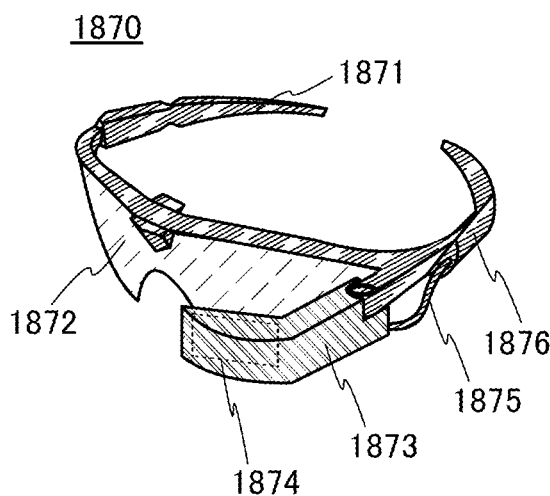

FIG. 20B is an external view of a head-mounted display 1870.

The head-mounted display 1870 includes a mounting portion 1871, a lens 1872, a main body 1873, a display portion 1874, a cable 1875, and the like. The mounting portion 1871 includes a battery 1876.

Power is supplied from the battery 1876 to the main body 1873 through the cable 1875. The main body 1873 includes a wireless receiver or the like to receive video data, such as image data, and display it on the display portion 1874. The movement of the eyeball and the eyelid of a user is captured by a camera in the main body 1873 and then coordinates of the points the user looks at are calculated using the captured data to utilize the eye point of the user as an input means.

The mounting portion 1871 may include a plurality of electrodes to be in contact with the user. The main body 1873 may be configured to sense current flowing through the electrodes with the movement of the user's eyeball to recognize the direction of his or her eyes. The main body 1873 may be configured to sense current flowing through the electrodes to monitor the user's pulse. The mounting portion 1871 may include sensors, such as a temperature sensor, a pressure sensor, or an acceleration sensor so that the user's biological information can be displayed on the display portion 1874. The main body 1873 may be configured to sense the movement of the user's head or the like to move an image displayed on the display portion 1874 in synchronization with the movement of the user's head or the like.

The display device of one embodiment of the present invention can be used in the display portion 1874.

Figure 20C:
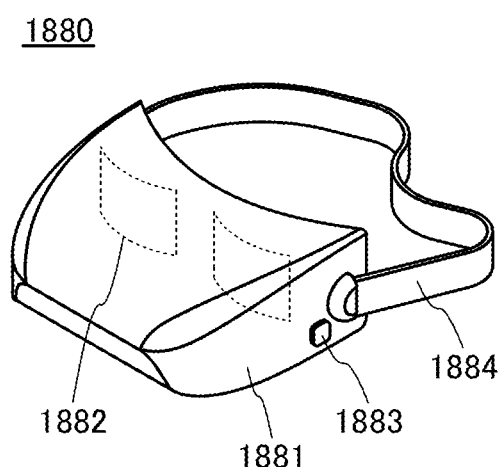
Figure 20D:
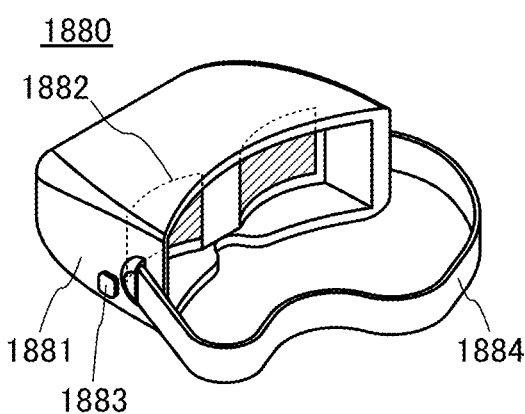

FIGS. 20C and 20D are external views of a head-mounted display 1880.

The head-mounted display 1880 includes a housing 1881, two display portions 1882, an operation button 1883, and an object for fixing, such as a band, 1884.

The head-mounted display 1880 has the functions of the above-described head-mounted display 1880 and further includes two display portions.

With the two display portions 1882, the user can see one display portion with one eye and the other display portion with the other eye. Thus, a high-resolution image can be displayed even when a three-dimensional display using parallax or the like is performed. The display portion 1882 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

The operation button 1883 serves as a power button or the like. A button other than the operation button 1883 may be included.

Figure 20E:
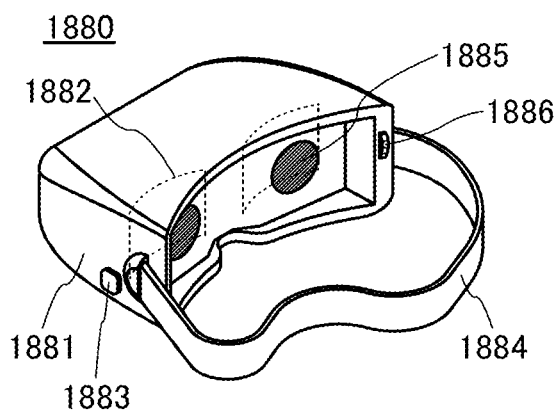

As shown in FIG. 20E, lenses 1885 may be provided between the display portions 1882 and the user's eyes. The user can see magnified images on the display portion 1882 through the lenses 1885, leading to higher sense of presence. In this case, as shown in FIG. 20E, a dial 1886 for adjusting the position of the lenses may be included to adjust visibility.

The display device of one embodiment of the present invention can be used for the display portion 1882. Since the display device of one embodiment of the present invention has extremely high definition, even when an image is magnified using the lenses 1885 as shown in FIG. 20E, the pixels are not perceived by the user, and thus a more realistic image can be displayed.

Figure 20F:
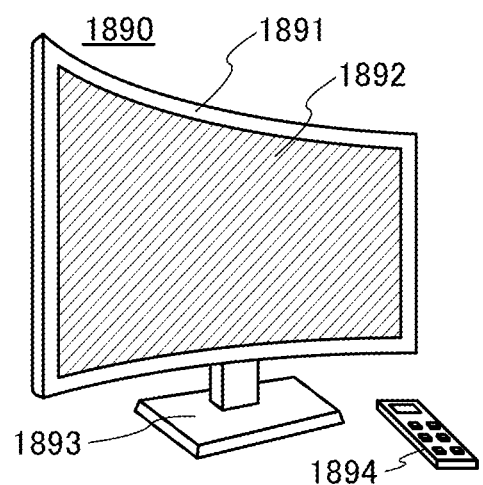

FIG. 20F shows an example of a television set. In a television set 1890, a display portion 1892 is incorporated in a housing 1891. Note that the housing 1891 is supported by a stand 1893 here.

The display device of one embodiment of the present invention can be used in the display portion 1892.

The television set 1890 shown in FIG. 20F can be operated by an operation switch of the housing 1891 or a separate remote controller 1894. The display portion 1892 may include a touch sensor. The television set 1890 can be operated by touching the display portion 1892 with a finger or the like. The remote controller 1894 may be provided with a display portion for displaying data output from the remote controller 1894. With an operation key or a touch panel of the remote controller 1894, channels and volume can be controlled and images displayed on the display portion 1892 can be controlled.

Note that the television set 1890 is provided with a receiver, a modem, or the like. With the use of the receiver, general television broadcasting can be received. When the television set is connected to a communication network with or without wires via the modem, one-way (from a transmitter to a receiver) or two-way (between a transmitter and a receiver or between receivers) data communication can be performed.

This embodiment can be implemented in an appropriate combination with any of the structures described in the other embodiments and the like.

Embodiment 9

In this embodiment, examples of a method of crystallization for polycrystalline silicon that is used for the semiconductor layer of the transistor and a laser crystallization apparatus are described.

To form polycrystalline silicon layers having favorable crystallinity, it is preferable that an amorphous silicon layer be provided over a substrate and crystallized by laser irradiation. For example, the substrate is moved while the amorphous silicon layer is irradiated with a linear beam, so that polycrystalline silicon layers can be formed in desired regions over the substrate.

The throughput of a method using a linear beam is relatively favorable. On the other hand, the method tends to produce variations in crystallinity owing to a change in the output of laser light and a change in the beam profile caused by the output change because laser light is moved relative to a region and is emitted to the region a plurality of times. For example, when a semiconductor layer crystallized by the above method is used for a transistor included in a pixel of a display device, a random stripe pattern due to the variation in the crystallinity is seen in some cases at the time of displaying an image.

The length of the linear beam is ideally greater than or equal to the length of a side of the substrate; however, the length of the linear beam is limited by an output of a laser and the structure of an optical system. Thus, it is practical to irradiate a large substrate with the laser light by turning back the laser light in a substrate plane. Consequently, there is a region irradiated with the laser light a plurality of times. Since the crystallinity of such a region is likely to be different from that of the other region, display unevenness is sometimes caused in the region.

To avoid such a problem, an amorphous silicon layer formed over a substrate may be crystallized by local laser irradiation. Local laser irradiation easily forms polycrystalline silicon layers with small variation in crystallinity.

Figure 21A:
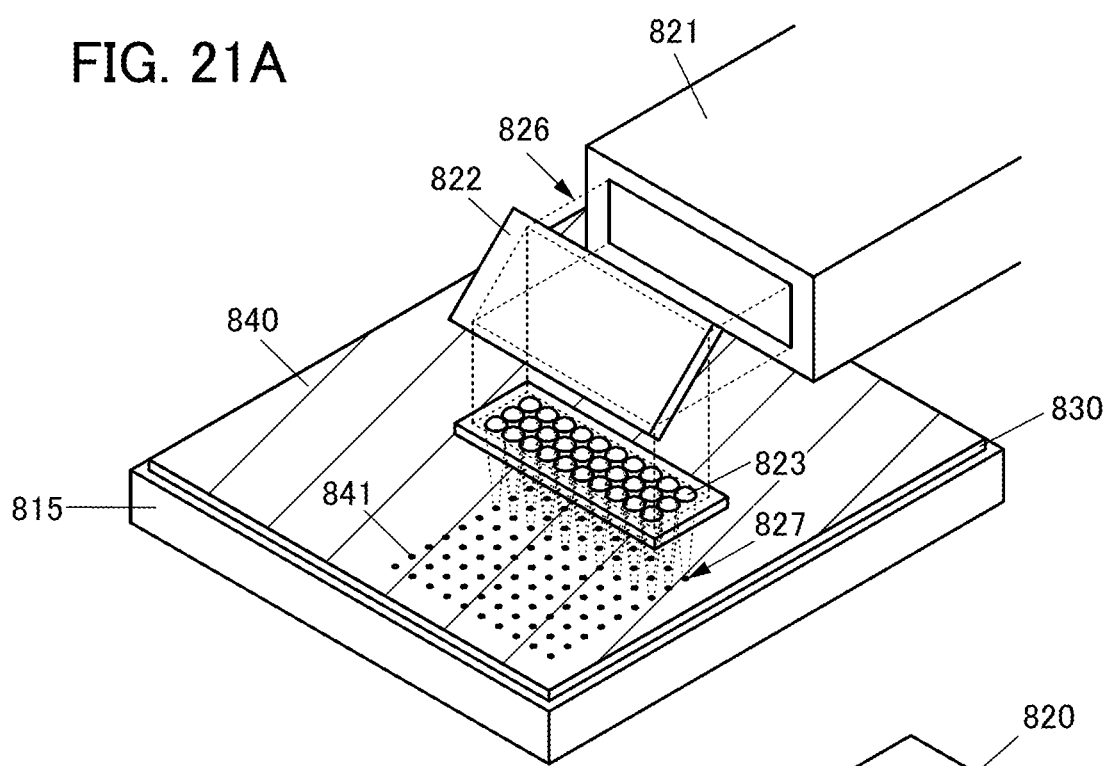
FIGS. 21A and 21B illustrate a laser irradiation method and a laser crystallization apparatus.

FIG. 21A illustrates a method of locally irradiating an amorphous silicon layer formed over a substrate with laser light.

Laser light 826 emitted from an optical system unit 821 is reflected by a mirror 822 and enters a microlens array 823. The microlens array 823 collects the laser light 826 to form a plurality of laser beams 827.

A substrate 830 over which an amorphous silicon layer 840 is formed is fixed to a stage 815. The amorphous silicon layer 840 is irradiated with the plurality of laser beams 827, so that a plurality of polycrystalline silicon layers 841 can be formed at the same time.

Microlenses of the microlens array 823 are preferably provided with a pixel pitch of a display device. Alternatively, they may be provided at intervals of an integral multiple of the pixel pitch. In either of the cases, polycrystalline silicon layers can be formed in regions corresponding to all pixels by repeating laser irradiation and movement of the stage 815 in the X direction or the Y direction.

For example, when the microlens array 823 includes M rows and N columns (M and N are natural numbers) of microlenses arranged with a pixel pitch, laser irradiation is performed at a predetermined start position first, so that M rows and N columns of polycrystalline silicon layers 841 can be formed. Then, the stage 815 is moved by N columns in the row direction and laser irradiation is performed, so that M rows and N columns of polycrystalline silicon layers 841 can be further formed. Consequently, M rows and 2N columns of polycrystalline silicon layers 841 can be obtained. By repeating the steps, a plurality of polycrystalline silicon layers 841 can be formed in desired regions. In the case where laser irradiation is performed by turning back the laser light, the following steps are repeated: the stage 815 is moved by N columns in the row direction; laser irradiation is performed; the stage 815 is moved by M rows in the column direction: and laser irradiation is performed.

Note that even when a method of performing laser irradiation while the stage 815 is moved in one direction is employed, polycrystalline silicon layers can be formed with a pixel pitch by adjusting the oscillation frequency of the laser light and the moving speed of the stage 815 properly.

The size of the laser beam 827 can be an area in which the whole semiconductor layer of a transistor is included, for example. Alternatively, the size can be an area in which the whole channel formation region of a transistor is included. Further alternatively, the size can be an area in which part of a channel formation region of a transistor is included. The size can be selected from them depending on required electrical characteristics of a transistor.

Note that in the case of a display device including a plurality of transistors in a pixel, the size of the laser beam 827 can be an area in which the whole semiconductor layer of each transistor in a pixel is included. Alternatively, the size of the laser beam 827 may be an area in which the whole semiconductor layers of transistors in a plurality of pixels are included.

Figure 22A:
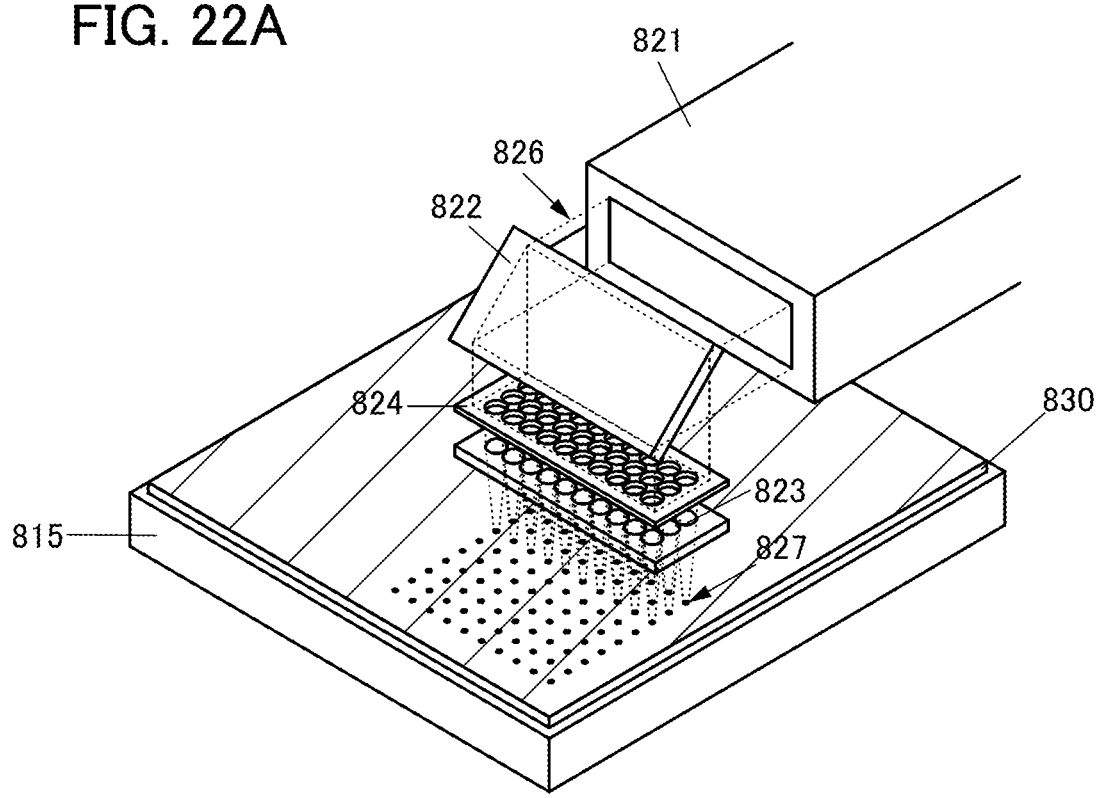
FIGS. 22A and 22B illustrate a laser irradiation method.
Figure 22B:
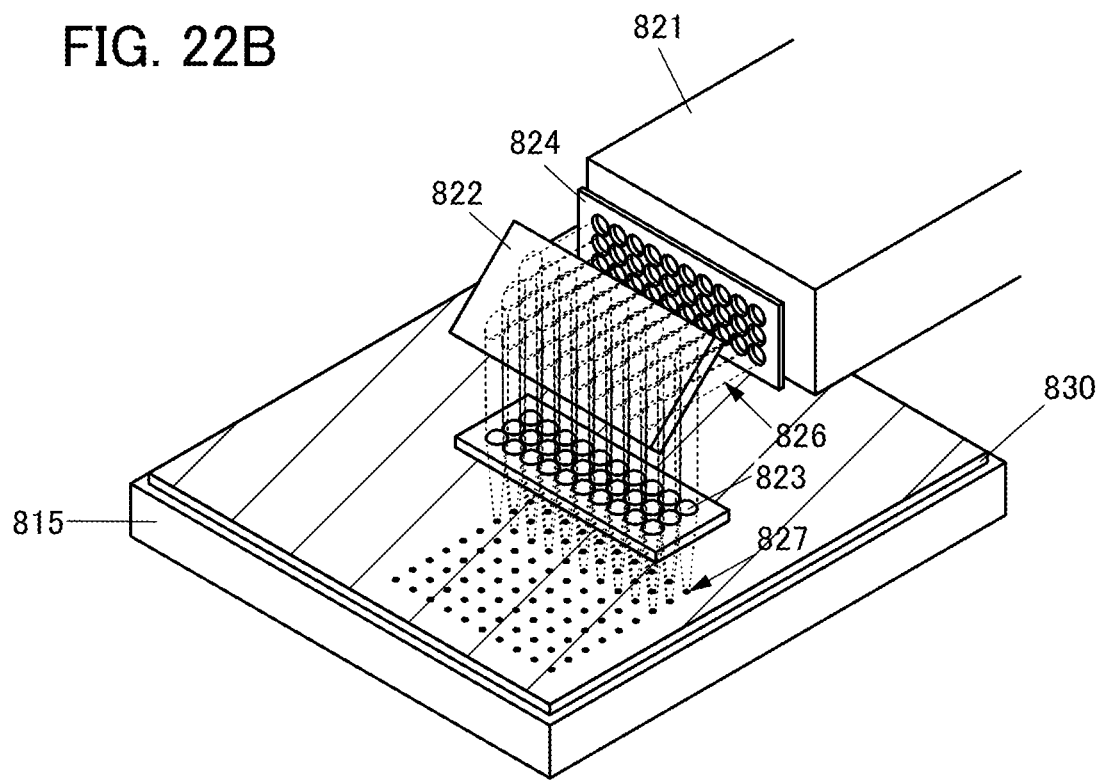

As shown in FIG. 22A, a mask 824 may be provided between the mirror 822 and the microlens array 823. The mask 824 includes a plurality of openings corresponding to respective microlenses. The shape of the opening can be reflected by the shape of the laser beam 827; as shown in FIG. 22A, the laser beam 827 having a circular shape can be obtained in the case where the mask 824 includes circular openings. The laser beam 827 having a rectangular shape can be obtained in the case where the mask 824 includes rectangular openings. The mask 824 is effective in the case where only a channel formation region of a transistor is crystallized, for example. Note that the mask 824 may be provided between the optical system unit 821 and the mirror 822 as shown in FIG. 22B.

Figure 21B:
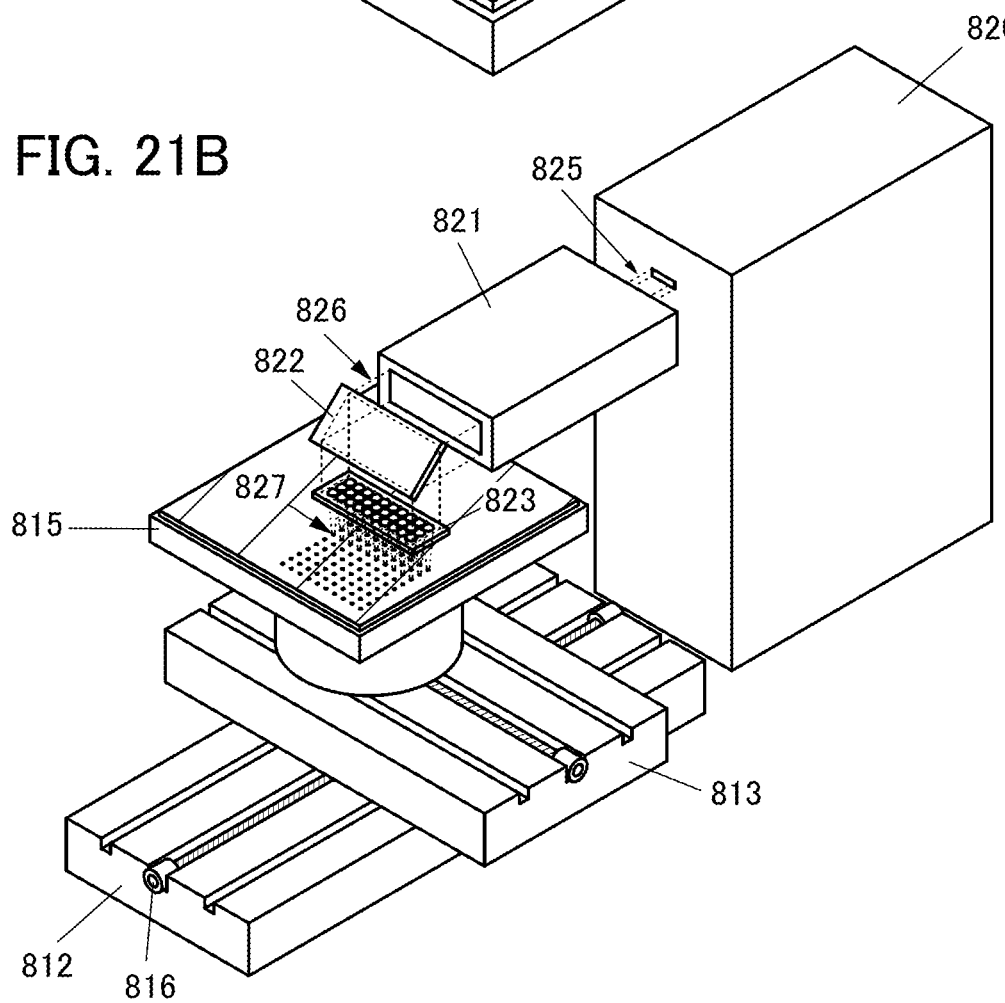

FIG. 21B is a perspective view illustrating a main structure of a laser crystallization apparatus which can be used in the above local laser irradiation step. The laser crystallization apparatus includes a moving mechanism 812, a moving mechanism 813, and the stage 815 which are components of an XY stage. The crystallization apparatus further includes a laser 820, the optical system unit 821, the mirror 822, and the microlens array 823 to shape the laser beam 827.

The moving mechanism 812 and the moving mechanism 813 each have a function of performing reciprocating linear motion in the horizontal direction. As a mechanism for powering the moving mechanism 812 and the moving mechanism 813, a ball screw mechanism 816 driven by a motor can be used, for example. The moving directions of the moving mechanism 812 and the moving mechanism 813 cross orthogonally; thus, the stage 815 fixed to the moving mechanism 813 can be moved in the X direction and in the Y direction freely.

The stage 815 includes a fixing mechanism such as a vacuum suction mechanism and can fix the substrate 830 or the like. Furthermore, the stage 815 may include a heating mechanism as needed. Although not shown, the stage 815 may include a pusher pin and a vertical moving mechanism thereof, and the substrate 830 or the like can be moved up and down when being transferred.

The laser 820 is preferably a pulsed laser, but may be a CW laser as long as it outputs light with a wavelength and intensity suitable for the purpose of processing. Typically, an excimer laser that emits ultraviolet light with a wavelength of 351 nm to 353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser such as a YAG laser or a fiber laser may be used. A plurality of lasers 820 may be provided.

The optical system unit 821 includes a mirror, a beam expander, a beam homogenizer, or the like, for example, and can homogenize and expand the energy in-plane distribution of laser light 825 emitted from the laser 820.

As the mirror 822, a dielectric multilayer mirror can be used, for example, and is provided so that the incident angle of the laser light is substantially 45°. The microlens array 823 can have a shape such that a plurality of convex lenses are provided on the top surface or on the top and bottom surfaces of a quartz board, for example.

With the above-described laser crystallization apparatus, polycrystalline silicon layers with small variation in crystallinity can be formed.

This embodiment can be implemented in an appropriate combination with any of the structures described in the other embodiments and the like.

EXAMPLE 1

In this example, results of rough estimation of data writing time of an 8K4K liquid crystal display module including a pixel area (display portion) with a screen diagonal of 65 inches are described.

Note that the resolution of the 8K4K display is significantly high: the horizontal resolution is 7680 and the vertical resolution is 4320. ITU-R BT.2020 is an international standard for 8K4K displays. In the standard, the driving method is a progressive method and the maximum frame frequency is 120 Hz.

In this example, a configuration in which a selection signal is supplied to each gate line and a pixel is selected one by one and a configuration in which a selection signal is supplied to two or four gate lines at a time and two or four pixels that adjoin in the column direction are selected at a time are considered. The two or four pixels that are selected at a time are connected to different source lines. That is, two or four source lines are arranged for each column. In this example, rough estimation of data writing time was performed with use of a layout of pixels with such a configuration.

In this example, a case of using amorphous silicon for a semiconductor layer of a transistor and a case of using a metal oxide for a semiconductor layer of a transistor are examined.

In the case of using amorphous silicon for a semiconductor layer, the estimation was performed with use of a pseudo parameter obtained by changing field-effect mobility that is a design parameter from an actually measured value of a transistor including microcrystalline silicon.

As to the semiconductor layer including a metal oxide, the following two types of structures were considered. As the metal oxide, an In—Ga—Zn oxide was used. In a first type of the structure, a single layer of metal oxide with an atomic ratio In:Ga:Zn=1:1:1 or the neighborhood thereof was used as a semiconductor layer. In a second type of the structure, a stacked layer of metal oxide with an atomic ratio In:Ga:Zn=4:2:3 or the neighborhood thereof was used as a semiconductor layer. Specifically, a structure in which a cloud-aligned composite oxide semiconductor (CAC-OS) film is used for a first metal oxide layer and a c-axis-aligned crystalline oxide semiconductor (CAAC-OS) film is used for a second metal oxide layer was assumed.

Table 1 shows parameters of layers used in this example. These parameters were for the case of a transistor in which metal oxide is used for a semiconductor layer; however, in this example, the same parameters were used in the case of a transistor in which amorphous silicon is used for a semiconductor layer.

TABLE 1

| | Material | Thickness | Sheet resistance | Relative dielectric constant |
|---|---|---|---|---|
| Counter electrode | ITSO | 100 nm | 100 Ω/square | — |
| Liquid crystal layer | Liquid crystal material | 3200 nm | 0.011 fF/μm² | 4 |
| Pixel electrode | ITSO | 100 nm | 100 Ω/square | — |
| Planarization film | acrylic | 3000 nm | 0.012 fF/μm² | 4 |
| Passivation film 2 | SiN | 100 nm | 0.620 fF/μm² | 7 |
| Passivation film 1 | SiON\SiON | 430 nm | 0.082 fF/μm² | 4 |
| SD wiring * | Cu | 600 nm *** | 0.050 Ω/square | — |
| Semiconductor layer | IGZO or a-Si | 40 nm | — | — |
| Gate insulating layer ** | SiON | 280 nm | 0.127 fF/μm² | 4 |
| Gate wiring * | Cu | 600 nm *** | 0.050 Ω/square | — |
| Substrate | glass | — | — | — |

\* The equivalent value based on sheet resistance 0.1 Ω/square of TaN_10 nm\Cu_300 nm
\*\* The equivalent value of an SiON single layer based on SiN_400 nm\SiON_50 nm
\*\*\* 700 nm was used in the case of using IGZO for the semiconductor layer and selecting two pixels at a time <Case Where Pixel is Selected One by One>

Figure 23A:
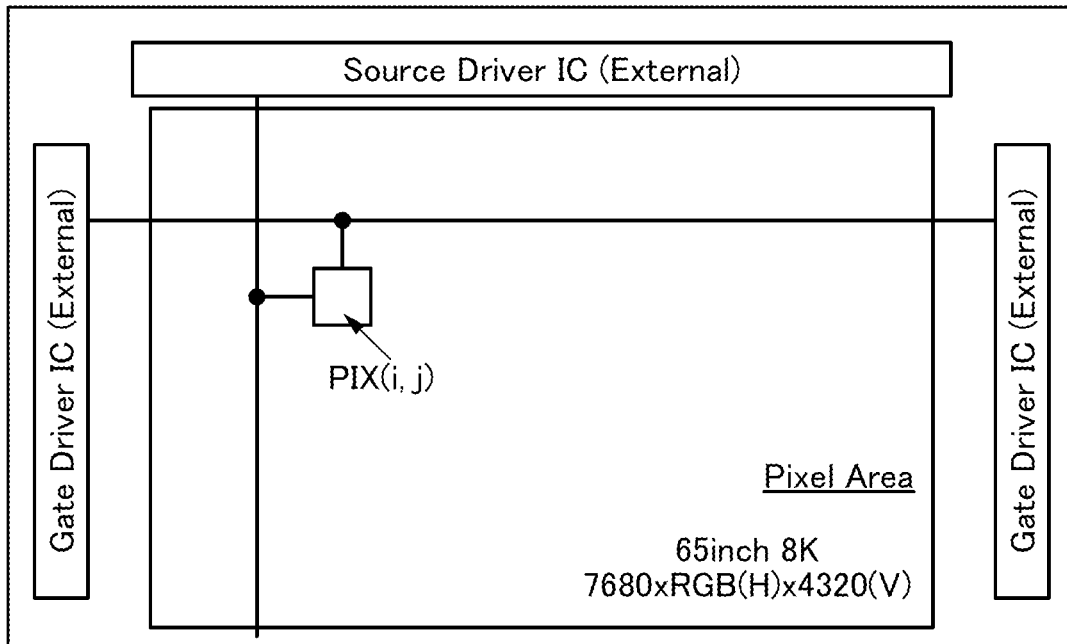
FIGS. 23A and 23B are a block diagram showing a display module in Example 1 and a circuit diagram showing a pixel in Example 1.

FIG. 23A is a block diagram showing a configuration of a display module used in this example. In this configuration, a selection signal is supplied to each gate line and a pixel is selected one by one. A gate driver and a source driver are both external circuits. A gate line is supplied with the same signal from two gate driver ICs. A source line is supplied with a signal from one source driver IC. A pixel area is not divided and has a diagonal of 65 inches. The number of effective pixels is 7680×RGB (H)×4320 (V).

Figure 23B:
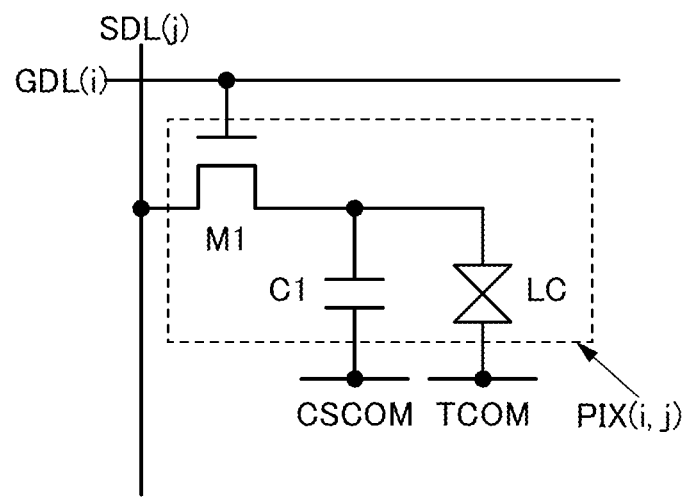

FIG. 23B is a circuit diagram showing a pixel PIX(i, j). The pixel PIX(i, j) includes a transistor M1, a capacitor C1, and a liquid crystal element LC. A gate of the transistor M1 is connected to a gate line GDL(i). One of a source and a drain of the transistor M1 is connected to a source line SDL(j), and the other is connected to one electrode of the capacitor C1 and one electrode of the liquid crystal element LC. The other electrode of the capacitor C1 is connected to a wiring CSCOM. The other electrode of the liquid crystal element LC is connected to a wiring TCOM.

Figure 24A:
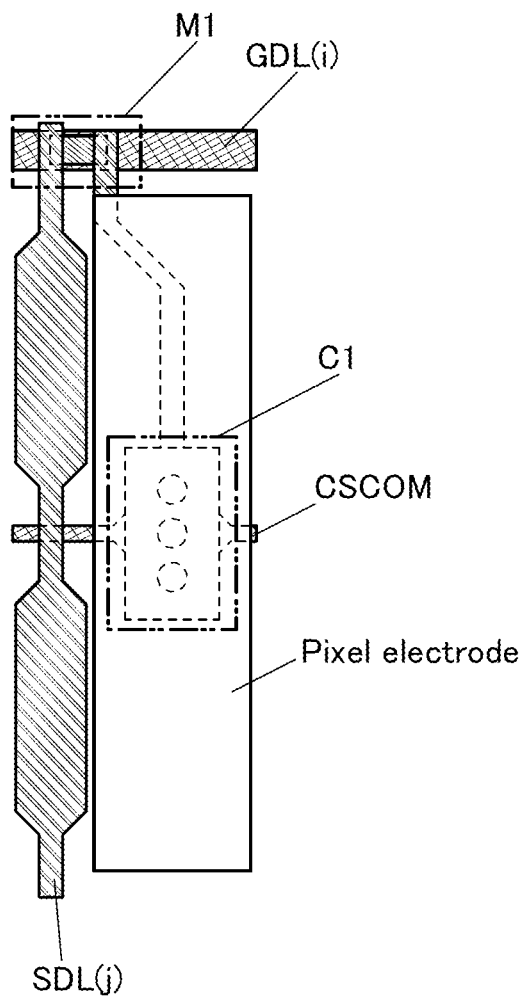
FIGS. 24A and 24B are top views showing pixel layouts in Example 1.
Figure 24B:
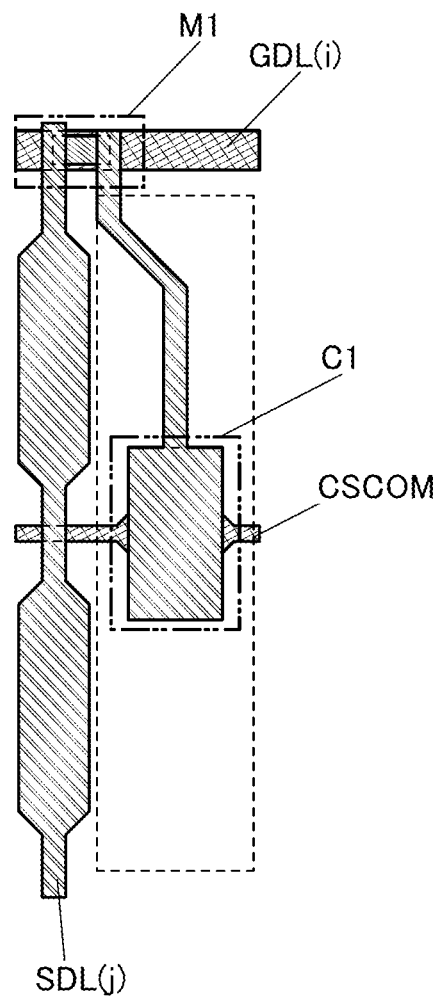

FIGS. 24A and 24B illustrate a pixel layout of a display module in which a pixel is selected one by one. FIG. 24A is a top view in which a stacked structure including components from the gate line GDL(i) to the pixel electrode is seen from the pixel electrode side. FIG. 24B is a top view excepting the pixel electrode in FIG. 24A.

The pixel size is 62.5 μm×187.5 μm. The transistor M1 is a channel-etched transistor with a bottom-gate top-contact structure. The transistor M1 has a channel length L of 4 μm, a channel width W of 8 μm, and an LDD region overlapping with a gate (hereinafter referred to as an overlap LDD region Lov) of 2 μm. The gate line GDL(i) has a width of 10 μm, and the wiring CSCOM has a width of 3.5 μm. The source line SDL(j) has a width of 10 μm, but has a width of 4 μm at a portion crossing another wiring (the gate line GDL(i) or the wiring CSCOM). The aperture ratio is 45.6%.

First, rough estimation of data writing time in the case where metal oxide is used for a semiconductor layer is described with reference to FIG. 25.

A period for charging a gate line and a period for charging a source line and a pixel were roughly estimated in such a manner that the parasitic resistance and the parasitic capacitance were extracted from the pixel layout in FIG. 24A, and only a parameter of the mobility was changed. In this example, the data writing time corresponds to the sum of the period for charging a gate line and the period for charging a source line and a pixel. In this example, the period for charging a gate line is a time until the potential of the gate line reaches 75% of the maximum input voltage, and the period for charging a source line and a pixel is a time until the potential of the source line reaches 99% of the maximum input voltage.

Here, a normalized value (normalized mobility) under a condition that the field-effect mobility in the case where a stacked layer of metal oxide with an atomic ratio In:Ga:Zn=4:2:3 or the neighborhood thereof is used for a semiconductor layer is 1 was used. The transistor size was not changed. The load of the whole pixel area is described below. A parasitic resistance Rgl of the gate line is 3.60 kΩ, a parasitic capacitance Cgl of the gate line is 255 pF, a parasitic resistance Rsl of the source line is 5.80 kΩ, a parasitic capacitance Csl of the source line is 147 pF, and a parasitic capacitance Cpix of the pixel is 216.6 fF. Note that in this example, the parasitic capacitance Cpix of the pixel includes storage capacitor of a capacitor, capacitance of a liquid crystal element, and parasitic capacitance of a node A. In this example, the node A is a node at which a source or a drain of a transistor, one electrode of a capacitor, and one electrode of a liquid crystal element are connected in each pixel.

Figure 25:
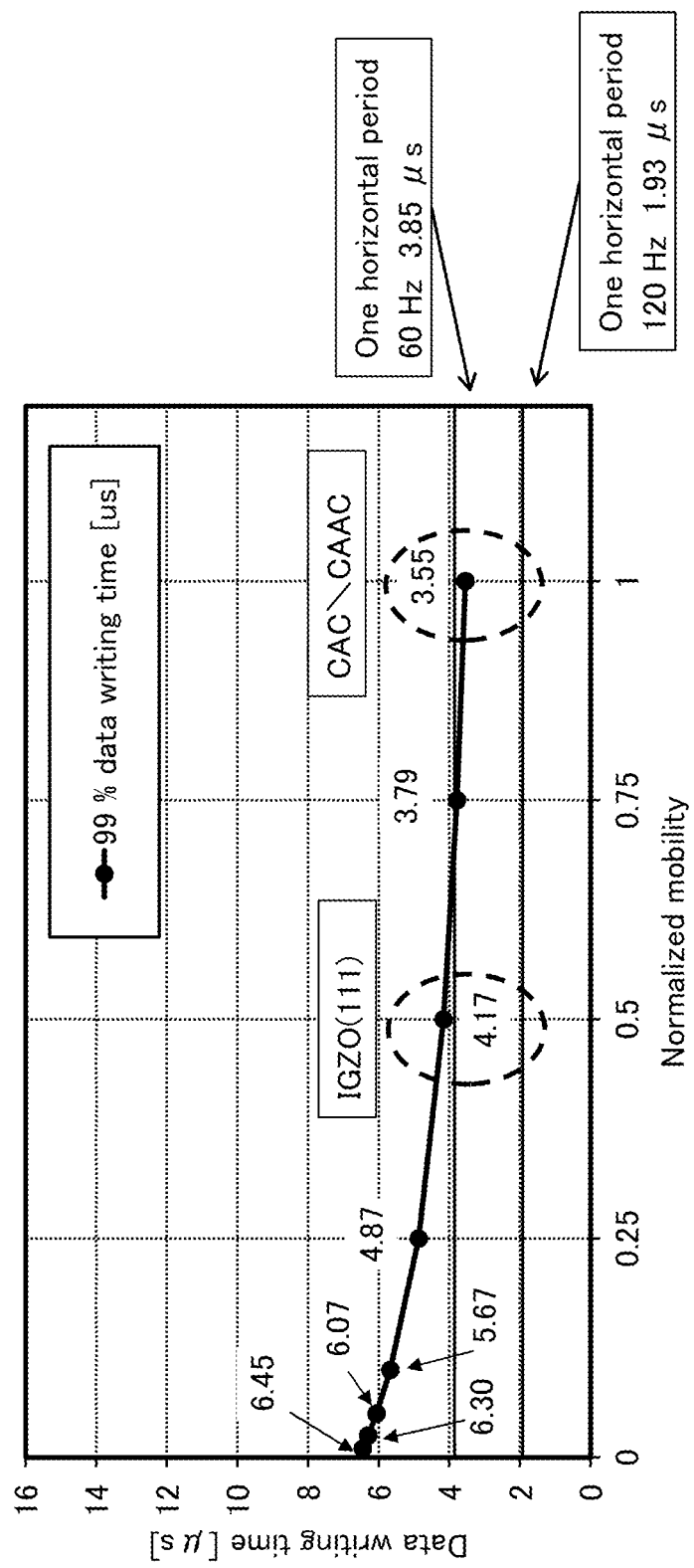
FIG. 25 shows results of rough estimation of data writing time in Example 1.

The result of normalized mobility of 1 in FIG. 25 corresponds to the case where a stacked layer of metal oxide with an atomic ratio In:Ga:Zn=4:2:3 or the neighborhood thereof is used as a semiconductor layer (denoted as "CAC\CAAC" in FIG. 25). In that case, the data writing time is 3.55 μs, which is shorter than one horizontal period 3.85 μs in 60-Hz driving. Accordingly, it was estimated that 60-Hz driving can be performed. This data writing time is longer than one horizontal period 1.93 μs in 120-Hz driving. Accordingly, it was estimated that 120-Hz driving is difficult.

The result of normalized mobility of 0.5 in FIG. 25 corresponds to the case where a single layer of metal oxide with an atomic ratio In:Ga:Zn=1:1:1 or the neighborhood thereof is used as a semiconductor layer (denoted as "IGZO (111)" in FIG. 25). In that case, the data writing time is 4.17 μs, which is longer than one horizontal period 3.85 μs in 60-Hz driving. Accordingly, it was estimated that not only 120-Hz driving but also 60-Hz driving is difficult.

Next, rough estimation of data writing time in the case where amorphous silicon is used for a semiconductor layer is described with reference to FIG. 26.

A period for charging a gate line and a period for charging a source line and a pixel were roughly estimated in such a manner that the parasitic resistance and the parasitic capacitance were extracted from the pixel layout in FIG. 24A, and a design parameter of the field-effect mobility of a transistor was changed from the actually measured value of a transistor fabricated using microcrystalline silicon. The transistor size and storage capacitor were not changed. In order to actually use amorphous silicon for a semiconductor layer, a larger transistor and storage capacitor are needed, and thus the data writing time needs to be longer than that shown as the result in this example. The load of the whole pixel area is described below. A parasitic resistance Rgl of the gate line is 3.60 kΩ, a parasitic capacitance Cgl of the gate line is 255 pF, a parasitic resistance Rsl of the source line is 5.80 kΩ, a parasitic capacitance Csl of the source line is 147 pF, and a parasitic capacitance Cpix of the pixel is 216.6 fF.

Figure 26:
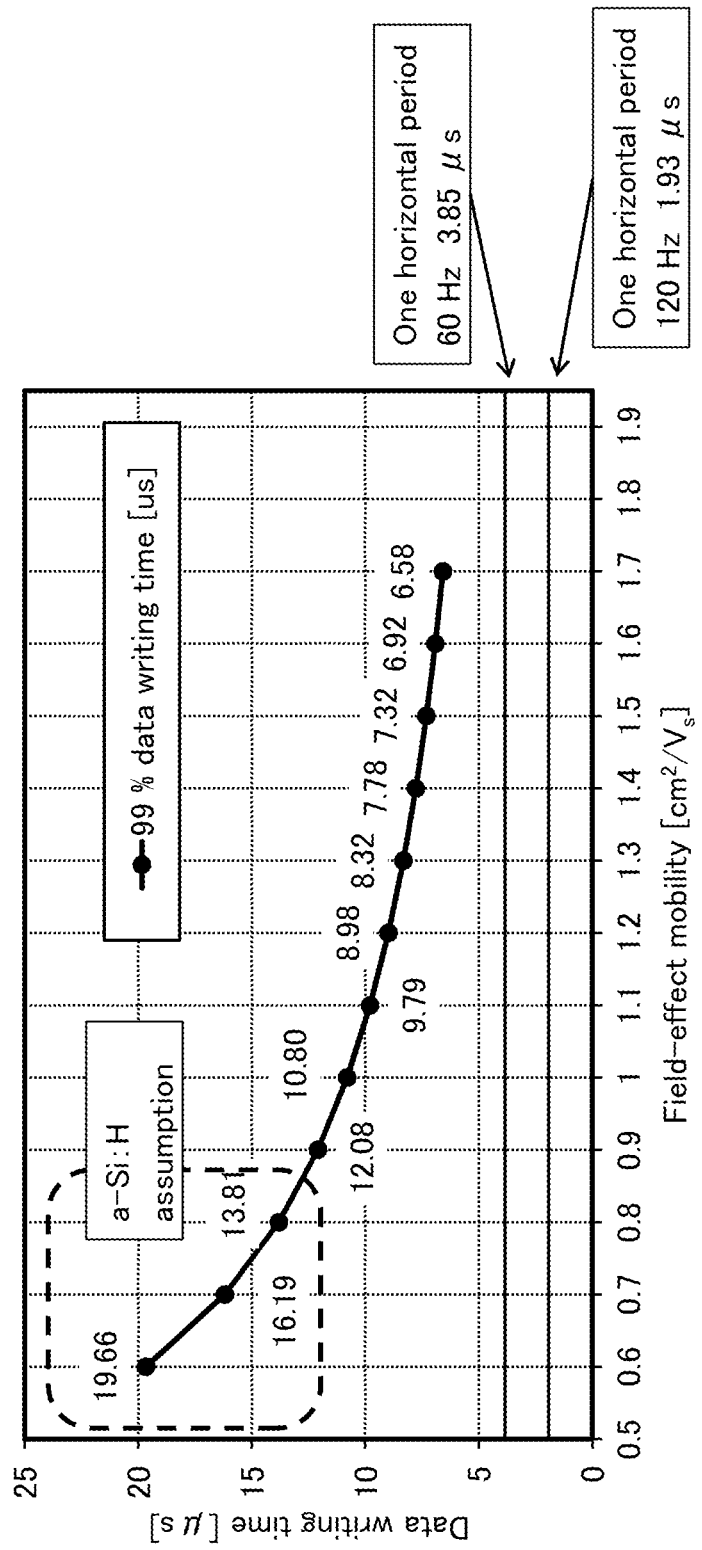
FIG. 26 shows results of rough estimation of data writing time in Example 1.

The results of field-effect mobility of 0.6, 0.7, and 0.8 [$cm^2$/Vs] in FIG. 26 correspond to the case where amorphous silicon is used for a semiconductor layer. In that case, the data writing time at field-effect mobility of 0.6, 0.7, and 0.8 [$cm^2$/Vs] are 19.66 μs, 16.19 μs, and 13.81 μs, respectively, which are longer than one horizontal period 1.93 μs in 120-Hz driving and one horizontal period 3.85 μs in 60-Hz driving. Accordingly, it was estimated that not only 120-Hz driving but also 60-Hz driving is difficult.

<Case Where Two Pixels are Selected at a Time>

Figure 27A:
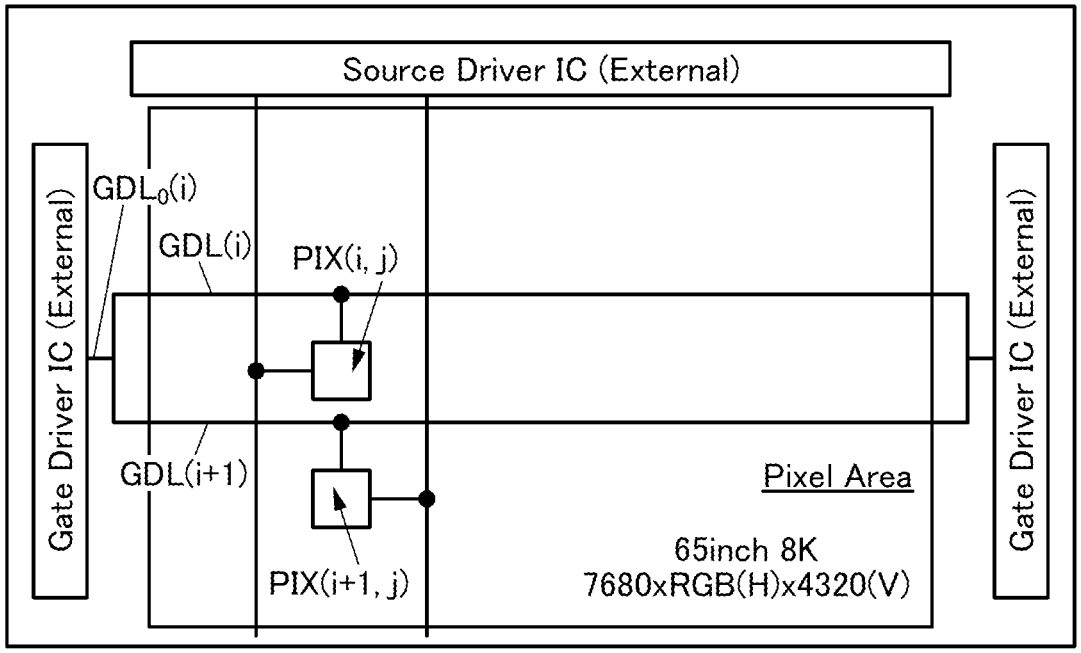
FIGS. 27A and 27B are a block diagram showing a display module in Example 1 and a circuit diagram showing a pixel in Example 1.

FIG. 27A is a block diagram showing a configuration of a display module used in this example. With this configuration, a selection signal is supplied to two gate lines at the same time, and two pixels that adjoin in the column direction are selected at a time. A gate driver and a source driver are both external circuits. A gate line is supplied with the same signal from two gate driver ICs. The gate line $GDL_0$(i) is electrically connected to the gate line GDL(i) and the gate line GDL(i+1), and pixels in the i-th row and the (i+1)-th row are driven at a time. A signal is supplied to a source line from one source driver IC. A pixel area is not divided and has a diagonal of 65 inches. The number of effective pixels is 7680×RGB (H)×4320 (V).

Figure 27B:
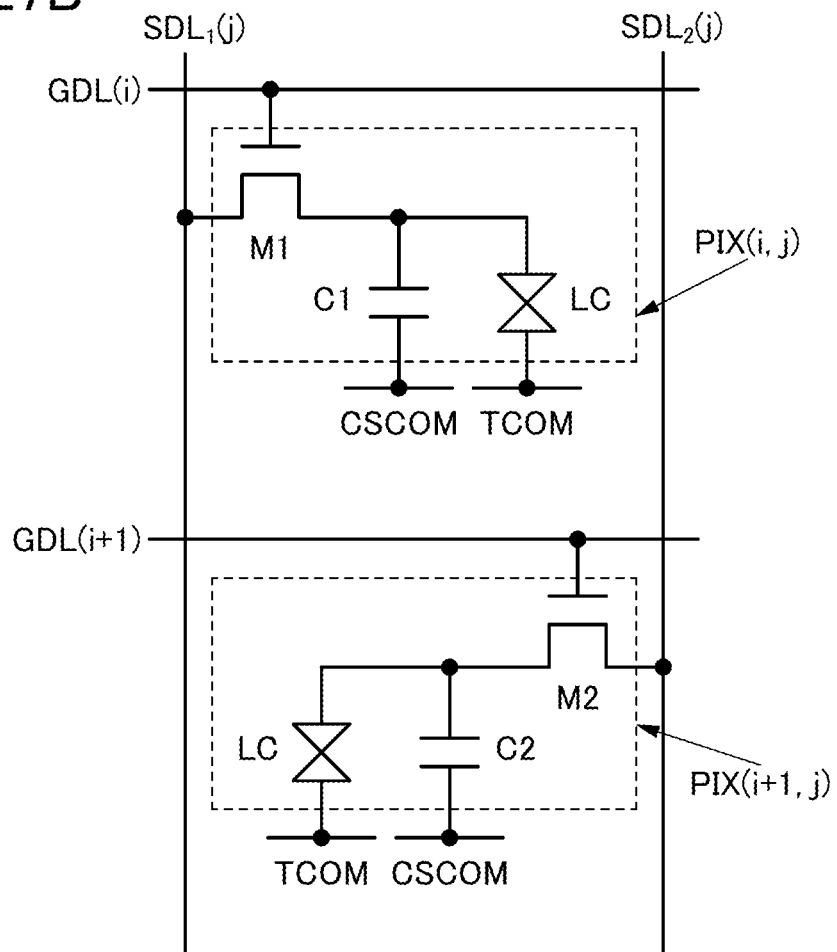

FIG. 27B is a circuit diagram showing the pixel PIX(i, j) and a pixel PIX(i+1, j).

First, a configuration of the pixel PIX(i, j) is described. The pixel PIX(i, j) includes the transistor M1, the capacitor C1, and the liquid crystal element LC. The gate of the transistor M1 is connected to the gate line GDL(i). One of the source and the drain of the transistor M1 is connected to a source line $SDL_1$(j), and the other is connected to one electrode of the capacitor C1 and one electrode of the liquid crystal element LC. The other electrode of the capacitor C1 is connected to a wiring CSCOM. The other electrode of the liquid crystal element LC is connected to a wiring TCOM.

Next, a configuration of the pixel PIX(i+1, j) is described. The pixel PIX(i+1, j) includes a transistor M2, a capacitor C2, and the liquid crystal element LC. A gate of the transistor M2 is connected to the gate line GDL(i+1). One of a source and a drain of the transistor M2 is connected to the source line $SDL_2$(j), and the other is connected to one electrode of the capacitor C2 and one electrode of the liquid crystal element LC. The other electrode of the capacitor C2 is connected to the wiring CSCOM. The other electrode of the liquid crystal element LC is connected to the wiring TCOM.

Figure 28A:
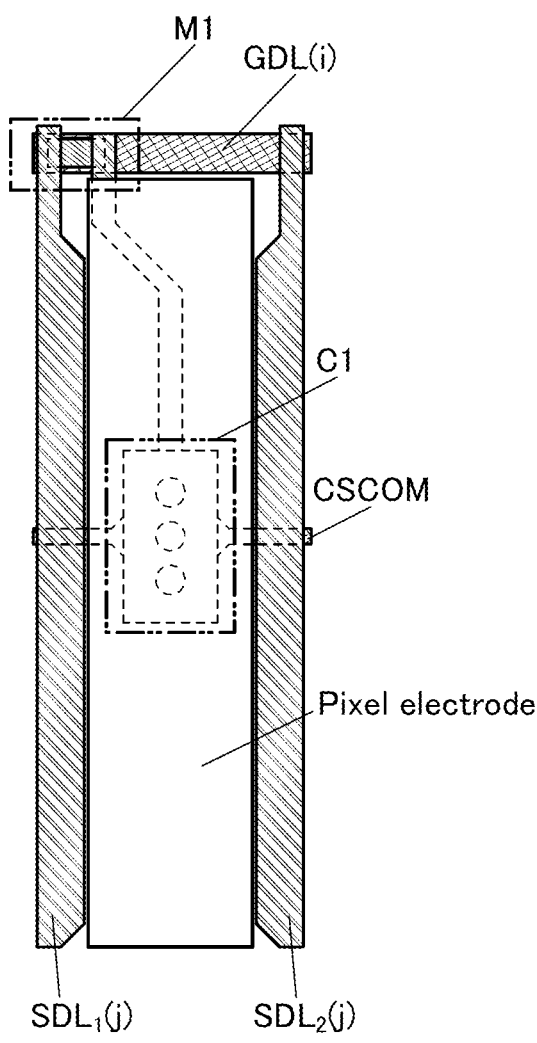
FIGS. 28A and 28B are top views showing pixel layouts in Example 1.
Figure 28B:
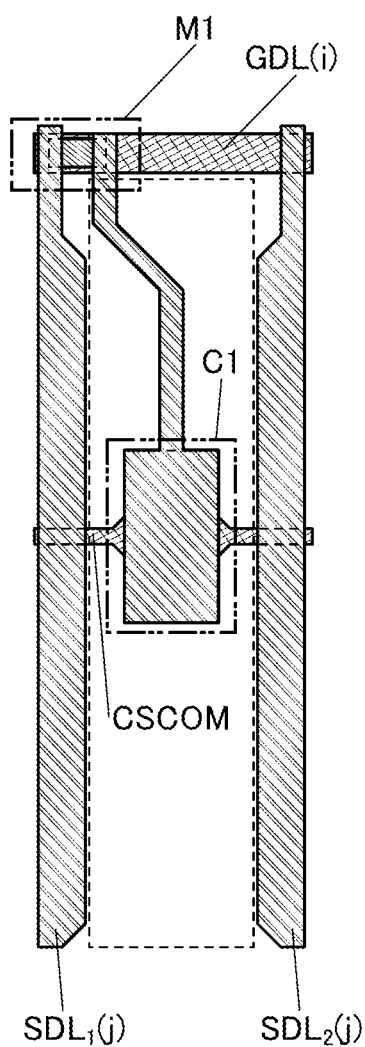

FIGS. 28A and 28B show a pixel layout of a display module in which two pixels are selected at a time. FIG. 28A is a top view in which a stacked structure including components from the gate line GDL(i) to the pixel electrode is seen from the pixel electrode side. FIG. 28B is a top view excepting the pixel electrode in FIG. 28A.

The pixel size is 62.5 μm×187.5 μm. The transistor M1 is a channel-etched transistor with a bottom-gate top-contact structure. The transistor M1 has a channel length L of 4 μm, a channel width W of 8 μm, and an overlap LDD region Lov of 2 μm. The gate line GDL(i) has a width of 10 μm, and the wiring CSCOM has a width of 3.5 μm. Each of the source line $SDL_1$(j) and the source line $SDL_2$(j) has a width of 10 μm, but has a width of 4 μm at a portion crossing the gate line. The aperture ratio is 37.3%.

First, rough estimation of data writing time in the case where metal oxide is used for a semiconductor layer is described with reference to FIG. 29.

A period for charging a gate line and a period for charging a source line and a pixel were roughly estimated in such a manner that the parasitic resistance and the parasitic capacitance were extracted from the pixel layout in FIG. 28A, and only a parameter of the mobility was changed. Here, a normalized value (normalized mobility) under a condition that the field-effect mobility in the case where a stacked layer of metal oxide with an atomic ratio In:Ga:Zn=4:2:3 or the neighborhood thereof is used for a semiconductor layer is 1 was used. The transistor size was not changed. The load of the whole pixel area is described below. A parasitic resistance Rgl of the gate line is 3.60 kΩ, a parasitic capacitance Cgl of the gate line is 364 pF, a parasitic resistance Rsl of the source line is 4.83 kΩ, a parasitic capacitance Csl of the source line is 182 pF, and a parasitic capacitance Cpix of the pixel is 191 fF.

Figure 29:
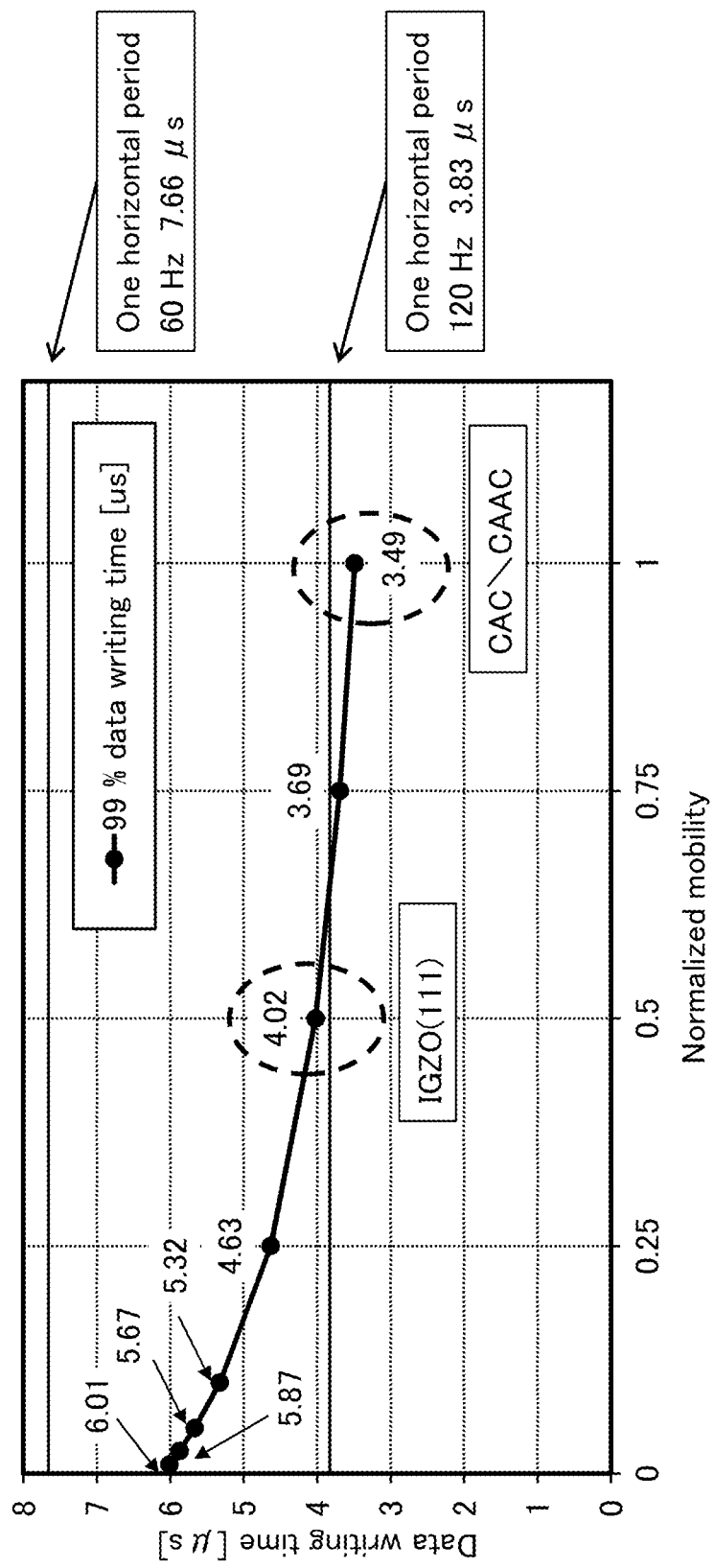
FIG. 29 shows results of rough estimation of data writing time in Example 1.

The result of normalized mobility of 1 in FIG. 29 corresponds to the case where a stacked layer of metal oxide with an atomic ratio In:Ga:Zn=4:2:3 or the neighborhood thereof is used as a semiconductor layer (denoted as "CAC\CAAC" in FIG. 29). In that case, the data writing time is 3.49 μs, which is shorter than one horizontal period 3.83 μs in 120-Hz driving. Accordingly, it was estimated that 120-Hz driving can be performed.

The result of normalized mobility of 0.5 in FIG. 29 corresponds to the case where a single layer of metal oxide with an atomic ratio In:Ga:Zn=1:1:1 or the neighborhood thereof is used as a semiconductor layer (denoted as "IGZO (111)" in FIG. 29). In that case, the data writing time is 4.02 μs, which is shorter than one horizontal period 7.66 μs in 60-Hz driving. Accordingly, it was estimated that 60-Hz driving can be performed. This data writing time is longer than one horizontal period 3.83 μs in 120-Hz driving. Accordingly, it was estimated that 120-Hz driving is difficult.

In FIG. 29, two gate lines are supplied with the same selection signal, so that the length of one horizontal period can be twice the length of one horizontal period in FIG. 25. Accordingly, a high-resolution display device can be operated easily with use of a transistor with low field-effect mobility.

The results in FIG. 25 and FIG. 29 show that in the case where CAC\CAAC is used for a semiconductor layer, 120-Hz driving, which is difficult with the configuration in which writing is performed in a pixel one by one, can be achieved with the configuration in which writing is performed in two pixels at a time.

The results in FIG. 25 and FIG. 29 show that in the case where IGZO(111) is used for a semiconductor layer, 60-Hz driving, which is difficult with the configuration in which writing is performed in a pixel one by one, can be achieved with the configuration in which writing is performed in two pixels at a time.

Next, rough estimation of data writing time in the case where amorphous silicon is used for a semiconductor layer is described with reference to FIG. 30.

A period for charging a gate line and a period for charging a source line and a pixel were roughly estimated in such a manner that the parasitic resistance and the parasitic capacitance were extracted from the pixel layout in FIG. 28A, and a design parameter of the field-effect mobility of a transistor was changed from the actually measured value of a transistor fabricated using microcrystalline silicon. The transistor size and storage capacitor were not changed. The load of the whole pixel area is described below. A parasitic resistance Rgl of the gate line is 3.60 kΩ, a parasitic capacitance Cgl of the gate line is 364 pF, a parasitic resistance Rsl of the source line is 4.83 kΩ, a parasitic capacitance Csl of the source line is 182 pF, and a parasitic capacitance Cpix of the pixel is 191 fF.

Figure 30:
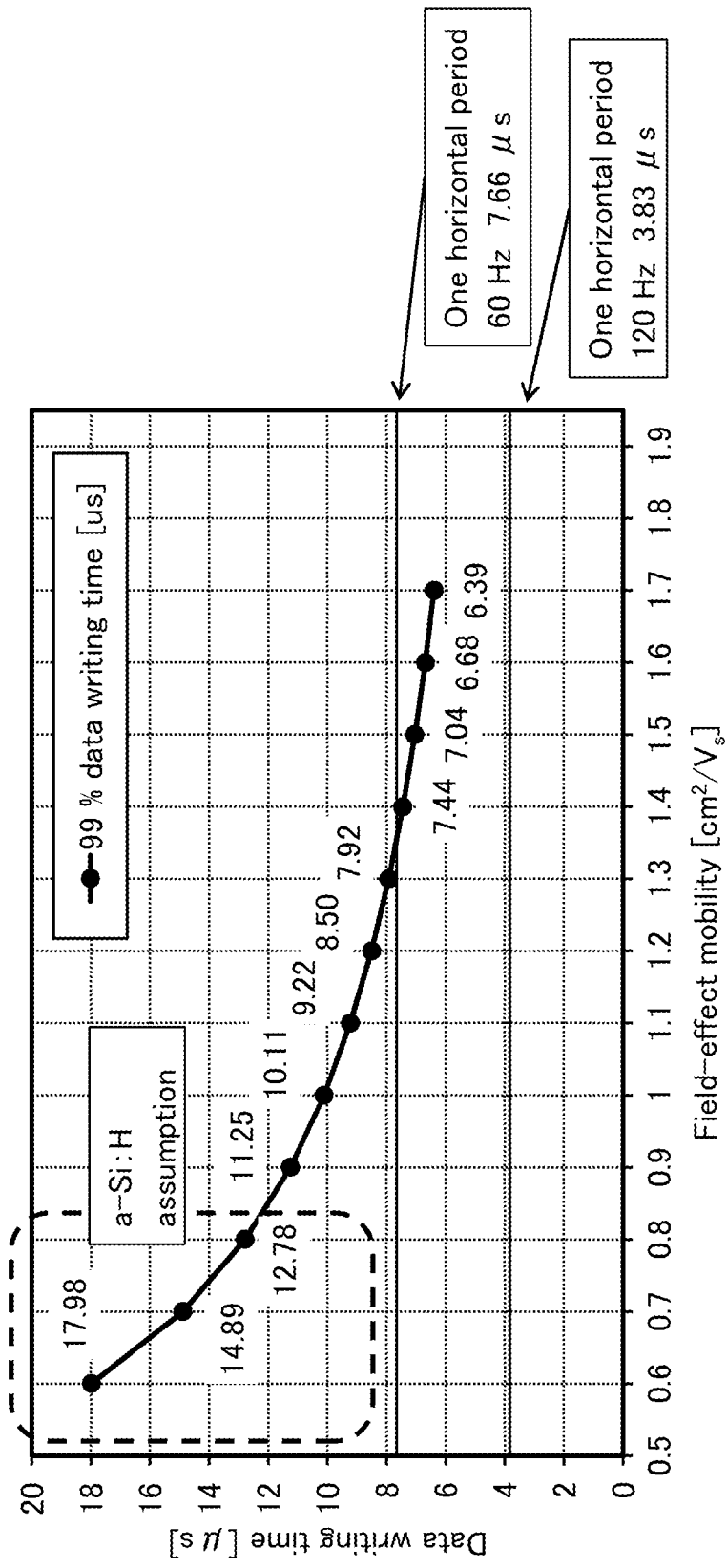
FIG. 30 shows results of rough estimation of data writing time in Example 1.

The results of field-effect mobility of 0.6, 0.7, and 0.8 [$cm^2$/Vs] in FIG. 30 correspond to the case where amorphous silicon is used for a semiconductor layer. In that case, the data writing time at field-effect mobility of 0.6, 0.7, and 0.8 [$cm^2$/Vs] are 17.98 μs, 14.89 μs, and 12.78 μs, respectively, which are longer than one horizontal period 3.83 μs in 120-Hz driving and one horizontal period 7.66 μs in 60-Hz driving. Accordingly, it was estimated that not only 120-Hz driving but also 60-Hz driving is difficult.

According to the result in FIG. 30, it was estimated that in the case where amorphous silicon is used for a semiconductor, 60-Hz driving is difficult even with the configuration in which writing is performed in two pixels at a time. This is different from the case where metal oxide is used for a semiconductor layer (see the result in FIG. 29).

<Case Where Four Pixels are Selected at a Time>

Figure 31A:
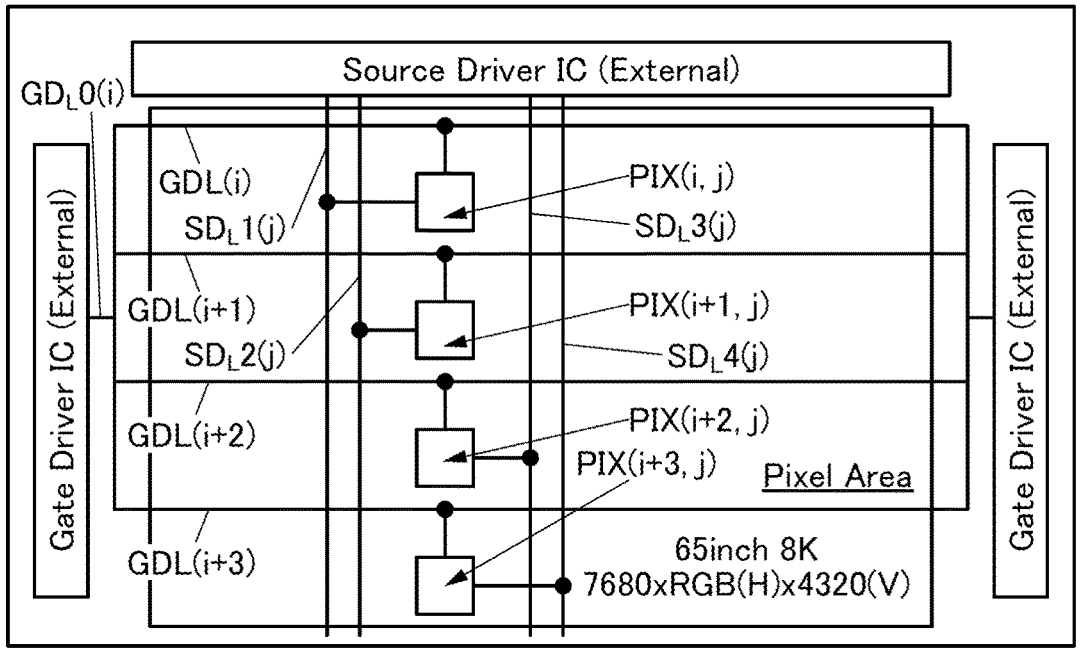
FIGS. 31A and 31B are a block diagram showing a display module in Example 1 and a circuit diagram showing a pixel in Example 1.

FIG. 31A is a block diagram showing a configuration of a display module used in this example. With this configuration, a selection signal is supplied to four gate lines at the same time, and four pixels that adjoin in the column direction are selected at a time. A gate driver and a source driver are both external circuits. A gate line is supplied with the same signal from two gate driver ICs. The gate line $GDL_0(i)$ is electrically connected to the gate line GDL(i), the gate line GDL(i+1), the gate line GDL(i+2), and the gate line GDL(i+3), and the i-th to the (i+3)-th rows are driven at a time. A source line is supplied with a signal from one source driver IC. A pixel area is not divided and has a diagonal of 65 inches. The number of effective pixels is 7680×RGB (H)×4320 (V).

Figure 31B:
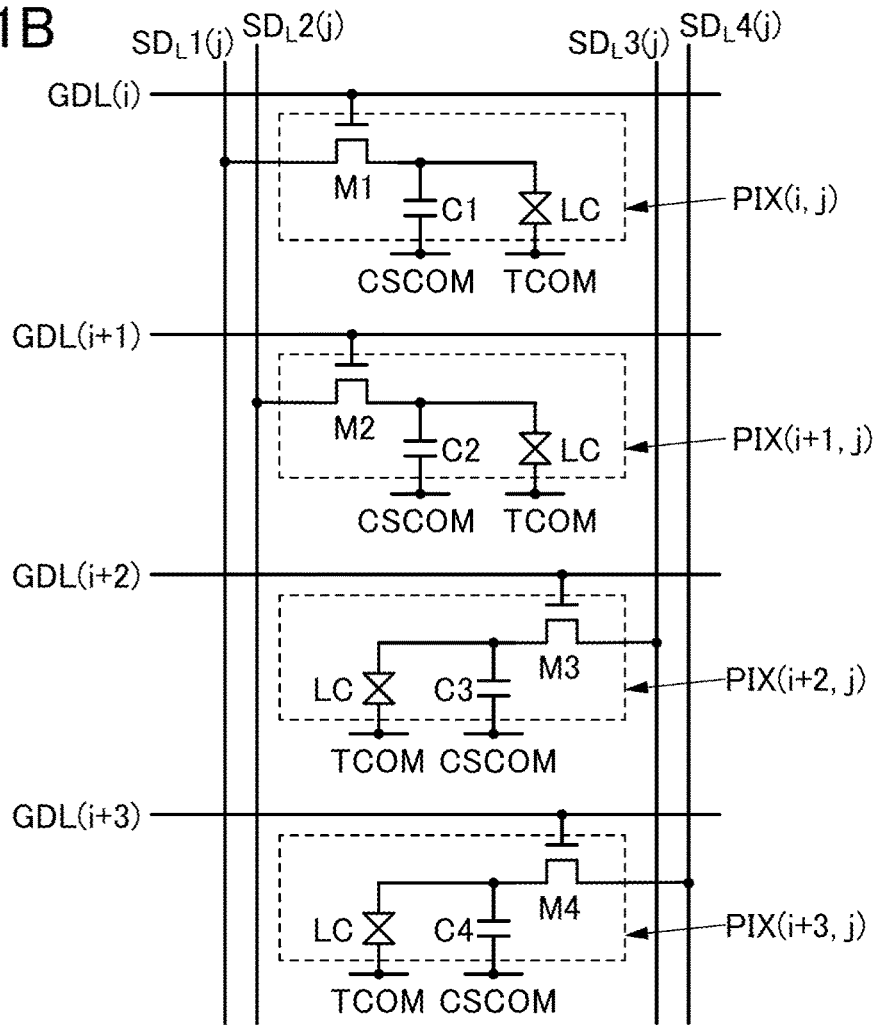

FIG. 31B is a circuit diagram showing the pixel PIX(i, j), the pixel PIX(i+1, j), a pixel PIX(i+2, j), and a pixel PIX(i+3, j).

First, the configuration of the pixel PIX(i, j) is described. The pixel PIX(i, j) includes the transistor M1, the capacitor C1, and the liquid crystal element LC. The gate of the transistor M1 is connected to the gate line GDL(i). One of the source and the drain of the transistor M1 is connected to the source line $SDL_1(j)$, and the other is connected to one electrode of the capacitor C1 and one electrode of the liquid crystal element LC. The other electrode of the capacitor C1 is connected to the wiring CSCOM. The other electrode of the liquid crystal element LC is connected to the wiring TCOM.

Next, the configuration of the pixel PIX(i+1, j) is described. The pixel PIX(i+1, j) includes the transistor M2, the capacitor C2, and the liquid crystal element LC. The gate of the transistor M2 is connected to the gate line GDL(i+1). One of the source and the drain of the transistor M2 is connected to the source line $SDL_2(j)$, and the other is connected to one electrode of the capacitor C2 and one electrode of the liquid crystal element LC. The other electrode of the capacitor C2 is connected to the wiring CSCOM. The other electrode of the liquid crystal element LC is connected to the wiring TCOM.

Next, a configuration of the pixel PIX(i+2, j) is described. The pixel PIX(i+2, j) includes a transistor M3, a capacitor C3, and the liquid crystal element LC. A gate of the transistor M3 is connected to the gate line GDL(i+2). One of a source and a drain of the transistor M3 is connected to the source line $SDL_3(j)$, and the other is connected to one electrode of the capacitor C3 and one electrode of the liquid crystal element LC. The other electrode of the capacitor C3 is connected to the wiring CSCOM. The other electrode of the liquid crystal element LC is connected to the wiring TCOM.

Next, a configuration of the pixel PIX(i+3, j) is described. The pixel PIX(i+3, j) includes a transistor M4, a capacitor C4, and the liquid crystal element LC. A gate of the transistor M4 is connected to the gate line GDL(i+3). One of a source and a drain of the transistor M4 is connected to the source line $SDL_4(j)$, and the other is connected to one electrode of the capacitor C4 and one electrode of the liquid crystal element LC. The other electrode of the capacitor C4 is connected to the wiring CSCOM. The other electrode of the liquid crystal element LC is connected to the wiring TCOM.

Figure 32:
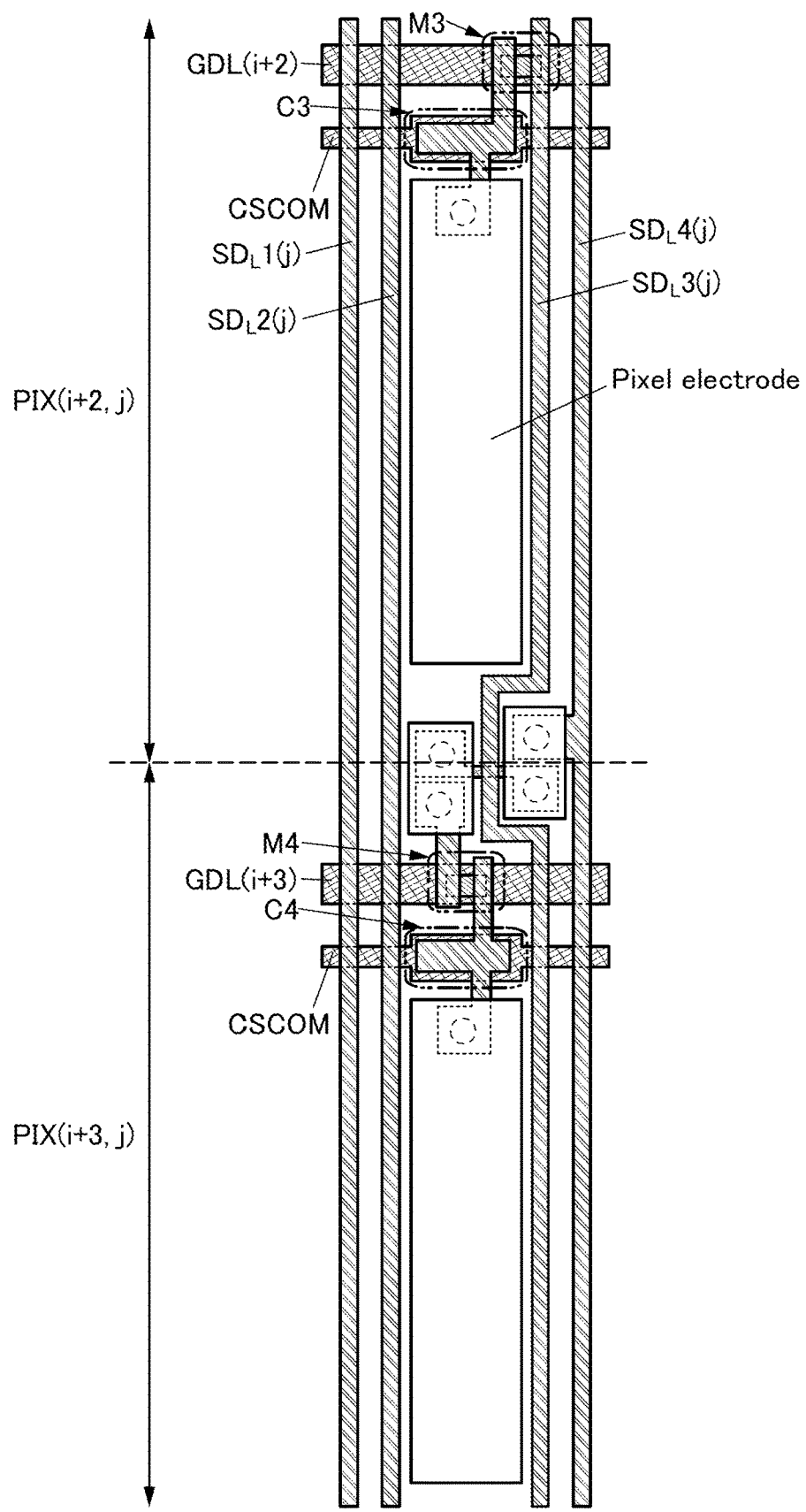
FIG. 32 is a top view showing a pixel layout in Example 1.

FIG. 32 shows a pixel layout of a display module in which four pixels are selected at a time. FIG. 32 is a top view in which a stacked structure including components from the gate line to the pixel electrode is seen from the pixel electrode side. Note that FIG. 32 shows a layout of the pixel PIX(i+2, j) and the pixel PIX(i+3, j). A layout of the pixel PIX(i, j) and the pixel PIX(i+1, j) is a mirror-reversed image of the layout in FIG. 32.

The pixel size is 62.5 μm×187.5 μm. The transistor M3 and the transistor M4 are channel-etched transistors with a bottom-gate top-contact structure and have the same size. Specifically, each of the two transistors has a channel length L of 4 μm, a channel width W of 8 μm, and an overlap LDD region Lov of 3 μm. Each of the gate line GDL(i+2) and the gate line GDL(i+3) has a width of 10 μm, and each of the two wirings CSCOM has a width of 5 μm. Each of the source line $SDL_1(j)$, the source line $SDL_2(j)$, the source line $SDL_3(j)$, and the source line $SDL_4(j)$ has a width of 4 μm. The aperture ratio is 29%.

First, rough estimation of data writing time in the case where metal oxide is used for a semiconductor layer is described with reference to FIG. 33.

A period for charging a gate line and a period for charging a source line and a pixel were roughly estimated in such a manner that the parasitic resistance and the parasitic capacitance were extracted from the pixel layout in FIG. 32, and only a parameter of the mobility was changed. Here, a normalized value (normalized mobility) under a condition that the field-effect mobility in the case where a stacked layer of metal oxide with an atomic ratio In:Ga:Zn=4:2:3 or the neighborhood thereof is used for a semiconductor layer is 1 was used. The transistor size was not changed. The load of the whole pixel area is described below. A parasitic resistance Rgl of the gate line is 3.53 kΩ, a parasitic capacitance Cgl of the gate line is 518 pF, a parasitic resistance Rsl of the source line is 10.28 kΩ, a parasitic capacitance Csl of the source line is 170 pF, and a parasitic capacitance Cpix of the pixel is 99.7 fF.

Figure 33:
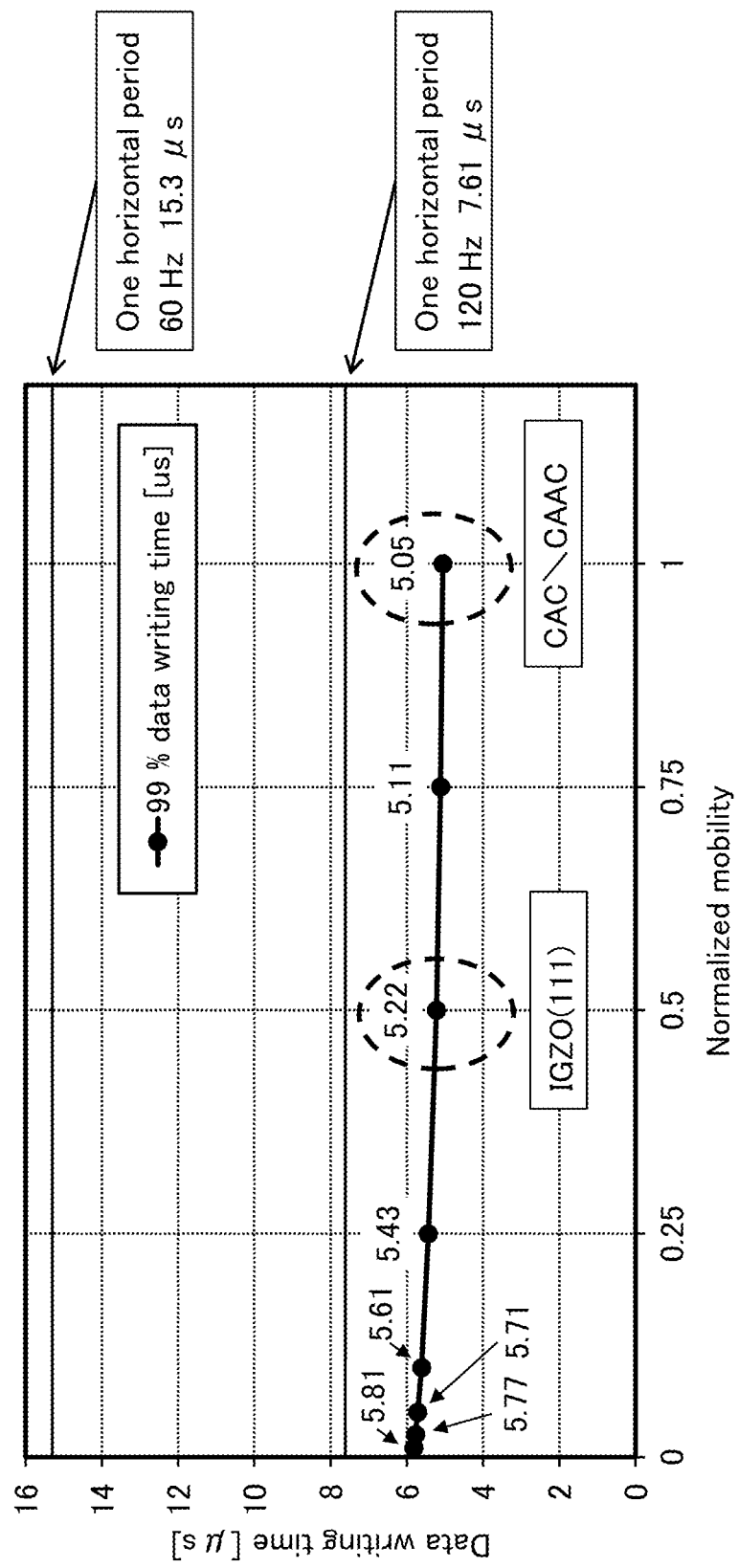
FIG. 33 shows results of rough estimation of data writing time in Example 1.

The result of normalized mobility of 1 in FIG. 33 corresponds to the case where a stacked layer of metal oxide with an atomic ratio In:Ga:Zn=4:2:3 or the neighborhood thereof is used as a semiconductor layer (denoted as "CAC\CAAC" in FIG. 33). In that case, the data writing time is 5.05 μs, which is shorter than one horizontal period 7.61 μs in 120-Hz driving. Accordingly, it was estimated that 120-Hz driving can be performed.

The result of normalized mobility of 0.5 in FIG. 33 corresponds to the case where a single layer of metal oxide with an atomic ratio In:Ga:Zn=1:1:1 or the neighborhood thereof is used as a semiconductor layer (denoted as "IGZO (111)" in FIG. 33). In that case, the data writing time is 5.22 μs, which is shorter than one horizontal period 7.61 μs in 120-Hz driving. Accordingly, it was estimated that 120-Hz driving can be performed.

In FIG. 33, four gate lines are supplied with the same selection signal, so that the length of one horizontal period can be four times the length of one horizontal period in FIG. 25. Accordingly, a high-resolution display device can be operated easily with use of a transistor with low field-effect mobility.

The result in FIG. 33 shows that 120-Hz driving can be achieved with the configuration in which writing is performed in four pixels at a time, even when IGZO(111) whose mobility is lower than that of CAC\CAAC is used for a semiconductor layer.

Next, rough estimation of data writing time in the case of using amorphous silicon for a semiconductor layer is described with reference to FIG. 34.

A period for charging a gate line and a period for charging a source line and a pixel were roughly estimated in such a manner that the parasitic resistance and the parasitic capacitance were extracted from the pixel layout in FIG. 30, and a design parameter of the field-effect mobility of a transistor was changed from the actually measured value of a transistor fabricated using microcrystalline silicon. The transistor size and storage capacitor were not changed. The load of the whole pixel area is described below. A parasitic resistance Rgl of the gate line is 3.53 kΩ, a parasitic capacitance Cgl of the gate line is 518 pF, a parasitic resistance Rsl of the source line is 10.28 kΩ, a parasitic capacitance Csl of the source line is 170 pF, and a parasitic capacitance Cpix of the pixel is 99.7 fF.

Figure 34:
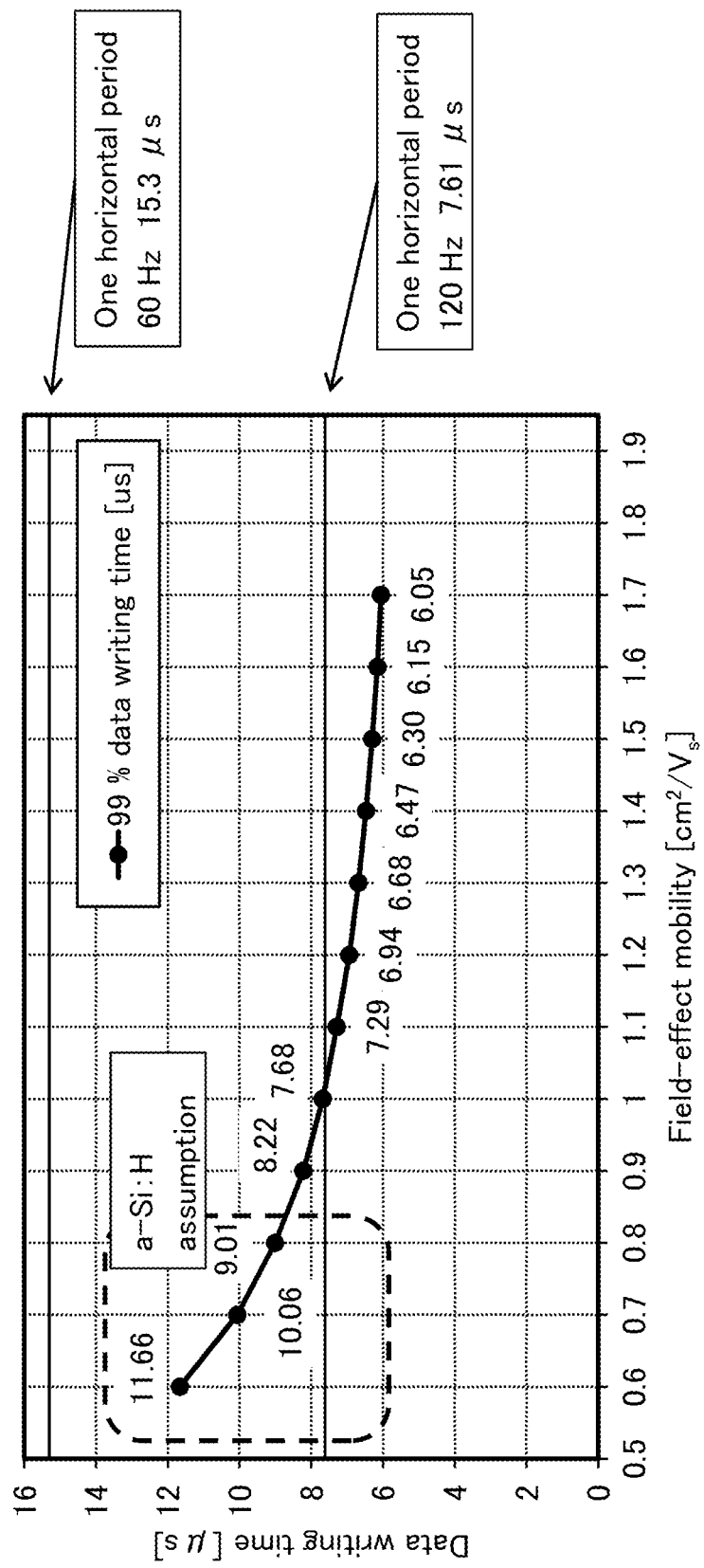
FIG. 34 shows results of rough estimation of data writing time in Example 1.

The results of field-effect mobility of 0.6, 0.7, and 0.8 [$cm^2$/Vs] in FIG. 34 correspond to the case where amorphous silicon is used for a semiconductor layer. In that case, the data writing time is 11.66 μs, 10.06 μs, and 9.01 μs, which is shorter than one horizontal period 15.3 μs in 60-Hz driving. Accordingly, it was estimated that 60-Hz driving can be performed. The data writing time is longer than one horizontal period 7.61 μs in 120-Hz driving. Accordingly, it was estimated that 120-Hz driving is difficult.

The results in FIG. 26, FIG. 30, and FIG. 34 show that 60-Hz driving can be achieved with the configuration in which writing is performed in four pixels at a time, in the case where amorphous silicon is used for a semiconductor layer.

As described above, a large-sized high-resolution display, such as a display with a diagonal of 65 inches and resolution of 8K4K, can be operated by using one embodiment of the present invention, even when amorphous silicon is used for a semiconductor layer of a transistor.

The above rough estimation results are summarized in Table 2. In Table 2, the circle represents conditions where operation is possible, and the cross represents conditions where operation is difficult. Furthermore, the triangle represents conditions where operation is possible when the thickness of the insulating layer is further increased.

TABLE 2

| Conditions | | | | IGZO(423) |
|---|---|---|---|---|
| Frequency | Pixel selection | a-Si:H | IGZO (111) | (CAC\ CAAC) |
| 60 Hz | One by one | x | x | o |
| | Two at a time | x | o | o |
| | Four at a time | o | o | o |

TABLE 2-continued

| Conditions | | | IGZO(423) | |
|---|---|---|---|---|
| Frequency | Pixel selection | a-Si:H | IGZO (111) | (CAC\ CAAC) |
| 120 Hz | One by one | x | x | Δ |
| | Two at a time | x | x | ○ |
| | Four at a time | x | ○ | ○ |

Rough estimation of data writing time in the case of changing the pixel area size (the screen size) was performed. On the basis of the pixel layout used in the above-described rough estimation, rough estimation was performed on the assumption that the parasitic resistance and the parasitic capacitance are changed in proportion to the pixel area size.

Figure 35:
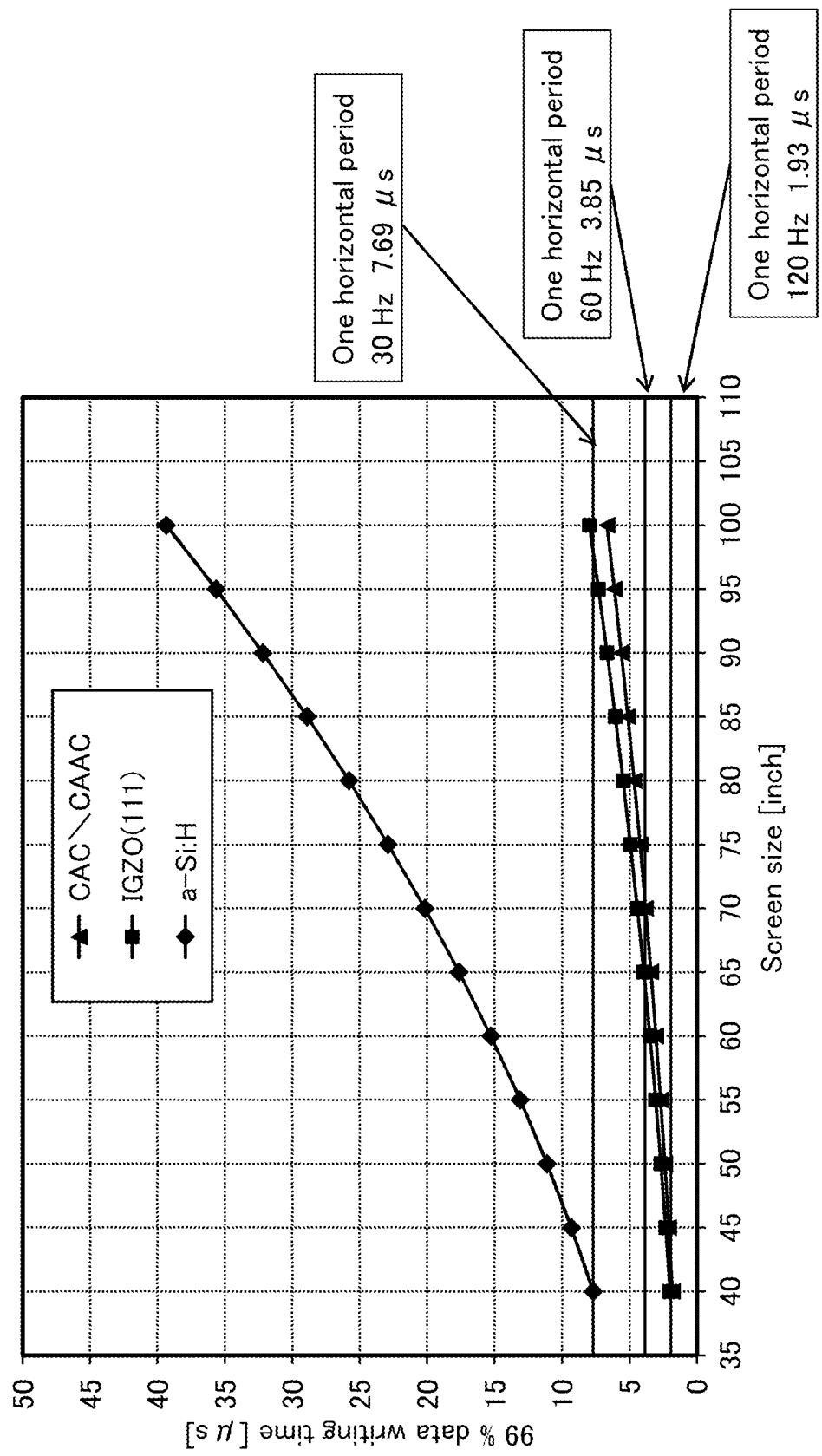
FIG. 35 shows results of rough estimation of data writing time in Example 1.
Figure 36:
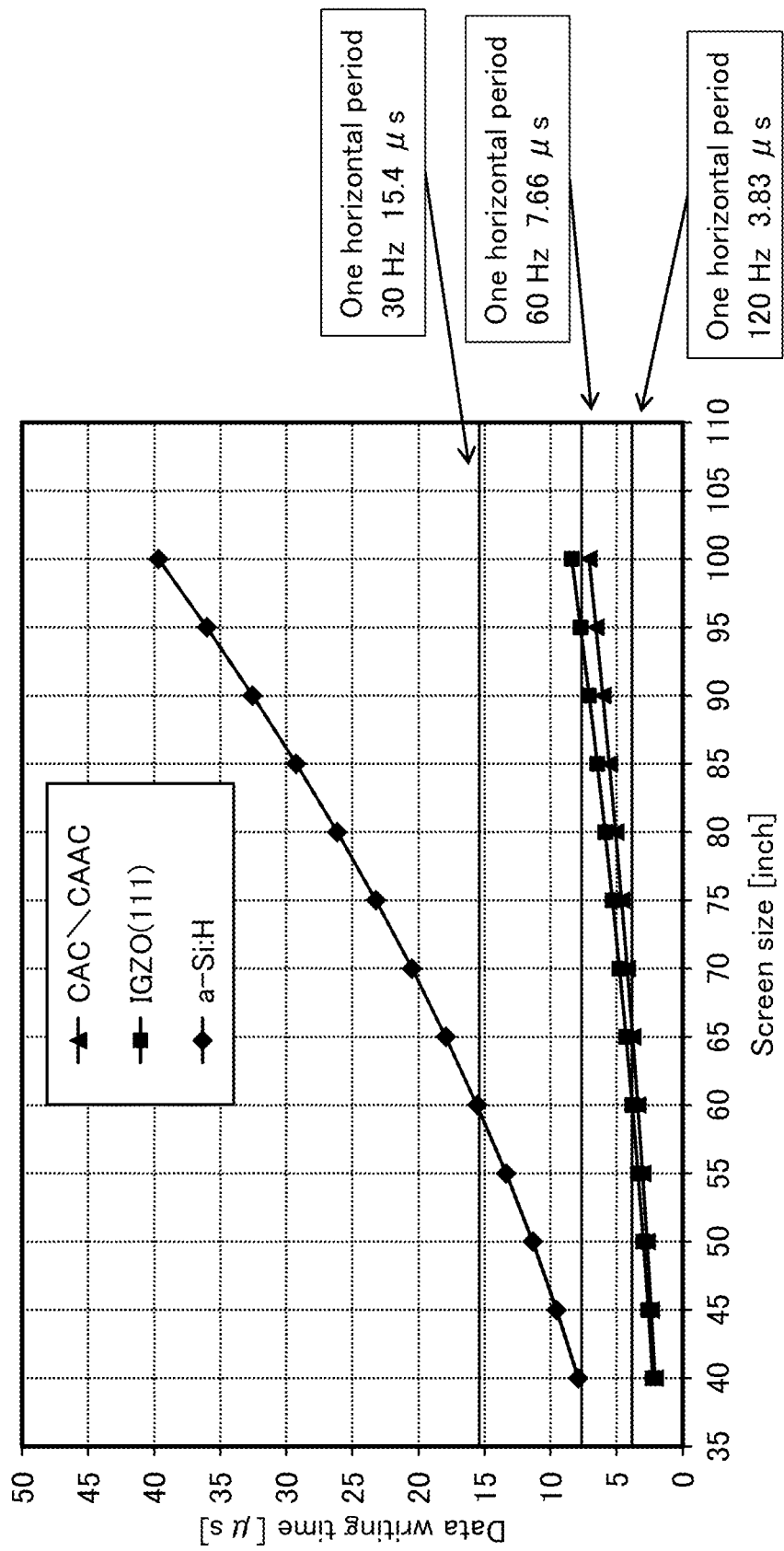
FIG. 36 shows results of rough estimation of data writing time in Example 1.
Figure 37:
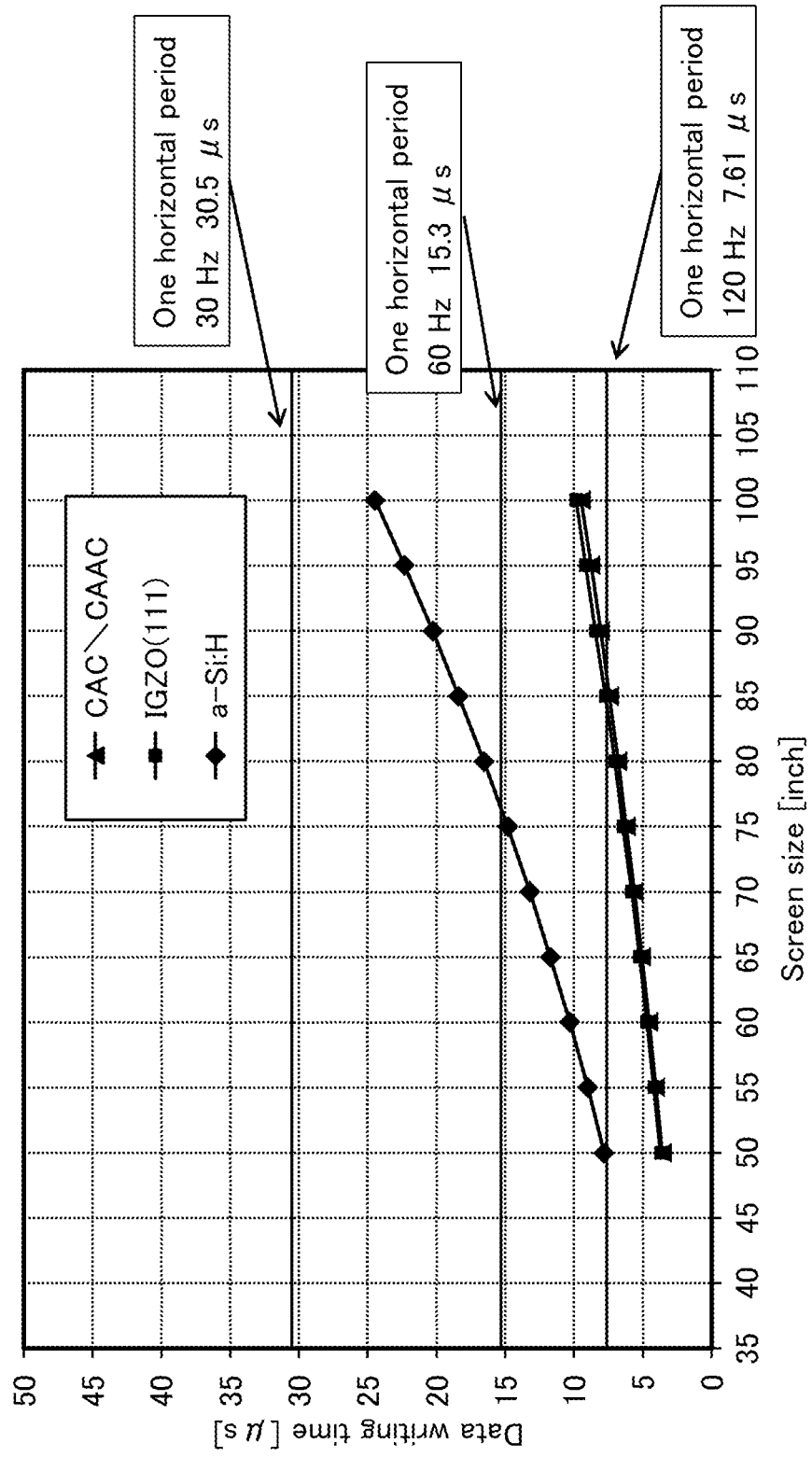
FIG. 37 shows results of rough estimation of data writing time in Example 1.

FIG. 35 shows the rough estimation of data writing time in the case where a pixel is selected one by one. FIG. 36 shows the rough estimation of data writing time in the case where two pixels are selected at a time. FIG. 37 shows the rough estimation of data writing time in the case where four pixels are selected at a time.

Figure 38A:
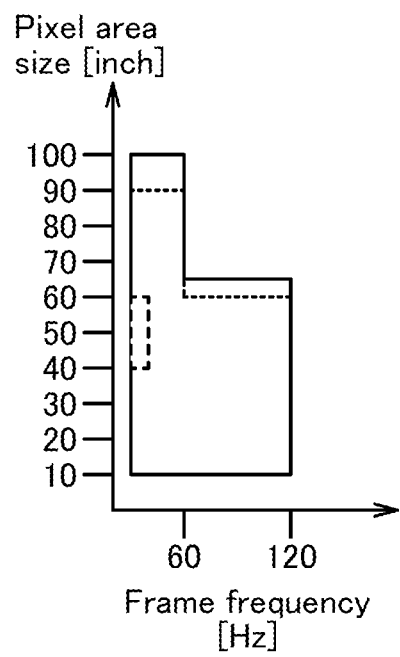
FIGS. 38A to 38C show the relationship between the pixel area size and the frame frequency.
Figure 38B:
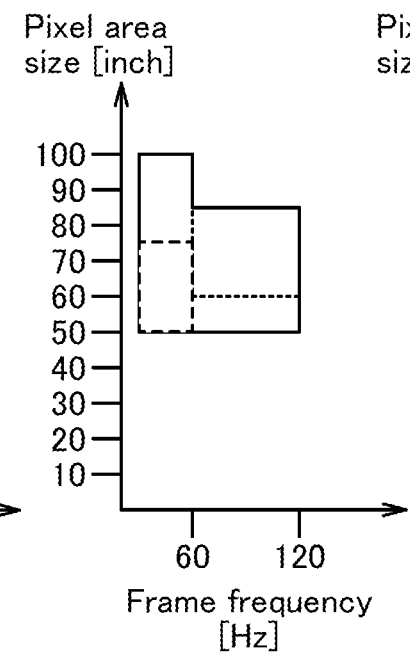
Figure 38C:
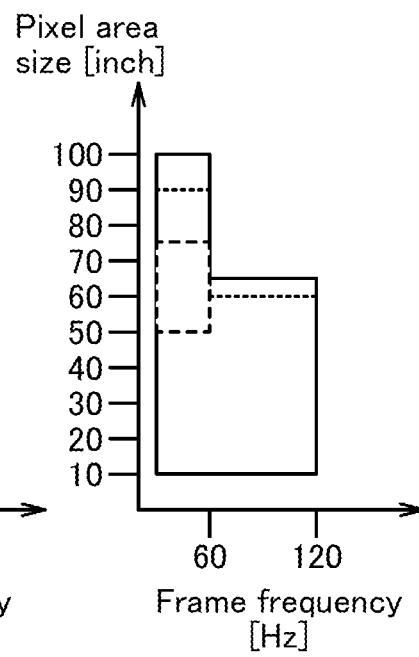

FIGS. 38A to 38C show the relationship between the pixel area size and the frame frequency.

FIG. 38A shows the relationship between the pixel area size and frame frequency in the case where two pixels are selected at a time.

In the case of using CAC\CAAC, the operation can be performed up to 100 inches at 60 Hz and up to 65 inches at 120 Hz. In the case of using IGZO(111), the operation can be performed up to 90 inches at 60 Hz and up to 60 inches at 120 Hz. In the case of using a-Si:H, the operation can be performed in a range from 40 inches to 60 inches at 30 Hz.

FIG. 38B shows the relationship between the pixel area size and the frame frequency in the case where four pixels are selected at a time. In the case where four pixels are selected at a time, a pixel layout is possible with a pixel area size of 50 inches or more.

In the case of using CAC\CAAC, the operation can be performed up to 100 inches at 60 Hz and up to 85 inches at 120 Hz. In the case of using IGZO(111), the operation can be performed up to 100 inches at 60 Hz and up to 60 inches at 120 Hz. In the case of using a-Si:H, the operation can be performed up to 75 inches at 60 Hz.

FIG. 38C shows the relationship between the pixel area size and the frame frequency in the case where two pixels are selected at a time and CAC\CAAC or IGZO(111) is used and in the case where four pixels are selected at a time and a-Si:H is used.

This application is based on Japanese Patent Application Serial No. 2017-005376 filed with Japan Patent Office on Jan. 16, 2017 and Japanese Patent Application Serial No. 2017-005407 filed with Japan Patent Office on Jan. 16, 2017, the entire contents of which are hereby incorporated by reference.

What is claimed is:

1. A head-mounted display device comprising:
a housing;
a display device covered by the housing;
a means for fixing the head-mounted display device on a user's head;
a button;
a lens;
a battery; and
a camera,
wherein the display device comprises a display panel, the display panel comprising:
a substrate;
a first display region over the substrate;
a first gate driver circuit electrically connected to the first display region over the substrate;
a second gate driver circuit electrically connected to the first display region over the substrate;
a source driver circuit electrically connected to the first display region over the substrate;
a single flexible printed circuit over the substrate; and
a demultiplexer,
wherein a first gate wiring is electrically connected to the first gate driver circuit, a gate of a first transistor in a pixel in the first display region, and the second gate driver circuit,
wherein the first display region comprises a liquid crystal element,
wherein each of the first gate driver circuit and the second gate driver circuit comprises a transistor comprising polycrystalline silicon in a channel formation region,
wherein the demultiplexer is directly connected to an output terminal of the source driver circuit,
wherein the source driver circuit is bonded to the substrate via a chip on glass method, and
wherein the pixel in the first display region has an aperture ratio higher than 29% and lower than 45.6%.

2. A head-mounted display device comprising:
a main body; and
a display panel, covered by the main body, comprising:
a glass substrate;
a first display region over the glass substrate;
a first gate driver circuit electrically connected to the first display region over the glass substrate;
a second gate driver circuit electrically connected to the first display region over the glass substrate;
a source driver circuit electrically connected to the first display region;
a single flexible printed circuit over the glass substrate; and
a demultiplexer,
wherein a first gate wiring is electrically connected to the first gate driver circuit, a gate of a first transistor in a pixel in the first display region, and the second gate driver circuit,
wherein the first display region comprises a liquid crystal element,
wherein at least one of the first gate driver circuit and the second gate driver circuit comprises a transistor comprising polycrystalline silicon in a channel formation region,
wherein the demultiplexer is directly connected to an output terminal of the source driver circuit,
wherein the source driver circuit is bonded to the glass substrate via a chip on glass method, and
wherein the pixel in the first display region has an aperture ratio higher than 29% and lower than 45.6%.

3. A head-mounted display device comprising:
a button;
a lens;
a housing;
a first display region;
a second display region;
a first gate driver circuit electrically connected to the first display region;
a second gate driver circuit electrically connected to the first display region;

a source driver circuit electrically connected to the first display region;

a third gate driver circuit electrically connected to the second display region;

a fourth gate driver circuit electrically connected to the second display region;

a flexible printed circuit; and a demultiplexer, wherein a first gate wiring is electrically connected to the first gate driver circuit, a gate of a first transistor in a pixel in the first display region, and the second gate driver circuit, wherein each of the first display region and the second display region comprises a liquid crystal element, wherein at least one of the first gate driver circuit and the second gate driver circuit comprises a transistor comprising polycrystalline silicon in a channel formation region, and wherein the demultiplexer is directly connected to an output terminal of the source driver circuit.

4. The head-mounted display device according to claim 1, wherein an area of the first display region is equal to an area of a second display region.

5. The head-mounted display device according to claim 2, wherein an area of the first display region is equal to an area of a second display region.

6. The head-mounted display device according to claim 3, wherein an area of the first display region is equal to an area of the second display region.

7. The head-mounted display device according to claim 3, wherein the pixel in the first display region has an aperture ratio higher than 29% and lower than 45.6%.

* * * * *